United States Patent [19]

Baker

[11] Patent Number: 4,630,033
[45] Date of Patent: Dec. 16, 1986

[54] METHOD AND APPARATUS FOR MEASURING PHASE

[75] Inventor: Alan J. Baker, Everett, Wash.

[73] Assignee: Hewlett-Packard Company, Palo Alto, Calif.

[21] Appl. No.: 479,043

[22] Filed: Mar. 25, 1983

[51] Int. Cl.⁴ .............................................. H03M 1/24
[52] U.S. Cl. ............................ 340/347 P; 340/870.25; 324/83 D
[58] Field of Search ...................... 328/133; 324/83 D; 340/870.25, 347 AD, 347 P

[56] References Cited

U.S. PATENT DOCUMENTS

| | | | |
|---|---|---|---|
| 3,663,956 | 5/1972 | Purdy et al. | 324/83 D |
| 3,683,345 | 8/1972 | Faulkes et al. | 324/83 D |
| 3,721,909 | 3/1973 | Pincus | 328/133 |
| 3,745,544 | 7/1973 | Ono | 324/83 D |
| 4,520,449 | 5/1985 | Johnson et al. | 328/133 |

Primary Examiner—David Smith, Jr.
Attorney, Agent, or Firm—Edward L. Miller

[57] ABSTRACT

An angle transducer includes input rotor and reference rotor assemblies that are mounted for rotation upon a common shaft and that cooperate with respective moveable input stator and fixed reference stator assemblies to produce signals whose phase difference represents an input angle. Diametrically opposed sensors in each stator assembly achieve enhanced eccentricity error reduction by producing separate signals whose phases are averaged after the phase of each is individually measured. A phase measurement technique does not rely upon the mechanical accuracy of the angular placement of the poles for the rotor assemblies. A phase measurement between two signals is performed by beginning on an arbitrary zero crossing of the signal from the reference stator and forming, for each rotor, the sum of the times for the zero crossings for one complete revolution. To avoid the effects of crosstalk the rotors may have different numbers of poles. The sums, the different numbers of poles, the time for one revolution, and, for each rotor, the number of poles from the pole corresponding to the first term in the associated sum to an absolute reference pole, are the variables in a phase formula producing a high accuracy and resolution unified answer free of separate coarse and fine components. The absolute reference poles may be missing poles whose absence is detected and replaced with an estimate. State and time of transition data for one revolution's worth of all of the signals from the stators are temporarily captured in a small high speed revolving buffer and then immediately stored in a larger wrap-around memory under the control of an interrupt system of a microprocessor. To perform an angle measurement the microprocessor analyzes the last complete revolution's worth of data, beginning at any point in the revolution.

31 Claims, 26 Drawing Figures

(47) $\Delta_{\phi_{J,K}} = y_1 + y_2 + \ldots + y_K - x_1 - x_2 - \ldots - x_J + \Delta_{\phi_{0,0}}$ (i)   $T_1 = T_1$ AND IS EITHER ZERO ITSELF OR IS RELATIVE TO SOME EARLIER $T_0 = 0$ (ii)  $T_2 = T_1 + a$ (iii) $T_3 = T_1 + a + b$ (iv)  $T_4 = T_1 + a + b + c$ (v)   $R = a + b + c + d$

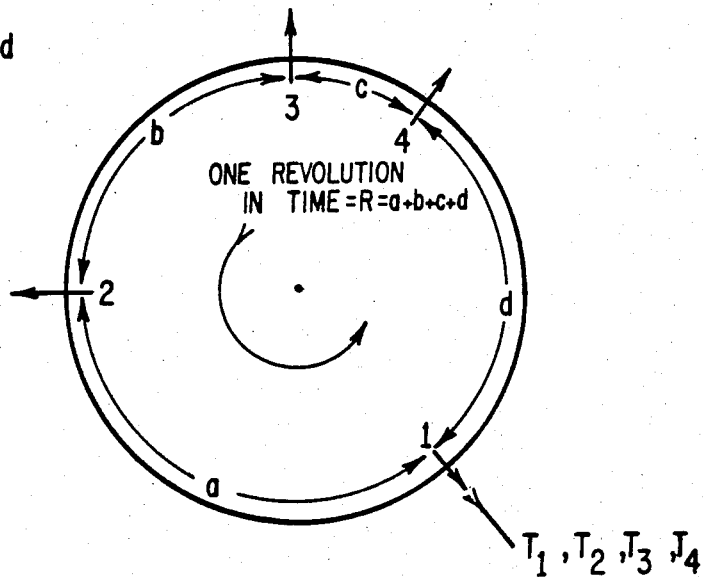

(vi)  $\dfrac{\sum_{i=1,2,3,4} T_i}{4} = \dfrac{4T_1 + 3a + 2b + c}{4}$ ⟵ TIME OF OCCURENCE FOR A "SINGLE EQUIVALENT POLE" STARTING WITH $T_1$, BUT SUPPOSE WE STARTED WITH $T_2$?

(vii) $\sum_{i=2,3,4,1} T_i = (T_1 + a) + (T_1 + a + b) + (T_1 + a + b + c) + (T_1 + a + b + c + d)$ (viii) $= 4T_1 + 4a + 3b + 2c + d$ (ix)  $= 4T_1 + 3a + 2b + c + R$ (x)   $\dfrac{\sum_{i=2,3,4,1} T_i}{4} = \dfrac{4T_1 + 3a + 2b + c}{4} + \dfrac{R}{4}$ (xi)  $\therefore \dfrac{\sum_{i=2,3,4,1} T_i}{4} = \dfrac{\sum_{i=1,2,3,4} T_i}{4} + \dfrac{R}{4}$

FIGURE 10

$$(55) \quad \Delta\phi_{0,0} = \left[ \frac{\sum_{x_{J}}^{y_{K-1}} \Delta\phi_{J,K}}{Q} - \frac{K}{Q}R \right] - \left[ \frac{\sum_{x_{J}}^{x_{J-1}} TP_i}{P} - \frac{J}{P}R \right] - \left[ \frac{\sum_{y_1}^{y_{Q-1}} TQ_i}{Q} - \frac{\sum_{x_1}^{x_{P-1}} TP_i}{P} \right]$$

THESE MEASUREMENTS MADE DURING THE SAME REVOLUTION AS AT RIGHT FOR $\psi$

THESE MEASUREMENTS REPRESENT $\psi$ AND IF ACTUALLY MADE WOULD BE TAKEN DURING THE SAME REVOLUTION, BUT PROBABLY NOT THE SAME REVOLUTION

- A SECOND AVERAGE TIME OF A Q POLE OWING TO THE INPUT ANGLE AND RELATIVE TO STARTING THE AVERAGE AFTER SKIPPING J-MANY AND K-MANY POLES

- CORRECTION INDEX REFLECTING THE CHANGE IN THE AVERAGE OWING TO SKIPPING K-MANY POLES

- A SECOND AVERAGE TIME OF A P POLE WITH "ZERO" ANGLE AND RELATIVE TO STARTING THE AVERAGE AFTER SKIPPING J-MANY POLES

- CORRECTION INDEX REFLECTING THE CHANGE IN THE AVERAGE OWING TO SKIPPING J-MANY POLES

- A FIRST AVERAGE TIME OF A Q POLE WITH "ZERO" ANGLE AND RELATIVE TO STARTING THE AVERAGE ON THE FIRST Q POLE

- A FIRST AVERAGE TIME OF A P POLE WITH "ZERO" ANGLE AND RELATIVE TO STARTING THE AVERAGE ON THE FIRST P POLE

{ A SECOND AVERAGE TIME OF AN EQUIVALENT SINGLE Q POLE OWING TO THE INPUT ANGLE AND ADJUSTED TO BE RELATIVE TO THE FIRST Q POLE (SKIPPING J-MANY POLES, PER SE, DOES NOT AFFECT THIS QUANTITY BEYOND CAUSING K-MANY POLES TO BE SKIPPED--WHICH IS WHAT THIS ADJUSTMENT IS FOR!)

{ A SECOND AVERAGE TIME OF AN EQUIVALENT SINGLE P POLE WITH A "ZERO" ANGLE AND ADJUSTED TO BE RELATIVE TO THE FIRST P POLE

{ A "HARD" REFERENCE DIFFERENCE BETWEEN THE EQUIVALENT SINGLE P POLE AND THE EQUIVALENT SINGLE Q POLE, AND REPRESENTING THE "REAL ZERO" ANGLE CONDITION; NEED NOT BE KNOWN IF CANCELLED BY SUBTRACTION AS EXPLAINED IN THE TEXT; TYPICALLY NOT KNOWN

A CHANGED DIFFERENCE BETWEEN THE AVERAGE TIME OF A Q POLE AND A NEW AVERAGE TIME OF A Q POLE OWING TO THE INPUT ANGLE; TO BE COMPARED AGAINST AN INITIAL REFERENCE DIFFERENCE REPRESENTING THE OTHER "BOUNDARY" OF THE INPUT ANGLE (i.e., THE CURRENT TRANSDUCER SETTING DIMINISHED BY THE INPUT ANGLE) WHICH MIGHT BE EITHER THE "HARD" REFERENCE AT RIGHT OR SIMPLY THE RESULTS OF AN EARLIER MEASUREMENT SUCH AS THIS VERY DIFFERENCE REPRESENTS

FIGURE 11A

$$(56)\ \Delta\phi_{Q,P} = \left[\underbrace{\frac{\sum_{y_1}^{y_{K-1}}T_{Q_i}}{Q}}_{\substack{\text{A SECOND AVERAGE} \\ \text{TIME OF A Q POLE} \\ \text{OWING TO THE IN-} \\ \text{PUT ANGLE, RELA-} \\ \text{TIVE TO STARTING} \\ \text{THE AVERAGE AFTER} \\ \text{SKIPPING J-MANY} \\ \text{AND K-MANY POLES} \\ \text{AND RELATIVE TO} \\ \text{SOME SECOND } T_0}} - \underbrace{\frac{K}{Q}\ R}_{\substack{\text{CORRECTION INDEX} \\ \text{REFLECTING THE} \\ \text{CHANGE IN THE} \\ \text{AVERAGE OWING TO} \\ \text{SKIPPING K-MANY} \\ \text{POLES}}} - \underbrace{\frac{\sum_{y_1}^{y_{Q-1}}T_{Q_i}}{Q}}_{\substack{\text{A FIRST AVERAGE} \\ \text{TIME OF A Q POLE} \\ \text{WITH "ZERO" ANGLE,} \\ \text{RELATIVE TO START-} \\ \text{ING THE AVERAGE ON} \\ \text{THE FIRST Q POLE} \\ \text{AND RELATIVE TO} \\ \text{SOME FIRST } T_0}}\right] - \left[\underbrace{\frac{\sum_{x_{J+1}}^{x_{J-1}}T_{P_i}}{P}}_{\substack{\text{A SECOND AVERAGE} \\ \text{TIME OF A P POLE} \\ \text{WITH "ZERO" ANGLE,} \\ \text{RELATIVE TO START-} \\ \text{ING THE AVERAGE} \\ \text{AFTER SKIPPING} \\ \text{J-MANY POLES AND} \\ \text{RELATIVE TO SOME} \\ \text{SECOND } T_0}} - \underbrace{\frac{J}{P}\ R}_{\substack{\text{CORRECTION INDEX} \\ \text{REFLECTING THE} \\ \text{CHANGE IN THE} \\ \text{AVERAGE OWING TO} \\ \text{SKIPPING J-MANY} \\ \text{POLES}}} - \underbrace{\frac{\sum_{x_1}^{x_{P-1}}T_{P_i}}{P}}_{\substack{\text{A FIRST AVERAGE} \\ \text{TIME OF A P POLE} \\ \text{WITH "ZERO" ANGLE,} \\ \text{RELATIVE TO START-} \\ \text{ING THE AVERAGE ON} \\ \text{THE FIRST P POLE} \\ \text{AND RELATIVE TO} \\ \text{SOME FIRST } T_0}}\right]$$

{ A SECOND AVERAGE TIME OF A Q POLE OWING TO THE INPUT ANGLE AND ADJUSTED TO BE RELATIVE TO THE FIRST Q POLE, WHICH FOR THIS DIFFERENCE UNDOES THE EFFECT OF SKIPPING J-MANY P POLES (ALL J DOES HERE IS CAUSE K!) THIS AVERAGE TIME IS RELATIVE TO THE SECOND $T_0$

{ A SECOND AVERAGE TIME OF A P POLE, ADJUSTED TO BE RELATIVE TO THE FIRST P POLE, BUT RELATIVE TO THE SECOND $T_0$

{ THESE WILL GENERALLY BE DIFFERENT, OWING TO RESETS OF THE TIMER PRODUCING DIFFERENT $T_0$'s FOR EACH SUMMATION, AND BECAUSE OF MOTOR SPEED VARIATIONS

{ CHANGE IN THE AVERAGE TIME OF A Q POLE OWING TO THE INPUT ANGLE BUT INCLUDING THE OFFSET BETWEEN THE TWO $T_0$'s

{ THIS IS THE OFFSET BETWEEN THE FIRST AND SECOND $T_0$'s (THERE IS NO CHANGE OWING TO THE INPUT ANGLE SINCE THE REFERENCE STATOR DOES NOT MOVE)

CHANGE IN THE AVERAGE TIME OF A Q POLE OWING STRICTLY TO THE INPUT ANGLE ONLY

FIGURE 11B $$(1) \quad \theta = 2\pi \left\{ \left[ \frac{\sum T_{Q_i}}{Q} - \frac{\sum T_{P_i}}{P} \right] \div R + \frac{P_\#}{P} - \frac{Q_\#}{Q} \right\} - \psi$$

- $\dfrac{\sum T_{Q_i}}{Q}$: AVERAGE TIME OF OCCURRENCE OF A Q POLE OWING TO THE INPUT ANGLE AND THE SKIPPING OF $Q_\#$-MANY POLES (ITSELF CAUSED BY SKIPPING $P_\#$-MANY POLES AT THE CURRENT INPUT ANGLE): TIME OF OCCURRENCE FOR A SINGLE EQUIVALENT Q POLE

- $\dfrac{\sum T_{P_i}}{P}$: AVERAGE TIME OF OCCURRENCE OF A P-POLE OWING TO THE SKIPPING OF $P_\#$-MANY P POLES: TIME OF OCCURRENCE FOR A SINGLE EQUIVALENT P POLE

- $R$: TIME REQUIRED FOR ONE REVOLUTION

- $\dfrac{P_\#}{P}$ RELATIVE TO $T_{P_1}$: THIS IS THE FRACTION OF A REVOLUTION BY WHICH THE INTERVAL BETWEEN THE EQUIVALENT POLES WAS DIMINISHED BY SKIPPING $P_\#$-MANY P POLES, SINCE THAT INCREASED THE AVERAGE SUM OF THE $T_{P_i}$ WITHOUT A CORRESPONDING CHANGE TO THE SUM OF THE $T_{Q_i}$

- $\dfrac{Q_\#}{Q}$ RELATIVE TO $T_{Q_1}$: THIS IS THE FRACTION OF A REVOLUTION BY WHICH THE INTERVAL BETWEEN THE EQUIVALENT POLES WAS INCREASED BY SKIPPING $Q_\#$-MANY POLES, SINCE THAT INCREASED THE AVERAGE SUM OF THE $T_{Q_i}$ WITHOUT A CORRESPONDING CHANGE TO THE SUM OF THE $T_{P_i}$

- $\psi$: A CONSTANT EQUAL TO THE RESIDUAL INTERVAL BETWEEN THE EQUIVALENT POLES AT SOME INITIAL REFERENCE ANGLE; MAY OR MAY NOT BE FOUND; TYPICALLY NOT FOUND BUT CANCELLED OUT AS A COMMON MODE COMPONENT OF TWO DIFFERENT MEASURED VALUES OF $\theta$

- $\left[\dfrac{\sum T_{Q_i}}{Q} - \dfrac{\sum T_{P_i}}{P}\right]$: A TIME INTERVAL OWING TO SOME INITIAL TIME INTERVAL EXISTING EVEN PRIOR TO THE APPLICATION OF THE INPUT ANGLE (i.e., $T_{P_1} \neq T_{Q_1}$).

TO THE INPUT ANGLE ITSELF (WHICH CAUSES THE SINGLE EQUIVALENT Q POLE TO OCCUR LATER) AND TO THE SKIPPING OF POLES (i.e., NOT WAITING FOR $T_{P_1}$ AND $T_{Q_1}$ TO BEGIN THE SUMMATIONS)

- $\div R$: THE TIME INTERVAL EXPRESSED AS A FRACTION IN UNITS OF ROTOR REVOLUTIONS

FIGURE 11C $$(1) \quad \theta = 2\pi \left\{ \underbrace{\left[ \frac{\sum T_{Q_i}}{Q} - \frac{\sum T_{P_i}}{P} \right] \div R}_{\substack{\text{A FRACTIONAL PORTION OF A REVOLUTION OWING TO THE INITIAL TIME INTERVAL, TO} \\ \text{THE INPUT ANGLE AND TO THE SKIPPING OF } Q_\#\text{-MANY Q POLES, BUT CORRECTED FOR} \\ \text{SKIPPING } P_\#\text{-MANY P POLES}}} + \underbrace{\frac{P_\#}{P}}_{\substack{\text{A FRACTIONAL PORTION OF A REVOLUTION OWING ONLY TO THE INITIAL TIME INTERVAL AND THE INPUT ANGLE;} \\ \text{ADJUSTED TO REFLECT WHAT WOULD HAVE BEEN MEASURED HAD BOTH SUMMATIONS BEGUN UPON THEIR RESPECTIVE} \\ \text{FIRST POLES } T_{P_1} \text{ and } T_{Q_1}}} - \underbrace{\frac{Q_\#}{Q}}_{\substack{\text{A FRACTIONAL PORTION OF A REVOLUTION OWING ONLY TO THE INPUT ANGLE AND RELATIVE TO BEGINNING THE SUMMATIONS ON } T_{P_1} \text{ AND} \\ T_{Q_1}; \psi \text{ IS EITHER EXPLICITLY FOUND AND THEN SUBTRACTED (AS IN EQ. (1)) OR IS CANCELLED IN THE SUBTRACTION OF MEASURED} \\ \text{VALUES FOR TWO DIFFERENT VALUES OF THE INPUT ANGLE (AS EQ'S (1') AND (1''))}}} \right\} - \underbrace{\psi}_{\substack{\text{THE FRACTION OF A ROTOR REVOLUTION BETWEEN THE TWO SINGLE EQUIVALENT POLES OWING TO THE INPUT ANGLE, RELATIVE TO THE} \\ \text{INITIAL DIFFERENCE BETWEEN } T_{P_1} \text{ AND } T_{Q_1}, \text{ AND EXPRESSED IN RADIANS}}}$$

FIGURE 11D

METHOD AND APPARATUS FOR MEASURING PHASE

FIELD OF THE INVENTION

The subject matter of the present invention pertains to the precision measureaent of the relative phase between two signals. Irregularities in the periods of the signals need not affect the accuracy of the phase measurement, provided that certain criteria are met. An angle transducer is discussed as an example of the application of the principles of the invention.

BACKGROUND AND SUMMARY OF THE INVENTION

Many prior art angle transducers generate AC signals whose phase difference corresponds to the input angle. See, for example, U.S. Pat. Nos. 2,930,033 and 3,278,928. The accuracy of these devices depends in part upon the mechanical accuracy through which the signal generating elements interact to produce their signals, as well as upon the accuracy of the means used to measure the resulting phase. Several well known structures of this type include one or more pluralities of rotating poles either optically, capacitively or inductively coupled to corresponding fixed and moveable sensors. Another structure is similar, except that the mechanical roles of the poles and sensors are interchanged. It is widely held that the accuracy of such transducers begins with the generation of signals whose every cycle is a faithful translation of an input angle into a phase difference between corresponding cycles of two different signals. Averaging is frequently employed to extend the level of confidence in the measured phase. Averaging may involve simply measuring the phase over a greater number of cycles, and it may involve increasing the number of sensors and then electrically summing their outputs. But even averaging does not necessarily provide exact cancellation of pole misplacement, and unless specifically provided for in the phase measurement algorithm, variations in signal period caused by angular misplacement of the poles can produce errors in the result. In particular, the summed multiple sensor approach may introduce its own type of error if there are any variations in sensor signal amplitude. Eccentric sensor mounting, for example, can cause sensor-to-pole distance variations that in turn cause corresponding amplitude variations in the sensor signal.

A commonly employed technique to reduce a certain type of eccentricity error may actually increase the extent to which these prior art angle transducers rely upon accurate mechanical placement of their poles. This technique involves the analog summation of signals produced by one or more pairs of diametrically opposed sensors. During the summation opposing phase errors substantially cancel each other by continuously adding to almost zero. In essence, this technique combines two or more signals into a unified combination which is then used as one of two components in a phase measurement. The desired effect to be produced by the diametricity of the opposing sensors is offset or negated if the poles are significantly misplaced or the sensors are not truly diametric. That is, unless the error components to be averaged by the instantaneous summation are essentially coincident and of equal periods the desired error cancellation will not occur. This strengthens the need for the poles to be regularly placed, and adds a similarity of pole shape requirement as well.

It would be desirable if the accuracy of a shifted-signal-phase angle transducer did not fundamentally depend in part upon the accuracy of pole placement, but instead upon only the accuracy of the phase measuring means. It would also be desirable if the technique for reducing eccentricity errors did not depend upon the accuracy of pole placement or upon the symmetry of their shapes.

To continue briefly with the topic of eccentricity error correction, the error component being cancelled is a phase error. In principle, such instantaneous cancellation is nearly exact provided that the signal amplitudes from the diametrically opposed sensors are equal. Unfortunately, the nature of the eccentricity error also introduces an amplitude difference between the two signals. It would be desirable if the cancellation of the phase errors could be achieved regardless of the difference in amplitudes. These remarks apply to certain other types of errors, as well.

Variations in the angular velocity of the rotating elements can seriously affect the accuracy of the phase measuring means. Any such variations cause changes in the periods of the signals whose phase difference is to be determined. It is very desirable that the phase measuring means be essentially insensitive to both steady state changes in the angular velocity and any periodic variations that may occur within each revolution of the rotating member. Insensitivity to periodic variations reduces the need for mass to produce angular momentum ("flywheel effect") to smooth those variations, and therefore allows a lighter weight transducer.

Crosstalk between the signals for the fixed and moveable sensors can introduce phase distortion that seriously degrades the accuracy of the angle transducer. While such crosstalk can often be reduced or eliminated by shielding, that adds to the cost and mechanical complexity, adds weight, and perhaps even increases the size. It would be extremely desirable if the technique used to generate the AC signals were such that the nature of those AC signals permitted them to accurately convey their information despite the presence of crosstalk, and if the phase measurement technique were substantially insensitive to crosstalk, so that the true phase information is accurately extracted.

Prior art phase measurement techniques employed with transducers of whatever sort that generate signals of variable phase difference often produce a result best characterized as a "fine" measurement. This fine result is a modulo answer that must be combined with the result of a "coarse" measurement. How this is accomplished generally determines if the device is "incremental" or "absolute." Examples of devices to which these remarks apply include certain angle tranducers and certain distance measuring equipment. While there is nothing inherently wrong with a "coarse-fine" measurement architecture, it would certainly be advantageous if the phase measurement technique employed provided a unified high accuracy and high resolution answer directly, without the need to avoid certain well known pitfalls in the averaging of separate coarse and fine components and then combining them. Some of these problems stem from the modulo nature of the measurements, and concern how to handle very small or very large values; that is, ones that are close to the value where a measurement "rolls over." While these problems have all been successfully dealt with in the past, their solutions are not cost free. It would therefore be desirable if these concerns could be dispensed with while retaining all of the accuracy and resolution of such "coarse-fine" systems. Such a phase measurement technique should also retain its insensitivity to variations in signal period (pole placement errors, motor speed variations) and to crosstalk.

An important consideration of any phase measurement technique is freedom from the so-called "phase coincidence problem." This is a problem universally experienced by what might be called the "start-stop" method of phase measurement. In this method the phase between two signals of the same frequency and of known period is found by starting a timer on a zero crossing or edge of one signal and stopping it on the corresponding zero crossing or edge of the other signal. The measured time is a fraction of the period, and thus represents the phase. A common technique of averaging with this method is to simply accumulate n-many measured intervals and divide the result by n-many periods. But this technique has a serious difficulty, especially when used with such averaging, whenever the start and stop conditions get very close together. Noise can then cause them to appear interchanged, which makes it very difficult to distinguish between and then average very large and very small angles. The usual cure for this is to introduce and then later remove a 180 degree offset in the measured values whenever they would ordinarily be within a selected region either side of zero. It would be desirable to dispense with such extra overhead while retaining the advantages of averaging.

In devices involving a rotating member absolute coarse or other information is often derived from signals indicating the completion of each revolution. It would be desirable if the generation of these once-per-revolution signals did not require extra poles or sensors.

And finally, it would be advantageous if all of the preceding benefits could be achieved in a digital system, minimizing the need for precision low-drift analog circuitry. Specifically, it is desirable to exploit the computational and decision making abilities of microprocessors to transfer the bulk of the logical complexity of the overall transducer to the processing algorithms, in conjunction with the use of suitable structural features in the measurement hardware.

These and other advantages can be realized through use of the teachings summarized below. The result is a relatively low-cost precision angle transducer requiring few precision mechanical parts but that is capable of excellent performance in the arc second range.

The angle transducer to be described achieves freedom from the need for high precision in the placement of its rotating poles by employing a phase measurement technique that is, in principle, insensitive to the effects of misplaced poles. The technique is also essentially insensitive to unequal or varying sensor-to-pole spacing. In the angle transducer to be described the rotating poles are formed by using two standard commercially available steel gears journalled upon a common shaft and driven by a motor. Fixed and moveable pairs of diametrically opposed independent (i.e., separate, and not analog summed) magnetic sensors produce four AC signals as the gears revolve.

The correction of eccentricity errors, as well as of similar errors, that is provided by diametrically opposed and independent sensors is nearly exact, and yet does not introduce a dependence upon regular or accurate spacing of the gear teeth, or a dependence upon exact diametricity. The various independent sensors each produce their own individual signals, and at least one revolution's worth of transition information contained therein is captured by periodic sampling and stored in a memory. When a measurement is to be made the transition information for each sensor is collected into an aggregate quantity and then combined with similar aggregate quantities for the other sensors. In this way all of the self-cancelling phase information is present, and does cancel when the aggregates are combined. However, the phase errors due to eccentricity need not originally be sensed in simultaneous opposition, as when the analog sensor signals are summed in real time. It is that simultaneity of opposing errors through symmetry of diametric sensors which requires ideal pole placement for maximum error cancellation. By processing the stored phase information of the signals for exactly one revolution or an integral number of exact revolutions the essential property of error symmetry at the diametric sensors is preserved, but the need for simultaneity is removed. Thus, the widths of the poles need not subtend equal angles about the axis of rotation, nor need they be placed at regular angles around that axis.

Also, since the measurements for the various sensors are made during the same revolution, various other errors that are susceptible of self cancellation, but that might not be the same from revolution to revolution, are free to reduce themselves to the maximum extent. An example of this is a ball bearing with a large ball therein.

The aggregate quantities mentioned above are formed in the process of making a phase measurement between the signals of two independent sensors. A plurality of different phase measurements are performed; one between each of certain combinations of the sensors. Specifically, the phase is measured for each combination of each moveable sensor taken in turn with each of the fixed sensors. These phase measurements are unaffected by the amplitudes of the signals involved. Once all of the various phases are in hand they may be averaged to cancel the phase error introduced by the eccentricity. In short, measure phase first and then average phase only, rather than average both phase and amplitude as inseparable entities (so that amplitude differences affect the phase difference) and then measure the phase. The cancellation of the phase error due to eccentricity is therefore nearly exact, without regard for the concomitant amplitude variations also introduced by the eccentricity or unequal pole-to-sensor distances.

Crosstalk does not substantially affect the angle transducer to be described because the signals whose phases are to be measured have different frequencies. That is, the phase information conveyed by the signals from the moveable sensors is orthoganal to the phase information conveyed by the signals from the fixed sensors. With properly chosen frequencies the integrated crosstalk result of each frequency upon the other, in principle, sums to zero. In practice, the discretely sampled nature of a digital system only approximates complete cancellation, but the approximation can, in principle, be as close as desired. The different frequencies are chosen so that neither is an integral multiple of the other. The angle transducer to be described produces signals of such frequencies by the simple expedient of using gears with different numbers of teeth.

The phase measurement technique to be described accepts signals of differing and possibly nonconstant frequencies, subject only to the following requirements. First, for P-many cycles of one frequency there must always be exactly Q-many cycles of the other. Second, some means must be employed to recurringly identify or track an absolute reference location for one or both of the signals. If both signals have absolute reference marks then an absolute (i.e., nonincremental) unified (i.e., no separate coarse and fine) result may be obtained. A coarse/fine partition of the result is also possible. If only one absolute reference mark is maintained then the result will be a fine measurement; coarse information would come either from a separate absolute measurement, or be incrementally accumulated. In accordance with certain details to be discussed later, the absolute reference marks can either be "hard" (actually part of the signal) or "soft" (the microprocessor picks certain cycles to be the marks and incrementally keeps track of how they shift relative to each other). In the former case a certain constant useful to the phase measurement technique can either be found once and permanently encoded for use by the microprocessor, or the microprocessor can automatically find and save it each time the transducer is powered up. In the latter case permanent storage of the constant may not be possible, as its value may depend upon which cycles are selected as the reference marks. Automatic constant finding in the latter case may require the operator to input one or two known static conditions to the transducer to enable the value of the constant to be discovered. In either case there is also a way to avoid having to find the value of the constant.

In the angle transducer to be described the absolute reference marks are easily generated by the simple expedient of removing an arbitrarily chosen tooth from each gear. The microprocessor recognizes the corresponding periodic disturbance in each sensor signal. This recognition locates the relative positions of the absolute reference marks. Once they are located the microprocessor can substitute an excellent approximation of what each sensor signal would have been like if those teeth had been there. This minimizes whatever effect that the missing teeth might otherwise have upon the phase measurement technique itself (no such effects are currently known) and upon the associated error reduction schemes (certain of these are known, and they tend to be second order effects).

The phase measurement itself is performed beginning at any arbitrary time during one of the P-many or Q-many cycles of the two signals. The microprocessor notes for each signal, in units of whole cycles, the differences between the starting time and the most recent occurrences of their respective absolute reference marks. Beginning with the next zero crossing of one of the signals as a local reference time, that local reference time and the zero crossing time for P-many and Q-many consecutive cycles of the respective signals are measured and stored in a table. In the embodiment to be described only positive going zero crossings are considered. Negative going zero crossings could be used instead, and a system could as easily use each zero crossing. Using the data in the table sums are formed for the P transition times in one signal and the Q transition times in the other. These sums are arithmetically combined with a measurement of the time required for P or Q cycles, the starting-time-to-absolute-reference differences, and with the values of P and Q, to produce the phase.

The present technique is free of the "phase coincidence problem," described earlier, since all that it requires is the independent measurement of P-many and Q-many consecutive times, each relative to a single reference time. Noise introduces only the unavoidable uncertainty inescapably associated with knowing those values exactly, but which uncertainty is reduced by the averaging inherent in the technique. But such noise has no further opportunity to introduce measurements that are in error by the amount of the modulus, since there is no particular correspondence between the P-many and the Q-many times. This is consistent with the advantage that pole placement can be arbitrary. What does matter is the change in the difference between the average times of occurrence for what we shall call "single equivalent poles." But each of these average times is determined separately from the other, so that the problem of phase coincidence simply cannot arise.

The above-described measurements and calculations are performed by coupling zero crossing detectors to the outputs of the independent sensors. A delay mechanism produces delayed versions of the output of each zero crossing detector. A transition detection circuit detects any transition in any of the signals by comparing delayed and undelayed values of each signal. Upon the detection of a transition the nature of the transition is captured, along with the time value in a digital clock circuit. The sequent transition and time data are temporarily stored in a revolving circular buffer to which data can be added independently from its removal. This allows short bursts of asynchronously occurring data to be captured while the microprocessor independently removes it to a memory at its own pace, under interrupt control. An up-down counter circuit indicates whether or not the revolving circular buffer contains fresh information; if it does an interrupt is generated for the microprocessor. Under the control of an interrupt service routine the microprocessor continuously updates the transition and time information stored in a table in Read/Write memory. That table contains at least one revolution's worth of data. When a request is made to perform an angle measurement the microprocessor uses the table to perform the various phase measurements between the sensors, and combines the results into a suitable answer.

BRIEF DESCRIPTION OF THE DRAWINGS

FIG. 10 is a simplified illustration of the principle behind a theorem of interest in connection with FIGS. 4-9C.

FIGS. 11A-D are annotated equations in support of an interpretation of the phase angle formula pertaining to FIGS. 4-9C.

DESCRIPTION OF THE PREFERRED EMBODIMENT

Angle Transducer Overview

Figure 1:
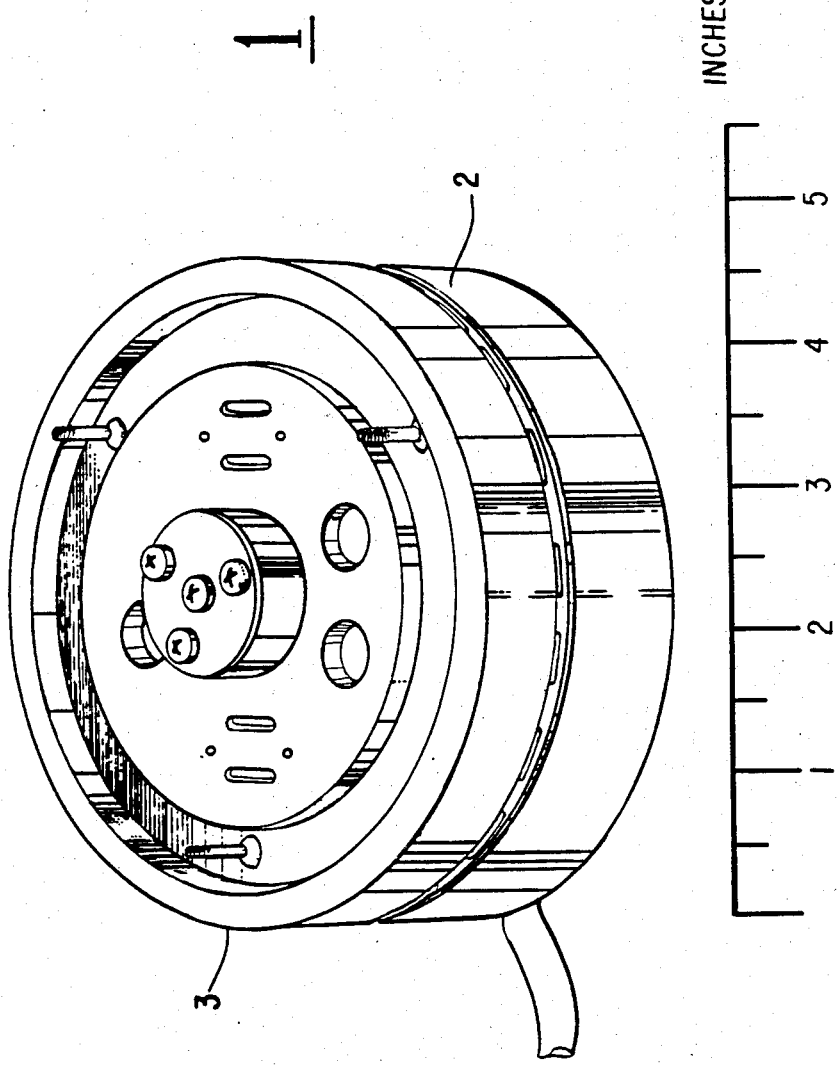
FIG. 1 is a front perspective view of an assembled angle transducer constructed in accordance with a preferred embodiment of the invention.

FIG. 1 is a perspective view of an assembled mechanical portion 1 of an angle transducer constructed in accordance with a preferred embodiment of the invention. A stationary base 2 provides support for a rotatable housing 3, and also encloses certain electronic circuits and a motor. As the explanation proceeds and the function of each of the parts becomes clear, it will be convenient to also refer to the stationary base 2 as a reference stator assembly 2, or simply as the reference stator. Likewise, it will be convenient to refer to the rotatable housing 3 as an input stator assembly 3, or simply as the input stator. Electrical signals produced by the circuits within the mechanical portion 1 are coupled through an umbilical cable to additional circuitry (not shown) that includes a microprocessor. The microprocessor operates upon phase information contained in the timing of transitions for four signals and provides to a using system absolute angle data capable of arc second accuracy.

The stationary base 2, or reference stator, is rigidly attached to some element of the instrument or system within which angle measurements are to be made. For example, it could be attached to a pedestal or affixed to a reference member of a tripod-mounted device. e.g., a theodolite. A moveable member whose angle is to be measured is mechanically coupled to the rotatable housing 3, or input stator. The input angle is then manifested as some angular displacement between the input stator 3 and the reference stator 2, as imparted by the moveable member.

The electronic circuitry within the mechanical portion 1 produces four square wave signals. The angle information is contained within various phase differences of certain moduli between each signal of a selected pair of the four square wave signals considered in relation to each of the remaining signals of the other pair. If these four signals were labelled, for example, A, B, X and Y, then A and B would be of the same frequency, and would correspond, for example, to the input stator. To complete the example, X and Y would also be equal in frequency but preferably not the same frequency as A and B, and would correspond to the reference stator. The multi-way comparison mentioned in the second sentence of this paragraph does not refer to comparing the phase of A with that of B, nor X with Y. Instead, it refers to finding a phase difference between "A combined with B" and "X combined with Y." To do this, the actual phase measurements made are A:X, A:Y, B:X and B:Y. Henceforth, these will be referred to as simply AX, AY, etc. The reasons for making these phase measurements will be discussed at length in an appropriate section below. The additional circuitry spoken of in the second paragraph above obtains timing data indicative of these phase differences, and the microprocessor reduces that data to highly accurate absolute angle measurements.

As shown in FIG. 1, the mechanical portion 1 can be relatively compact. In one actual embodiment the mechanical portion 1 is approximately four and one-half inches in diameter and two and one-fourth inches high.

Figure 2:
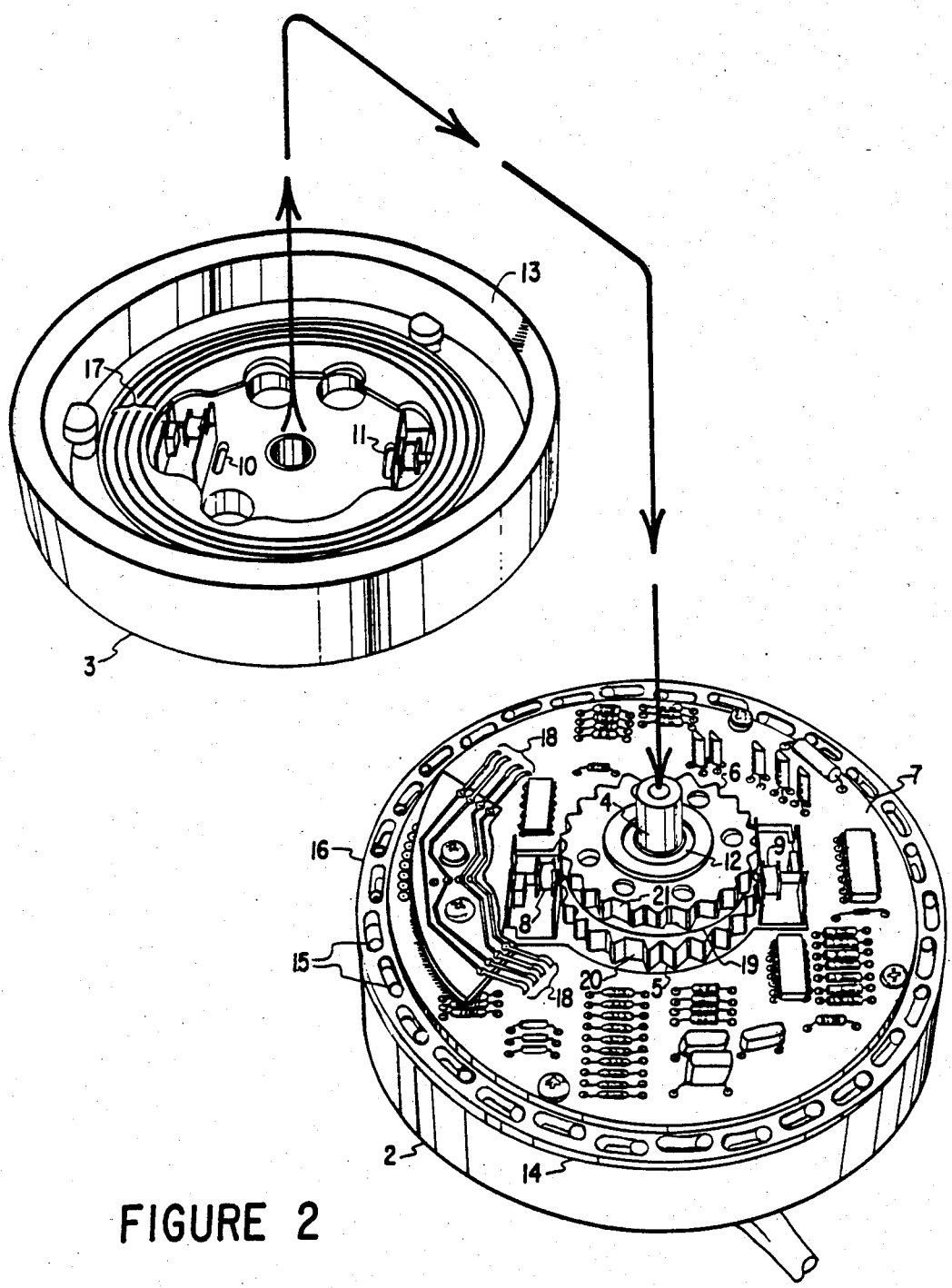
FIG. 2 is a top perspective view of a partially disassembled angle transducer of FIG. 1.

Referring now to FIG. 2, the mechanical portion 1 of the angle transducer is shown partially disassembled. The rotatable housing 3 has been removed and turned upside down. Securely journalled in the bottom of the stationary base 2 by a bearing that is not visible is a rotor shaft 4. Rotor shaft 4 is free to rotate about its axis, but is secured against thrust along that axis. Journalled upon rotor shaft 4 by a pair of bearings (of which only the upper bearing 12 is visible) are two motor driven magnetically permeable toothed annular members 5 and 6. These two members are rigidly attached to and separated by a spacer 19 that is preferably of low magnetic permeability. Toothed annular members 5 and 6 are each screwed to the spacer 19 and cannot move relative to each other; they can only revolve as a unit about the rotor shaft 4. Toothed annular members 5 and 6 may be standard off-the-shelf steel gears, as it is demonstrated below that the positional accuracy of the gear teeth need have almost nothing to do with the accuracy of the angle transducer. The lower toothed annular member 5 may be conveniently termed the reference rotor member 5, or simply the reference rotor. Likewise, the upper toothed annular member 6 may be termed the input rotor member 6, or simply the input rotor.

The rotor members 5 and 6 are driven by a motor (not visible) located in a cavity in the stationary base 2, beneath a printed circuit board 7. The motor preferred in the present example is a DC powered hall-effect commutated "three phase" motor whose speed is electronically regulated at three revolutions per second. (Speeds of from at least two to ten revolutions per second appear practicable. Decreases in signal amplitude from the magnetic sensors appear to limit the speed of the particular rotors described herein to not much less than 2 revolutions per second, while the throughput of a low cost microprocessor and portable motor power consumption presently appear to limit rotor speed to not much more than 10 revolutions per second. In principle, the rotor speed could be considerably higher, if desired.) The field windings of the motor are secured to the interior of the aforementioned cavity, while the armature is made up of permanent magnets attached to a magnetic ring secured to the underside of the reference rotor member 5.

A pair of self biasing independent reference magnetic sensors 8 and 9 are diametrically disposed about the reference rotor member 5. As the rotor member 5 rotates, independent reference sensors 8 and 9 each sense time variant changes in the reluctance of an associated magnetic circuit formed by the individual sensor and those gear teeth immediately nearby. Each of magnetic sensors 8 and 9 produce separate signals that are conditioned into two of the four square wave signals (the X and Y mentioned earlier). Magnetic sensors 8 and 9 may be termed the reference sensors.

Another pair of self biasing independent magnetic sensors 10 and 11 are located on the underside of the rotatable housing 3, and these may be termed the input sensors. Magnetic sensors 10 and 11 also produce separate signals in response to time variant changes in reluctances resulting from the rotation of the input rotor member 6. These separate signals are each conditioned into square waves, which are the remaining two square wave signals, (the A and B previously mentioned).

The printed circuit board 7 contains a motor speed control circuit, as well as amplifiers and zero crossing detectors to convert the generally sinusoidal outputs from the four magnetic sensors 8-11 into their associated square wave signals A, B, X and Y.

When assembled, the rotatable housing 3 is locked to the rotor shaft 4, which as previously described is securely supported for rotation by a (not visible) bearing below the motor in the bottom of the stationary base 2. The rotor shaft 4 provides a stable axis for rotation by the rotatable housing 3, through which the input angle is applied. The rotatable housing 3 is further supported upon the stationary base 2 by a series of ball bearings 15 held in place by a retainer 16. Hardened and ground bearing surfaces 13 and 14 each form a race upon which the intervening ball bearings 15 travel. This securely supports the input stator assembly 2 upon the reference stator assembly 2 for smooth and low friction rotation about the stable axis of rotor shaft 4. This particular bearing arrangement was chosen to allow a theodolite telescope to be mounted directly upon the angle transducer.

Alternate mechanical arrangements are also possible. For instance, the rotor shaft 4 could be rigidly attached to the reference stator, while the input stator is journalled to the rotor shaft by a bearing.

The input stator assembly 3 must be free to rotate through whatever input angle is to be transduced. To this end, a set of four circular slip rings 17 in the underside of the rotatable housing 3 align with four corresponding pairs of resilient contacts 18. The resilient contacts 18 bring the signals from the magnetic sensors 10 and 11 onto the printed circuit board 7. The input stator assembly 3 is therefore unconstrained in the direction and magnitude of the input angle.

The input angle produces a corresponding phase difference between the signals from the magnetic sensors 10 and 11 for the input rotor 6 on the one hand, and the signals from the magnetic sensors 8 and 9 for the reference rotor 5 on the other hand. To see why this is so, assume that the input stator 3 is positioned so that the input magnetic sensors 10 and 11 are aligned immediately above the reference magnetic sensors 8 and 9. Also assume that the input and reference rotors 5 and 6 are identical and positioned such that the teeth of one could be construed as extensions of the teeth of the other. Under these rather restrictive conditions there would be no phase difference between the reference sensor signals and the input sensor signals, owing to the simultaneity with which the corresponding pairs of signals are generated. Assuming the rotors had n teeth, a mechanical input angle of, say, 360/n degrees, would also produce no electrical phase shift between the input and reference sensor signals, again owing to simultaneity stemming from mechanical alignment. That is, the n teeth produce signals having a mechanical modulus of 360/n mechanical degrees. Within this mechanical modulus the electrical signals exhibit a complete cycle of 360 electrical degrees. If the mechanical input were ¼ of 360/n degrees, then an electrical phase difference of ¼ of 360, or ninety, electrical degrees would obtain.

Since there are n complete cycles of electrical phase shift for each single mechanical revolution, the electrical phase difference would conventionally be termed a "fine" measurement to be concatenated with some "coarse" value indicative of the number of whole fine cycles contained in the input angle. The coarse value ordinarily must either be generated by incremental changes made in response to the monitoring of phase roll-overs in the fine measurement (the so called incremental method), or it must be measured directly (the so-called absolute method). The preferred phase measurement technique to be discussed at length below is compatible with this coarse/fine concept, as well as the notions of incremental and absolute measurements. However, when used to its best advantage, the concepts of coarse and fine are less compelling, as the result is simply "the answer", with no obviously separable coarse and fine components. In a sense they will still be there, and if the gear teeth are assumed to be regularly placed, "coarse" and "fine" would have something resembling their ordinary meaning. (It appears that the number of poles on each rotor must be equal for the notions of coarse and fine to have their conventional meanings.) But as stated earlier, these are unnecessary conditions that the rotors need not meet. If the number of gear teeth are unequal or allowed irregular placement, "coarse" and "fine" have rather peculiar meanings. This whole business will be discussed at greater length toward the end of the section explaining the phase measurement technique.

The preferred use of the phase measurement technique to be described requires that each rotor incorporate some means for generating a "hard" once-per-revolution index mark. This amounts to identifying some pole on each rotor as an "absolute reference pole." However, and as an example of the flexibility of the technique to be explained herein, if the phase measurement itself is to produce only a "fine" answer while a "complete" answer is still required, then either the incremental measurement method would be used (allowing the once-per-revolution mark on the input rotor to be dispensed with) or the two once-per-revolution marks used to form a separate coarse measurement. In either of these latter two cases the reference rotor 5 would (unless P=Q) have a once-per revolution mark to provide the measurement technique disclosed herein with absolute reference pole information for the reference rotor 5. "Soft" once-per-revolution marks are discussed elsewhere. The need for the marks is the same regardless; it is principally the manner of their generation that is different. (As they appear here, these remarks are divorced from their support, which is found in various sections to follow, and may not be completely appreciated. They are mentioned both to simply state the case and illustrate the flexibility of the phase measurement technique to be disclosed.)

Separate once-per-revolution marks afford a means to perform a coarse measurement which can be correlated with a fine measurement to produce an absolute (i.e., non-incremental) angle measurement. Such a coarse measurement is also performed by a phase comparison. However, there is only one electrical cycle per mechanical revolution in each of the signals whose phases are to be compared, so 360 degrees of electrical phase corresponds to a full 360 degrees of mechanical rotation of the input stator 3. In addition, the n fine cycles per rotor revolution can be used as a clock in determining the coarse phase measurement between the two once-per-revolution marks. This significantly reduces the effects of motor speed variation upon the coarse measurement.

Rather than provide separate sensors to produce "hard" one-per-revolution signals for each of the input and reference rotors, once-per-revolution index marks are easily obtained by simply removing a tooth from each of the input and reference rotors. In FIG. 2, teeth 20 and 21 have been removed from rotors 5 and 6, respectively. The microprocessor can both recognize the longer period as the once-per-revolution mark, as well as replace the missing cycle with an excellent estimate of what it would have been if it had actually been there.

A further possible use of the once-per-revolution marks would be to signify an interval of time during which one full revolution's worth of data could be collected. A full revolution's worth of data is important in the phase measurement technique to be described. However, such an approach limits when such an interval can start, and would slow things down by a significant amount. Since a processor is available, and since the numbers of poles on each rotor does not change, the preferred method of gathering data for one complete revolution is to count cycles. In this way the phase measurement can commence with the passage of any pole past any of the sensors.

The reduction of errors caused by sensor eccentricity (and certain other conditions, such a tilted rotor, etc.) is enhanced by not forming the analog sum of the input magnetic sensors and the analog sum of the reference magnetic sensors before their phase comparison, as in prior art devices. Instead, the signals are kept separate and the phase information from each independent sensor is sought through a measurement pertaining strictly to the timing of those signals. This produces eccentricity correction based on phase alone, and prevents the phase of a signal of larger amplitude from swamping out the phase of a signal of smaller amplitude, as necessarily happens when out-of-phase signals of unequal amplitudes are algebraically added. The reason why this is important is that eccentricity also produces significant (and non-linear) variations in signal amplitude.

The technique of measuring the phases first and then averaging the results, rather than the other way around, is also beneficial in reducing other types of errors of the type generally known as "once-around" errors, twice-around" errors, etc. A once-around error is one that is an error in the measured angle that is a periodic function of the input angle and that has a period of 360 input degrees. A twice-around error has a period of 180 input degrees (the error function repeats twice during one revolution of the input). It is conventional to employ diametric sensors with averaging to reduce once-around errors, and to employ two pairs of diametric sensors in quadrature with averaging to reduce twice-around errors, etc. The effectiveness of these and related techniques can be considerably improved by measuring the phases first and then averaging.

Finally, crosstalk between the input and reference magnetic sensors can significantly affect the accuracy of the transducer. These effects can be almost entirely eliminated by a proper choice in making the number of teeth of the input rotor 5 unequal to the number of teeth of the reference rotor 6, in conjunction with measuring over an integral number of complete rotor revolutions.

The above described features would prove difficult or impossible to implement with conventional phase comparison circuitry. It is effectively and efficiently implemented, however, with the particular microprocessor based approach to be described at length below. The microprocessor builds in memory a table of transition directions and times for the four square wave signals from the magnetic sensors. This table is constructed by an interrupt service routine invoked by the occurrence of a transition in any of the four signals. Inbetween interrupts the microprocessor can, upon a measurement request, begin processing the data already in the table. The table can be "circular", so that sufficiently old data is automatically overwritten by new data.

Angle Transducer Block Diagram

Figure 3A:
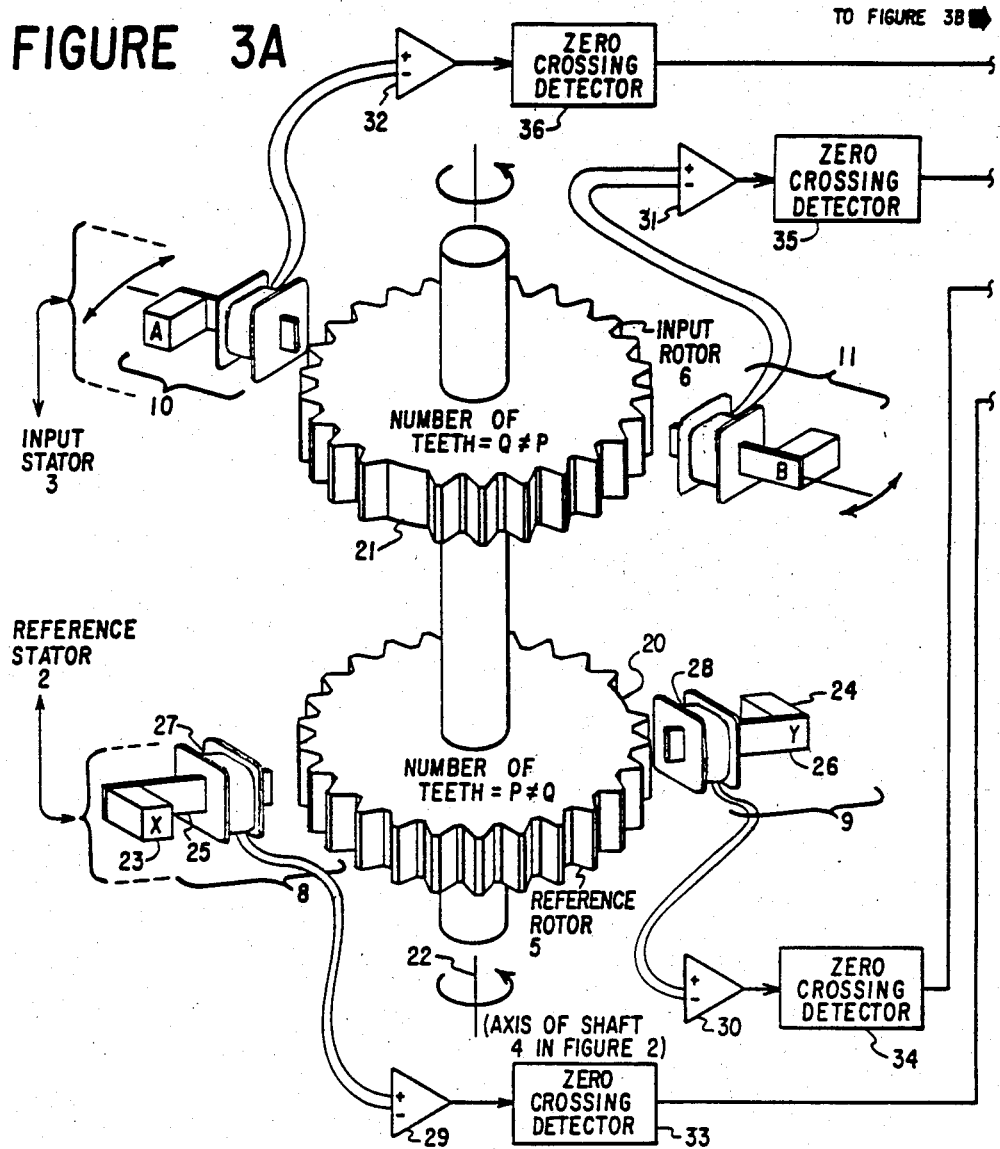
FIGS. 3A-C comprise a a simplified functional block diagram of the angle transducer of FIGS. 1 and 2.
Figure 3B:
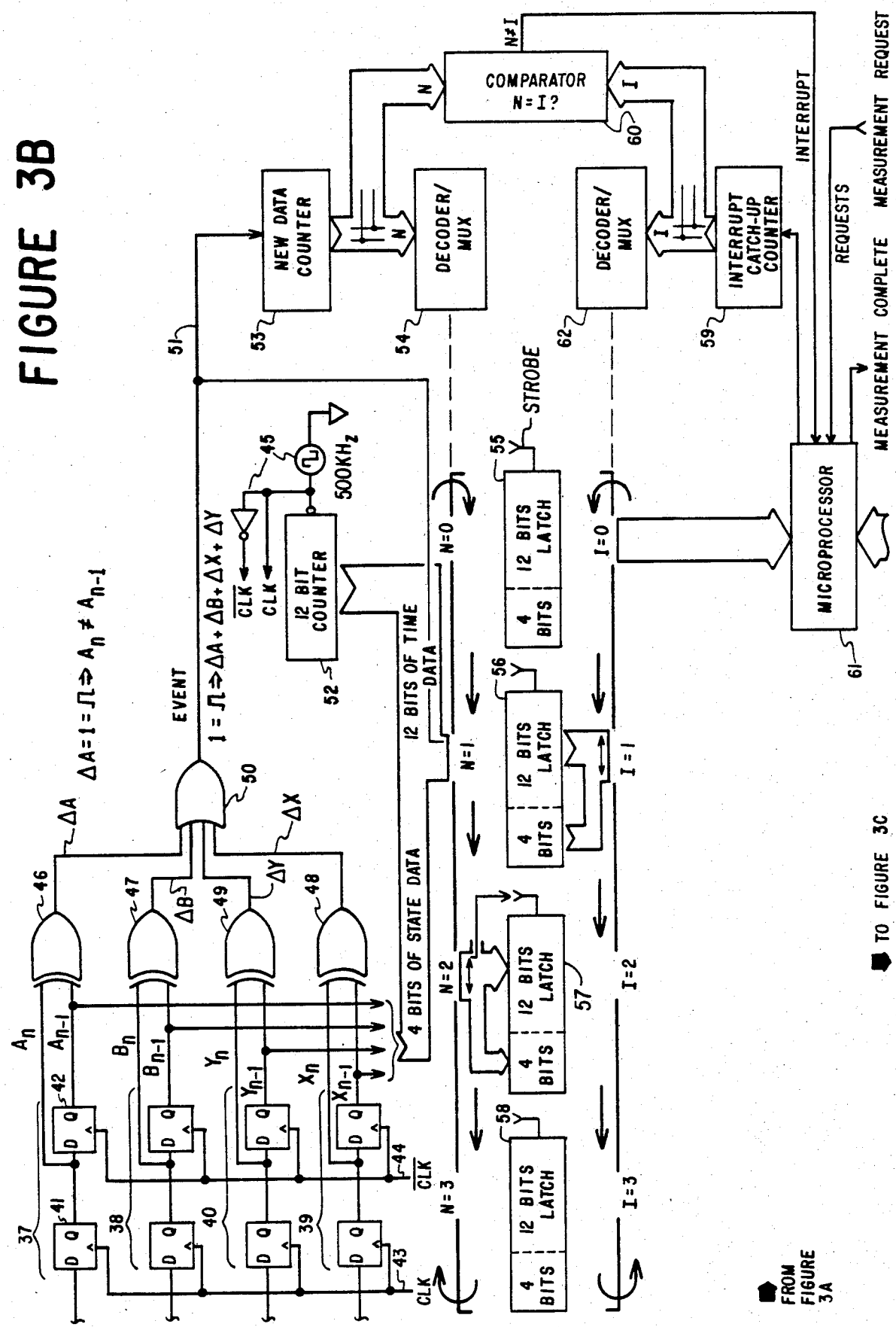
Figure 3C:
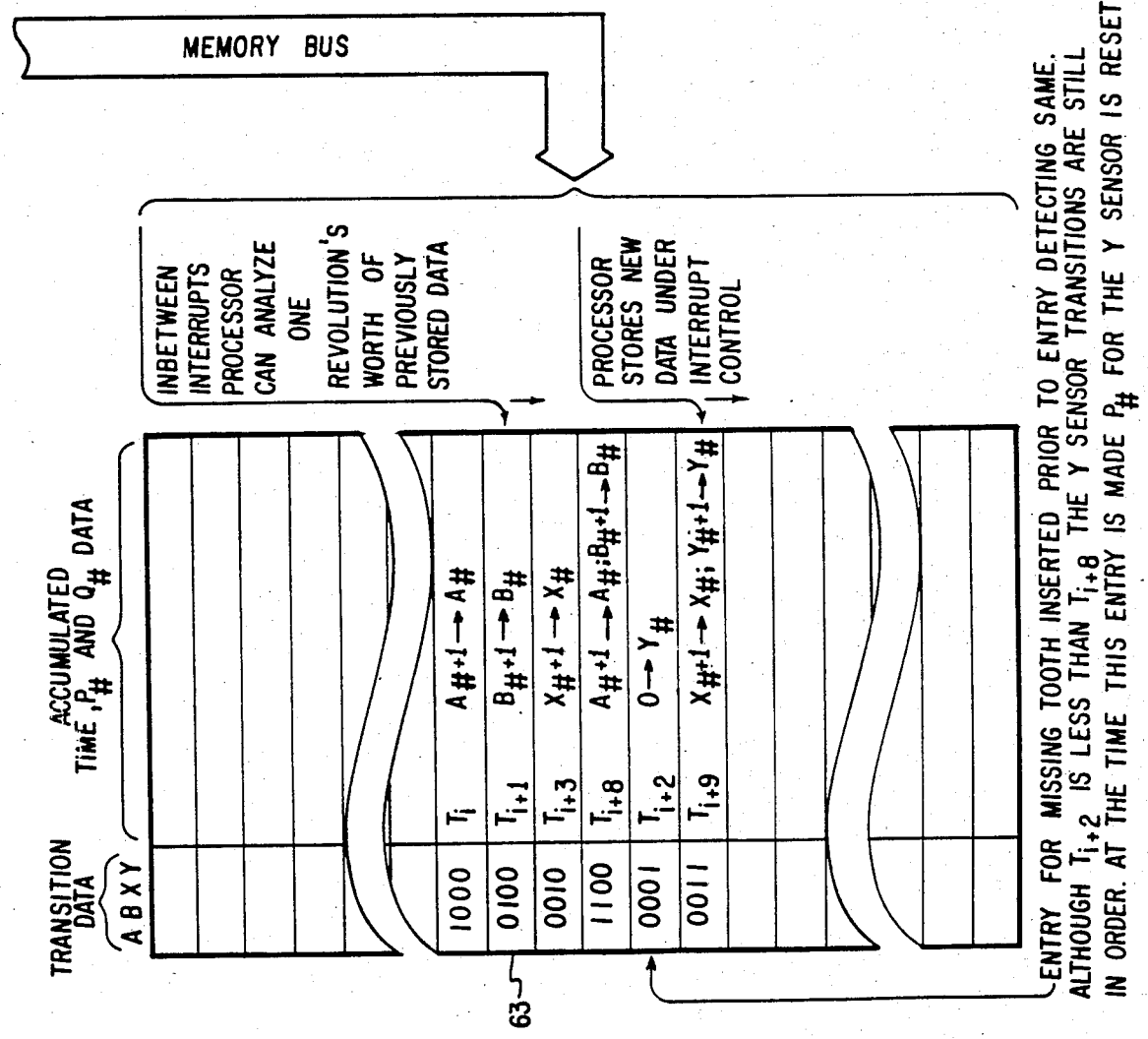

FIGS. 3A-C are a simplified block diagram of an angle transducer incorporating the features just described. Where applicable, the reference numerals in FIG. 3 for certain of the elements are the same as those for the corresponding elements of FIGS. 1 and 2, even though their physical appearance may be somewhat different.

Referring now to FIG. 3A, a reference rotor 5 and an input rotor 6 are mounted for rotation upon a shaft whose axis 22 corresponds to the axis of the rotor shaft 4 of FIG. 2. For simplicity and ease of illustration the more complex rotor mounting and drive scheme of FIG. 2 has been replaced with the one shown here. Not shown are the motor that would drive the shaft whose axis is 22, nor the bearings that would support the shaft. The structure depicted in FIG. 3 would certainly work, however, and if it were used the rotor shaft would be of a non-magnetic material, e.g., brass.

The number of poles on the input rotor 6 is some integer Q, while the number of poles on the reference rotor 5 is another integer P. In an actual embodiment Q is one hundred and twenty, while P is one hundred and forty-four. However, for convenience in illustration the numbers of poles on the rotors 5 and 6 have been drastically reduced. Among other things, this allows the clear depiction of missing poles 20 and 21. When, as in the case of the preferred embodiment described herein, the once-per-revolution index marks are denoted by missing poles (e.g., a gear with a tooth removed) we will still refer to P-many poles and Q-many poles. What is meant, of course, is that there are P-1 and Q-1 "actual poles" and two "virtual poles", the latter being independently recognizable by their absences. In other words, we are saying that each missing pole counts as a pole. It doesn't need to be this way, and one could as easily characterize the structure as Q=119 and P=143, and not construe the missing poles as poles at all. They would be thought of as entirely separate once-per-revolution index marks that just happened to fall between two poles. In light of the explanation to follow it will become clear that these two approaches are, in the final analysis, two equivalent ways of looking at the same thing.

Reference magnetic sensors 8 and 9 are diametrically disposed about reference rotor 5. Each sensor includes a magnet (23/24), a permeable pole piece (25/26), and a sense winding (27/28). The reference magnetic sensors 8 and 9 are part of the reference stator assembly 2, and are in a fixed position that does not move.

The input magnetic sensors 10 and 11 are of the same construction, and are diametrically disposed about the input rotor 6. These input magnetic sensors are part of the input stator assembly 3, and move as a unit according to the direction and magnitude of the input angle.

Each of independent sensors 8-11 separately contributes its data without its output being algebraically added to the output of another sensor. In keeping with this, each of independent sensors 8-11 are individually coupled to a respective one of amplifiers 29-32. The outputs of the amplifiers are individually coupled to a respective one of zero crossing detectors 33-36.

For convenience in later explanation, the data associated with the magnetic sensors 10 and 11 of the input stator 3 are respectively labelled A and B, while the signals associated with the magnetic sensors 8 and 9 of the reference stator 2 are respectively labelled X and Y. A, B, X and Y refer generally to the information content of an associated signal path, and not the specific electrical form of the signal at any particular point along that path.

With reference to FIG. 3B, each of signals A, B, X and Y is fed to a corresponding one of respective delay circuits 37-40. The exact manner of implementing the delay circuits 37-40 is not important; they can be implemented in a variety of ways provided certain general criteria are met. These are first, that the delay be long enough to allow a subsequent circuit to determine, by comparing the delayed and undelayed signals, if a transition has occurred in that signal. Second, the delay should be less than one-half of period of the signal being delayed, so that each transition is reliably detected. And third, if the timing of the transitions is to be quantized according to a certain clock frequency, then the delay ought to be no more than half the period of that clock frequency. The third criterion ensures that two consecutively quantized transitions are separated by a nominal state to prevent their merging into a single indication. In terms of the explanation to follow, this means that even two consecutive transitions will produce separate excursions in a signal called EVENT. AJthough other ways of implementing such a delay are possible and may suggest themselves, the way shown in FIG. 3B meets the above criteria w1th simplicity and convenience. One of the four identical delay circuits 37-40 will be explained, and will serve to represent the remaining three.

Delay circuit 37 includes two D-type latches 41 and 42. The D input of latch 41 is connected to the output of its associated zero crossing detector 36. Complimentary clock signals CLK 43 and $\overline{CLK}$ 44 generated by clock signal circuitry 45 quantize sensor signal A. Upon the rising edge of the signal CLK 43 the existing value of signal A at the D input is latched and appears at the Q output of latch 41. This Q output is coupled to the D input of latch 42, which is in turn clocked by the signal $\overline{CLK}$ 44. Upon the rising edge of $\overline{CLK}$, one-half period of CLK later, the value latched into latch 41 is latched into latch 42, and appears at its Q output. One-half period of CLK later still, another and possibly different quantized sample of A is latched into latch 41. A transition in the signal A will appear as a difference in value between the two Q outputs of duration equal to one-half period of the signal CLK 43.

Associated with each of delay circuits 37-40 is a respective one of exclusive OR gates 46-49. In the case of signal A, for example, XOR gate 46 is connected to the two Q outputs of delay circuit 37. Each time there is a transition in signal A XOR gate 46 detects the one-half period during which the latest quantized value $A_n$ does not equal the previous quantized value $A_{n-1}$. Detection of such a difference results in a corresponding signal $\Delta A$. Other signals $\Delta X$, $\Delta Y$, and $\Delta B$ are respectively generated by XOR gates 47-49.

An OR gate 50 is coupled to each of the signals $\Delta X-\Delta A$ and produces an output signal EVENT 51 that represents the occurrence of a transition in either direction upon any of signals A, B, X and Y. The pulse width of EVENT 51 is one-half the period of CLK 43.

The data for the table of transition directions and times spoken of above is gathered by the circuitry to be described next. The clock circuitry 45 mentioned earlier has a frequency of 500 KHz. The 500 KHz signal CLK 43 is also coupled to a 12-bit counter 52 that provides ongoing time information. The choices of 500 KHz and twelve bits are to some extent arbitrary; convenience, cost and performance combine to suggest those choices. Different frequencies and other numbers of bits are certainly possible.

Each time the signal EVENT 51 occurs the leading edge causes the time and state data to be stored in one of several temporary latches; a counter indicates which. The trailing edge of EVENT causes that counter to increment. More specifically, the trailing edge of EVENT increments a NEW DATA COUNTER 53. Counter 53 counts, in the present example, zero, one, two, three, zero . . . The count N in the NEW DATA COUNTER 53 is applied to DECODER/MULTIPLEXER circuit 54 that selects the next (in the sequence of counts for N) one of four temporary latches 55-58 as the temporary destination of the time and state data. The state data are the $X_{n-1}$ through $A_{n-1}$ signals from the delay circuits 37-40. These four bits of information represent the previous values of each of the signals A, B, X and Y just prior to the latest transition, and are latched upon the rising edge of EVENT. They identify, when compared to their previously captured and stored predecessors, the nature of the next-to-latest transition. The nature of the latest transition that is the occasion for the current presence of EVENT will become clear upon the next occurrence of EVENT, and so on.

Each time EVENT occurs and the next of latches 55-58 is selected the state data for $X_{n-1}$ through $A_{n-1}$ is stored in that selected latch, along with the current associated count in the counter 52.

The incremented count N in the NEW DATA COUNTER 53 is now unequal to a corresponding count I in an INTERRUPT CATCH-UP COUNTER 59 that also counts zero, one, two, three, zero . . . This causes a comparator circuit 60 coupled to the N and I outputs of counters 53 and 59 to produce a signal $N\neq I$ that signifies the inequality between the two counters 53 and 59. The signal $N\neq I$ is applied to an INTERRUPT REQUEST input of a microprocessor 61. That informs the microprocessor that there is additional data to be added to the table. In due course the microprocessor 61 invokes an interrupt service routine (ISR) to retrieve that new data from the temporary latches and enter it into the table. Although the details may vary according to the particular microprocessor employed, the general description of what is to be done is this. The ISR causes the INTERRUPT CATCH-UP COUNTER 59 to increment. The incremented count I is applied to a DECODER/MULTIPLEXER circuit 62 which in turn selects the next (in the sequence of counts for I) of temporary latches 55-58 as the latch from which state and time data will be sent to the microprocessor 61.

In this way, interrupt requests are generated as new data is accumulated. State and time information are saved by the latches until the microprocessor can get the data stored in the memory, as long as the microprocessor never gets more than four transitions behind. This scheme allows any or all of the signals A, B, X and Y to change at each transition, and allows the capture of consecutive quantized transitions.

FIG. 3C illustrates with a simplified table what the microprocessor 61 does to store the state and time data. First, under interrupt control the microprocessor builds a table of state transitions and associated times in a random access memory 63. Although the actual level of complexity exceeds what can readily be shown in FIG. 3C, and although certain particulars may differ among various embodiments, the figure adequately suggests the general idea. The state data is examined to determine the nature of the transition(s), and some symbolic representative of this is prepared and stored. An associated time is also stored. In the preferred embodiment described herein the microprocessor converts the twelve bits of 500 KHz time information (4096 counts at 2 usec per count, or 8.192 msec per full counter) to points on an absolute time scale beginning at some $T_0$ whose location is of no particular interest, although it may be convenient if this were made to coincide with the start of a measurement. (That implies waiting for another revolution's worth of data upon receipt of MEASUREMENT REQUEST, rather than simply using data already in the memory upon such receipt. Both approaches work equally well.) To this end, the counter 52 is simply allowed to run and "roll-over" as needed. The firmware detects the sudden drops in value indicative of the roll-over's, and adds back the needed 4096 counts to produce a corrected count. The corrected count is then added to the previous value obtained on the absolute time scale being constructed. This in turn becomes the new value, and the process continues. This works since at three revolutions per second and one hundred twenty teeth per revolution there are at most (neglecting input stator rotation in the direction of rotor rotation and assymetries in gear tooth shape, as well as the presence of the other gear) 2.778 msec between consecutive positive transitions. The starting and restarting of the absolute time scale is a matter of convenience in implementation.

The microprocessor continuously adds new positive transition data to the table. Data concerning negative transitions are simply ignored. The table is circular in nature, so that as older portions that contain data more than one revolution old are used to store new data. The microprocessor watches for the missing teeth, and employs some device to either flag them for easy location later, or preferably, restarts a firmware pole counter associated with that rotor upon occurrence of the missing tooth. In the explanation that follows below those counters are called $P_\#$ (for the reference rotor) and $Q_\#$ (for the input rotor). The notations $P_\#$ and $Q_\#$ imply that there is only one pole counter per rotor. Depending upon the implementation, it could be that way, or preferably, there could be a pole counter per sensor. This topic is discussed later.

The missing tooth is detected by its abnormally long period. A simple and satisfactory way to put in the missing transition is to place it where it ought to be; e.g., place its positive transition half-way between the adjacent positive transitions. More elaborate schemes, such as averaging, are also possible.

When the using system requires an angle measurement, it generates a signal MEASUREMENT REQUEST, which also causes an interrupt for the microprocessor. This prompts the microprocessor to begin processing the data in the table, beginning with the earliest entry; this continues for the data of one full previous revolution of the rotors. The needed full revolution is detected by counting transitions stored in the table. Once the calculations for the measurement are complete an answer is placed in memory and a signal MEASUREMENT COMPLETE sent to the using system. Alternatively, it may be desirable to gather a new revolution's worth of data subsequent to the occurrence of MEASUREMENT REQUEST, and process that data to obtain the angle. The choice between using the data for the revolution completed just ahead of or just after MEASUREMENT COMPLETE is a matter of implementation.

It may also be desirable to arrange that the previous one-half revolution's worth of data is kept upon receipt of MEASUREMENT REQUEST and combined with the subsequent one-half revolution's worth of data to produce the answer. It can be shown that if the input angle is changing at a constant rate below a certain maximum the effects of the motion will cancel. The answer will be an essentially accurate answer representing the value of the input angle at about the time MEASUREMENT REQUEST was issued.

Various alternate but equivalent ways of structuring the state and time data in the table will become apparent as the description of how that data is used proceeds.

Phase Measurement Technique

FIGS. 4-9C are idealized schematic representations of an input and a reference rotor together with associated single input and reference sensors. These figures are useful in explaining how a single phase measurement AX, AY, BX or BY is made.

It will be appreciated that the structure of FIGS. 4-9C is not restricted to magnetically permeable poles rotating past magnetic sensors. The phase measurement technique to be described is usable in determining the phase between any two "signatures" recurring at the same periodic rate, provided only that there are known numbers of "events" that occupy unchanging positions within each signature. The technique is also insensitive to any lack of uniform spacing between the events within a signature.

That is, although the rotors might be slotted discs or other optically encoded apparatus cooperating with optical sensors, or capacitors whose value change periodically as a function of displacement, or as in the present example, gears with magnetic sensors, the phase of the signals so produced is readily measurable by the technique. The number of variations in the signals produced per revolution (or per unit of time) need not be the same for each rotor, nor do the individual cycles of a signal from a rotor need have a constant period. In particular, for the example under consideration of gears in an angle transducer, the phase measurement technique to be described is, in principle and in practice, insensitive to gear tooth placement errors.

Figure 4:
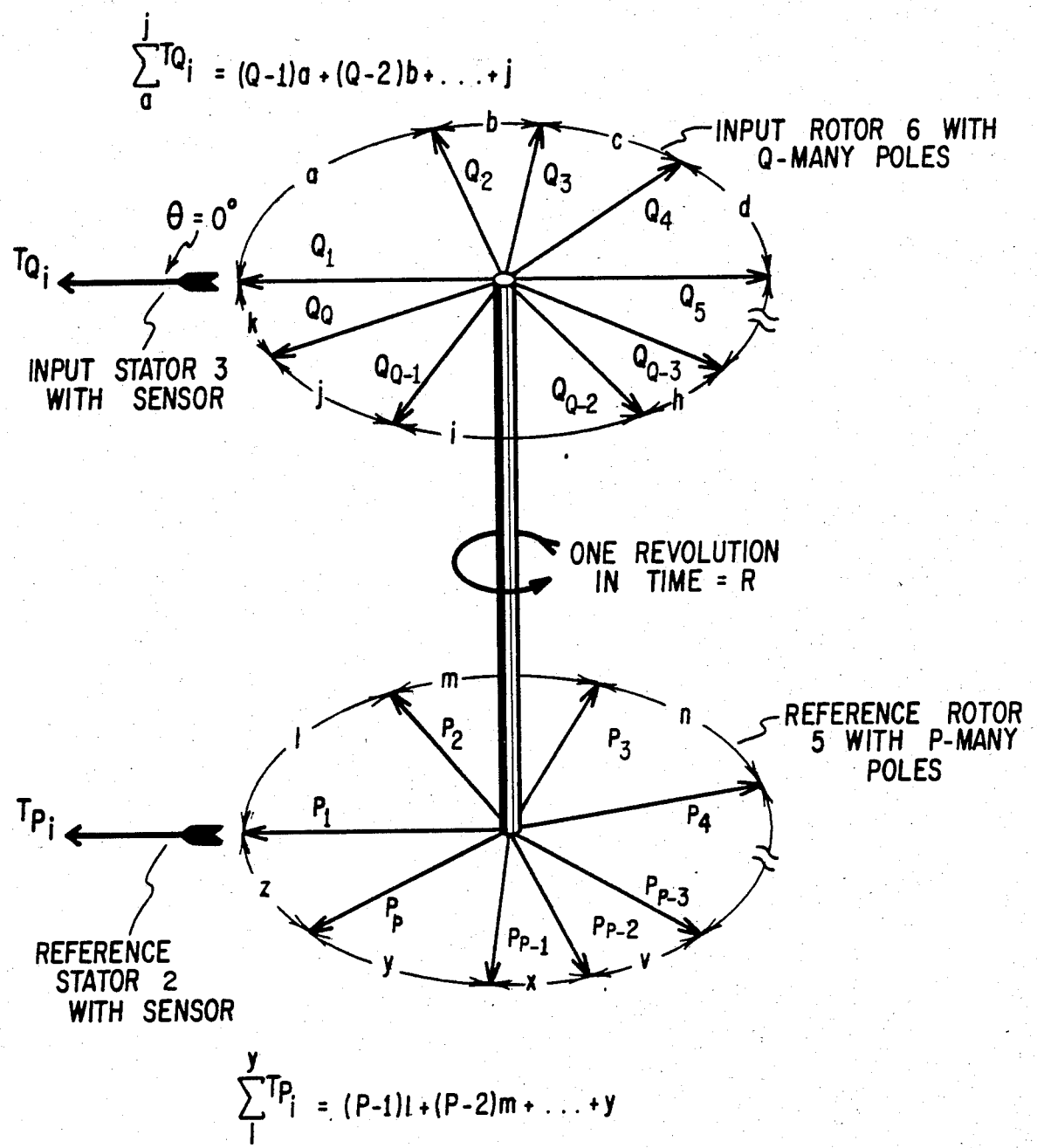
FIGS. 4-8 are idealized diagrams of rotating poles and associated sensors that illustrate various aspects of a method for measuring the phase between two signals.

Referring now to FIG. 4, the reference rotor 5 and input rotor 6 are depicted in schematic form. Associated with each rotor is a single individual sensor; the diametrically opposed second sensors have been omitted for the sake of clarity in describing this aspect of the invention. The second sensors produce signals whose phases are simultaneously measured in the same general manner about to be described for the individual single sensors shown. They are measured during the same revolution, but have their own values of $P_\#$ and $Q_\#$. How the phases are measured for four sensors and then combined to reduce the effects of eccentricity is discussed in a subsequent section; for now, assume that the idealized schematic structure of FIG. 4 has no eccentricity.

If P and Q are the numbers of poles (individual gear teeth) on the reference and input rotors, respectively, and if R is the length of time required for those rotors to complete one revolution, then the angle (in radians)

experienced by the input stator is given by equation (1) below.

$$\theta = 2\pi \left\{ \frac{\frac{\Sigma T_{Q_i}}{Q} - \frac{\Sigma T_{P_i}}{P}}{R} + \frac{P_\#}{P} - \frac{Q_\#}{Q} \right\} - \Psi \qquad (1)$$

In eq. (1) $\Sigma T_{Q_i}$ and $\Sigma T_{P_i}$ are summations of times to consecutive rising edges of the signal from the associated sensor, started at any one of a number of convenient starting times and encompassing exactly one revolution. $\Sigma T_{Q_i}$ is the sum of Q-many consecutive transition times for the input sensor and $\Sigma T_{P_i}$ is the sum of P-many consecutive transition times for the reference sensor. The time R need not be the same for each of consecutive uses of eq. (1), and can be measured at the time each particular measurement of phase is performed. This is easily done, for instance, by comparing two times from the P sensor that are P-many cycles apart, or times from the Q sensor that are Q-many cycles apart. $P_\#$ and $Q_\#$ are where on each rotor the summations began, relative to a fixed point of reference on each. $P_\#$ ranges from zero to P-1, and $Q_\#$ from zero to Q-1. The point of reference on each rotor may conveniently be its missing pole. The term $\Psi$ is some constant that is determined by the shapes of the particular rotors, their specific inaccuracies as to pole placement, etc., and need be found only once per signal pair for any particular individual transducer; it is not a function of $\theta$. If the phase measurement technique of eq. (1) were used to provide sequential angular displacements from an initial setting identified as such, then $\Psi$ would not even need to be known, as the answers are found by subtraction of the initial result from the corresponding sequential results, and the $\Psi$'s would cancel, leaving only the differences between various values of $\theta$ as the result.

Here are the rules for forming the summations and determining the values of $P_\#$ and $Q_\#$. A request to measure the input angle can occur at any time relative to the rotation of the rotors. The summations may begin on any rising edge derived from the reference rotor 5, for example, the first one subsequent to the measurement request. (All measurements could be performed using falling edges instead.) Whether or not to start on the estimated location of the missing pole is a matter of implementation; the designer may choose what is best in a particular system.

Beginning with whichever pole on the reference rotor 5 is currently the starting pole (some $P_{ith}$ pole of P-many poles), and relative to some $T_0 = 0$, a total of P many times for P-many consecutive transitions are added together. Referring briefly to FIG. 4, if $P_1$ were the starting pole and if the time at which $P_1$ passed the sensor were zero (a temporarily convenient assumption) then the desired sum of the $T_{P_i}$ would be the same as the sum of the time intervals shown in eq's (2) and (3) below:

$$\sum_{1}^{y} T_{P_i} = (l) + (l + m) + \qquad (2)$$

$$(l + m + n) + \ldots + (l + m + \ldots + y)$$

Before proceeding with the discussion a note is in order concerning our use of the sigma notation. It is somewhat unconventional in that, for eq. (2) for instance, the limits 1 and y are not values of subscripts appearing in the $T_{P_i}$. What is meant, of course, is that a corresponding P-many values of i mod P are to be taken, beginning with the particular value needed to define the intervals 1 through y. These equations and the ones to follow could, of course, be expressed with a completely conventional notation. It is felt, however, that to do so would only add to the amount of symbolism without a corresponding increase in actual information content. Properly understood, the liberties taken here with the sigma notation result in an unambiguous but relatively compact and descriptive notation that lends itself nicely to the task at hand. This is especially the case once the notions of $\Delta_\theta$ and $\Delta_{\phi J,K}$ are introduced. These constructs involve arbitrary-size segments of the intervals, and while they are involved in the sums they are not always satisfactorily represented by a value of i mod P.

$$\sum_{1}^{y} T_{P_i} = (P-1)l + (P-2)m + (P-3)n + \ldots + y \qquad (3)$$

The assumption in eq's (2) and (3) that the summation "starts at time equal to zero" can be made without loss of generality, and is a convenience that simplifies the equations in the demonstration to follow.

Equation (1) does not require such an initial "time equals zero" because a nonzero starting time is self-cancelling. Exactly how this occurs will be pointed out toward the end of the demonstration.

In FIG. 4 and equations (2) and (3) the symbols l, m, n, ... y, z represent the incremental times (intervals) between the poles of the reference rotor 5. Assuming a constant speed of rotation the times l, m, ... z would be equal if and only if there were no errors in the angular placement of the poles upon the rotor. It is emphasized that neither the reference rotor nor the input rotor need have their poles placed with any particular accuracy to permit high accuracy phase measurements. In principle, the l, m, n, ... z of the reference rotor, as well as the corresponding a, b, c, ... k of the input rotor, can each be a different interval reflecting arbitrary placement of the poles upon the rotors. In practice, the l, m, n, ... z will tend to be equal, as will the a, b, c, ... k. And there are good reasons for wanting that: such regularity allows reliable detection of the missing poles, prevents undue transients at the sensors, and assists in the suppression of crosstalk. But otherwise, lack of such equality does not in principle degrade the accuracy of the phase measurement. Throughout the proofs to follow, l, m, n, ... z and a, b, c, ... k are treated as individual numbers, and it is never assumed that they represent equally spaced poles.

The summation of the times for the input rotor 6 is begun at exactly the same time as that for the reference rotor 5. In general that starting time will not occur in coincidence with a transition derived from the input rotor 6, although that is a function of pole placement and input angle, and could occur. Either way, the same general rule is used. Beginning with the starting time the times of the next Q-many poles of the input rotor 6 are summed. Referring again to FIG. 4, similar to the reference rotor 5 the incremental times between the poles of the input rotor 6 are denoted a, b, c, ... k. Typically, the first term in the summation is some fractional portion of one of the a, b, c, ... k. What that fraction is depends, in part, upon the input angle through which the input stator 3 has been revolved, and in subsequent discussions that fractional portion will be called either $\Delta_\theta$ or $\Delta_\phi$, depending how it is to be used.

If, for example, the sensor on the input stator 3 were $\Delta_\theta$ ahead of the pole $Q_1$ when the summations were begun (refer to FIG. 5), then the summation for the input rotor 6 would be:

$$\sum_{\Delta_\theta}^{j} T_{Q_i} = (\Delta_\theta) + (\Delta_\theta + a) + (\Delta_\theta + a + b) + \ldots + \quad (4)$$

$$(\Delta_\theta + a + b + \ldots + j)$$

$$= Q\Delta_\theta + (Q-1)a + (Q-2)b + \ldots + j \quad (5)$$

It will be observed that in each of the summations a respective one of the a, b, c, ..., y, z and one of the l, m, n, ... j, k do not appear. That is:

$$\sum_{l}^{y} T_{P_i} \text{ does not contain } z;$$

$$\sum_{m}^{z} T_{P_i} \text{ does not contain } l;$$

$$\sum_{n}^{l} T_{P_i} \text{ does not contain } m; \text{ and}$$

$$\sum_{\Delta_\theta}^{j} T_{Q_i} \text{ does not contain } k, \text{ etc.}$$

At first glance it might appear that this amounts to failure to obtain closure, and that useful information is being discarded. However, the time associated with each pole is being used; on the reference rotor the time of one pole is (temporarily) being taken as a reference for each remaining pole on that rotor, as well as to all of the poles on the input rotor. To add in the "missing" times would entail a "double use" of two poles. Furthermore, the rules given have the desirable property visible in eq. (5): the coefficient of the $\Delta_\theta$ term is exactly Q, not $Q+1$ or $Q-1$. Why this is useful will become apparent as the demonstration proceeds.

Finally, the terms (in eq. (1)) $P_\#$ and $Q_\#$ are determined by noticing, at the time the summations are begun, how many poles on each rotor have passed since the passage of an absolute reference pole on that rotor. The absolute reference pole may conveniently be the missing pole or tooth. For example, if $P_1$ and $Q_1$ were the respective absolute reference poles for the reference and input rotors, then $P_\#$ is zero if $P_1$ is the starting pole, one if $P_2$ is the starting pole, and two if $P_3$ is the starting pole, etc. In similar fashion, $Q_\#$ is zero if $Q_1$ is the first Q-pole subsequent to the starting P-pole, one if $Q_2$ is first, and two if $Q_3$ is first, etc. The values of $P_\#$ and $Q_\#$ for any particular measurement are easily determined by the microprocessor 61 by inspection of the transition and time data stored in the memory.

Returning now to FIG. 4, we shall show by an analysis of a series of possible cases beginning with the one shown in FIG. 4, that eq.(1) produces the desired result.

FIG. 4 shows in schematic form a reference rotor 5 of P-many poles and an input rotor 6 of Q-many poles. The two rotors are mounted for revolution upon a common shaft. The P-many poles of the reference rotor 5 are $P_1$, $P_2$, $P_3$, ... $P_p$, and are separated by angular displacements that produce, when revolved past a sensor at a constant angular velocity equal to one revolution in time R, the incremental times of passage l, m, n, ... z. The Q-many poles of the input rotor are $Q_1$, $Q_2$, $Q_3$, ... $Q_Q$. Their associated incremental times are a, b, c, ... k.

FIG. 4 may be taken to represent an input angle of zero degrees, although the way FIG. 4 has been drawn reflects some simplifying assumptions. These are that the sensor on the input stator 3 is directly above the sensor on the reference stator 2 when the input stator 3 is at zero degrees, and that under these conditions $P_1$ and $Q_1$ pass their associated sensor simultaneously (i.e., $T_{P_1} = T_{Q_1}$). These assumptions are justified as follows. By the time the demonstration is complete, it will be clear that if these assumptions did not hold all that would happen is the introduction of some constant offset in the answer, based on what assumptions did hold. But as will be shown, there is some constant offset in the answer, anyway. Exactly what the offset is does not matter, and it simplifies the explanation to not have to break the offset into two parts. In actual practice, no attention need be paid to whether or not the sensors are directly above each other at zero degrees, or to whether $T_{P_1}$ equals $T_{Q_1}$ at "zero degrees."

Making those assumptions, however, consider the difference shown below in (eq's (6b-7)) obtainable following the request for a measurement occurring just barely ahead of $T_{P_1}$.

But before turning to those equations a note may be in order explaining where eq. (6b) comes from. To begin with, we are not asserting that eq. (6b) has been derived from anything that precedes it, although it is clearly an equality. That is, the right-hand side of eq. (6b) is obtained from the left-hand side by application of eq. (3) and a corresponding equation (not shown) for the $\Sigma T_{Q_i}$. So eq. (6b) is demonstratably an equality, but it is still fair to ask from whence came the left-hand member of eq. (6b). The answer is that it is a convenient and useful quantity to consider. Other than that it doesn't come from anywhere. It was suggested by experience, and serves as a convenient place to begin an inquiry into the present phase measurement technique. In a sense, we are simply asking, "Suppose we formed this difference, [i.e., the left-hand member of eq. (66)] then what?" Well, for one thing the resulting equation can be rearranged to produce an equation for $\theta$. Finally, note that the difference of interest is related by a factor of Q to a quantity appearing in eq. (1):

$$\sum_{a}^{j} T_{Q_i} - \frac{Q}{P} \sum_{l}^{y} T_{P_i} = Q \left( \frac{\sum_{a}^{j} T_{Q_i}}{Q} - \frac{\sum_{l}^{y} T_{P_i}}{P} \right). \quad (6a)$$

The quantity in the braces on the right-hand side of eq. (6a) may be thought of as the resulting difference in time when the average time of occurrence of a pole on the input rotor 6 is diminished by the average time of occurrence of a pole on the reference rotor 5. Later on, we shall have a good deal to say about such average times of occurrence and their difference. For the moment, however, we must return to what can be gained from an investigation of eq. (6b).

$$\sum_{a}^{j} T_{Q_i} - \frac{Q}{P} \sum_{l}^{y} T_{P_i} = (Q-1)a + \quad (6b)$$

$$(Q-2)b + \ldots + j - \frac{Q}{P}[(P-1)l + (P-2)m + \ldots + y]$$

$$= \psi \quad (7)$$

Upon reflection it will be appreciated that, in the absence of any constraint that the poles be equally spaced, $\Psi$ is just some constant that depends upon the particular rotors (assuming a given time of rotation, R). The value of $\Psi$ is conservatively bounded between $-QR$ at one end and $+QR$ at the other, but its particular value cannot be predicted. In general, each phase measurement of the signal pairs AX, AY, BX and BY has its own individual value of $\Psi$. Nevertheless, $\Psi$ is useful, and we will have occasion to refer to it again. Note that $P_\#$ and $Q_\#$ each equal zero in this example.

Figure 5:
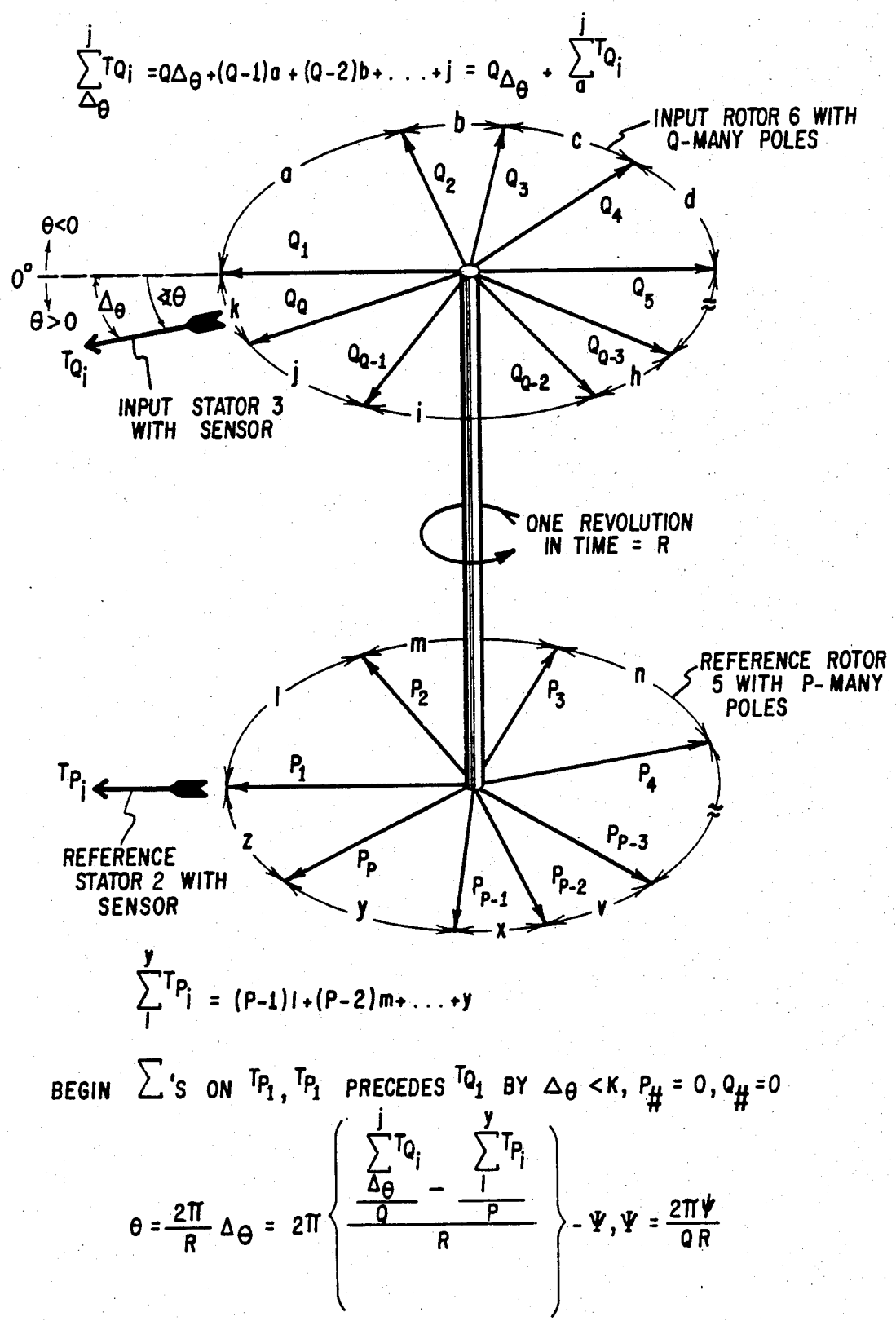

Referring now to FIG. 5, the situation of FIG. 4 is modified by revolving the input stator 3 through a small positive angle $\theta$. As in FIG. 4, the summations will commence on $T_{P1}$. The angle $\theta$ is assumed to be small enough that $T_{Q1}$ is the first subsequent transition at the input stator and not $T_{QQ}$ or any of those transitions preceding $T_{QQ}$.

Suppose we form the same difference between the measured summations as in eq. (6b).

$$\sum_{\Delta\theta}^{j} T_{Qi} - \frac{Q}{P} \sum_{l}^{y} T_{Pi} = Q\Delta\theta + (Q-1)a + \quad (8)$$

$$(Q-2)b + \ldots + j - \frac{Q}{P} \sum_{l}^{y} T_{Pi}$$

$$= Q\Delta\theta + \sum_{a}^{j} T_{Qi} - \frac{Q}{P} \sum_{l}^{y} T_{Pi} \quad (9)$$

$$= Q\Delta\theta + \psi \quad (10)$$

$$\Delta\theta = \frac{\sum_{\Delta\theta}^{j} T_{Qi}}{Q} - \frac{\sum_{l}^{y} T_{Pi}}{P} - \frac{\psi}{Q} \quad (11)$$

$$\theta = \frac{2\pi}{R} \Delta\theta = 2\pi \left\{ \frac{\frac{\sum_{\Delta\theta}^{j} T_{Qi}}{Q} - \frac{\sum_{l}^{y} T_{Pi}}{P}}{R} \right\} - \frac{2\pi\psi}{QR} \quad (12)$$

Note that the term $2\pi\Psi/QR$ is just another constant related to $\Psi$. Hence we write:

$$\Psi = \frac{2\pi\psi}{QR}, \text{ and} \quad (13)$$

$$\theta = 2\pi \left\{ \frac{\frac{\sum_{\Delta\theta}^{j} T_{Qi}}{Q} - \frac{\sum_{l}^{y} T_{Pi}}{P}}{R} \right\} - \Psi \quad (14)$$

Note that for the example of FIG. 5 $P_\#$ and $Q_\#$ each still equal zero.

Figure 6:
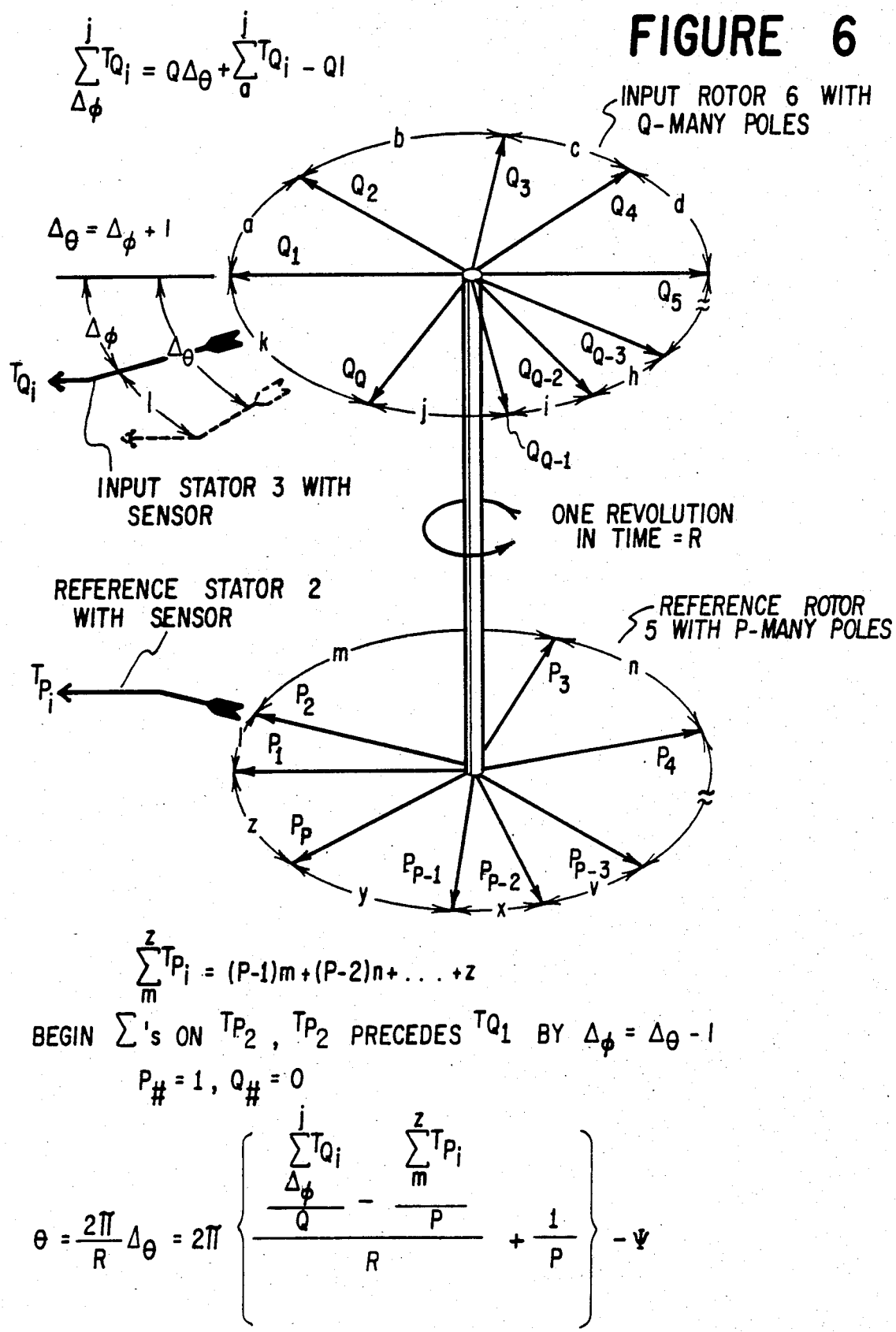

Now consider the situation depicted in FIG. 6, where $P_\#$ equals one while $Q_\#$ remains zero. The central question will be "What is the formula for $\theta$ under these conditions?"

In order for the rotors to produce such a situation it was necessary to reposition poles $P_2$, $Q_Q$ and $Q_{Q-1}$, as well as to increase the size of $\theta$ so it could be subdivided with clarity. None of these changes affects the validity or rigor of the demonstration, as something has to change to cause $P_\#$ to go from zero to one. Such liberties cause no problem with an actual transducer since its poles are fixed and do not move around. And finally, (and in regard to all of FIGS. 4-9C) rather than actually rotate the rotors past their sensors, the sensors are shown displaced about stationary rotors by a corresponding amount in the opposite direction. Not only was that generally easier to draw, but it facilitated "before and after" superpositions, and generally resulted in simpler and easier to follow illustrations.

Returning now to the demonstration and the specific case illustrated by FIG. 6, consider the same difference between the measured summations:

$$\sum_{\Delta\phi}^{j} T_{Qi} - \frac{Q}{P} \sum_{m}^{z} T_{Pi} = \quad (15)$$

$$Q\Delta\phi + (Q-1)a + (Q-2)b + \ldots + j - \frac{Q}{P} \sum_{m}^{z} T_{Pi}$$

Using the substitution $\Delta\phi = \Delta\theta - 1$ shown in FIG. 6, we obtain:

$$= Q(\Delta\theta - 1) + (Q-1)a + (Q-2)b + \ldots + j - \quad (16)$$

$$\frac{Q}{P}[(P-1)m + (P-2)n + \ldots + z]$$

$$= Q\Delta\theta + \sum_{a}^{j} T_{Qi} - \frac{Q}{P}[Pl + (P-1)m + (P-2)n + \ldots + z] \quad (17)$$

$$= Q\Delta\theta + \sum_{a}^{j} T_{Qi} - \quad (18)$$

$$\frac{Q}{P}[l + m + n + \ldots + z + (P-1)l + (P-2)m + \ldots + y]$$

But $l+m+n+\ldots+z$ equals one time of revolution, or R.

$$= Q\Delta\theta - \frac{QR}{P} + \sum_{a}^{j} T_{Qi} - \frac{Q}{P} \sum_{l}^{y} T_{Pi} \quad (19)$$

$$= Q\Delta\theta - \frac{QR}{P} + \psi \quad (20)$$

$$\Delta\theta = \frac{\sum_{\Delta\phi}^{j} T_{Qi}}{Q} - \frac{\sum_{m}^{z} T_{Pi}}{P} + \frac{R}{P} - \frac{\psi}{Q} \quad (21)$$

$$\theta = 2\pi \left\{ \frac{\frac{\sum_{\Delta\phi}^{j} T_{Qi}}{Q} - \frac{\sum_{m}^{z} T_{Pi}}{P}}{R} + \frac{1}{P} \right\} - \Psi \quad (22)$$

Comparison of eq. (22) with eq. (14) reveals that they are not identical; eq. (22) includes a 1/P within the braces that is absent from eq. (14). The difference between the two sets of circumstances is that $P_\#$ equals zero for eq. (14) and equals one for eq. (22). The additional two specific cases examined below will strongly suggest a relationship between $P_\#$, $Q_\#$ and the differences for the resulting equations. A final generalized example will confirm the relationship, and produce eq. (1).

Figure 7:
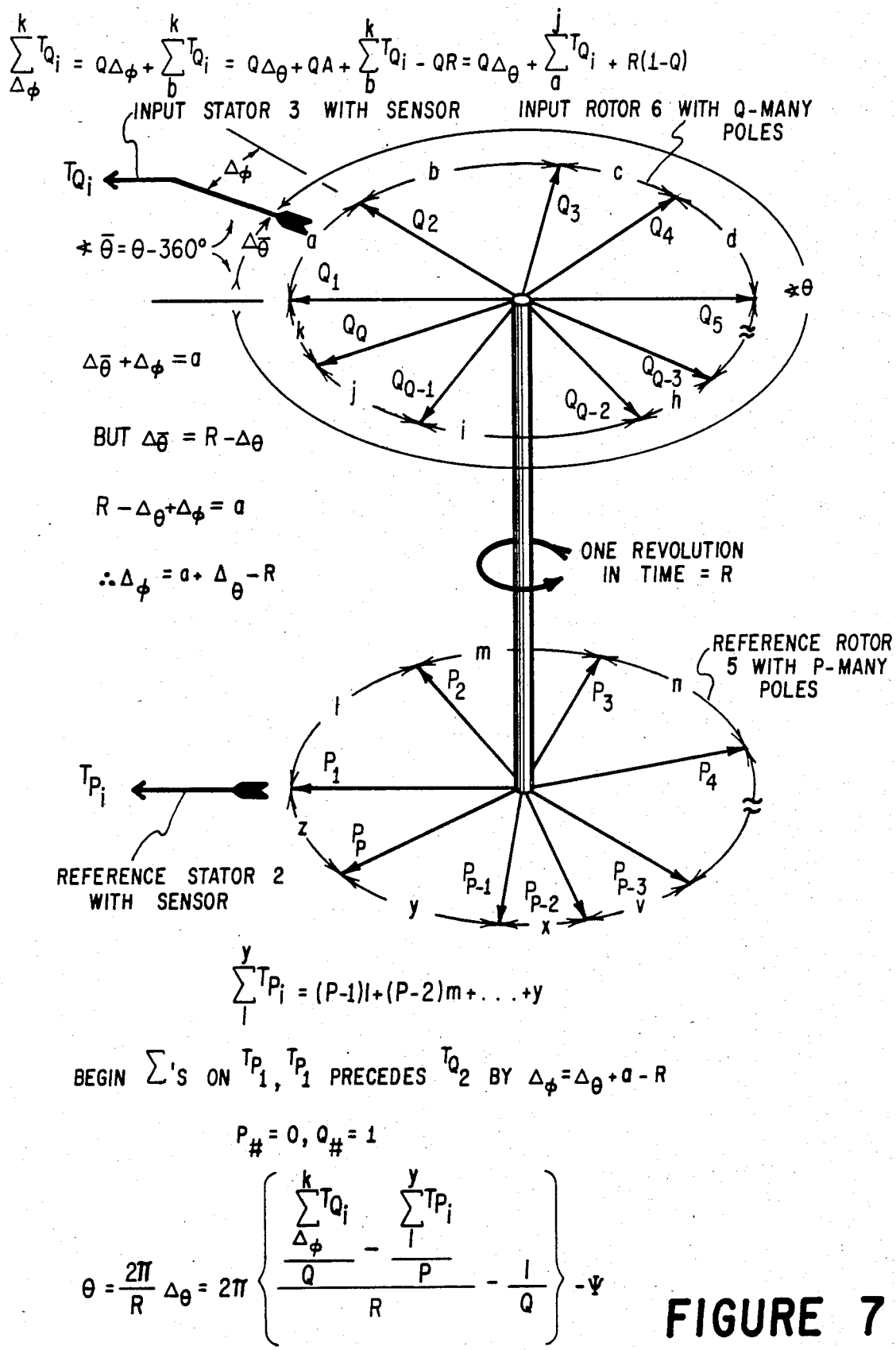

Consider now the situation depicted in FIG. 7. Theta has been made a very large positive value (or, slightly negative) in order to produce a situation where $P_\#$ remains zero while $Q_\#$ equals one. We begin as before, with the same difference between the measured summations.

$$\sum_{\Delta_\phi}^{k} T_{Q_i} - \frac{Q}{P} \sum_{1}^{y} T_{P_i} = \quad (23)$$

$$Q\Delta_\phi + (Q-1)b + (Q-2)c + \ldots + k - \frac{Q}{P} \sum_{1}^{y} T_{P_i}$$

Using the substitution $\Delta_\phi = \Delta_\theta + a - R$ in FIG. 7, we obtain:

$$= Q(\Delta_\theta + a - R) + (Q-1)b + (Q-2)c + \ldots + k - \frac{Q}{P}\sum_1^y T_{P_i} \quad (24)$$

$$= Q\Delta_\theta + Qa + (Q-1)b + (Q-2)c + \ldots + k - \quad (25)$$

$$\frac{Q}{P}\sum_1^y T_{P_i} - QR$$

$$= Q\Delta_\theta + a + b + c + \ldots + \quad (26)$$

$$k + (Q-1)a + (Q-2)b + \ldots + j - \frac{Q}{P}\sum_1^y T_{P_i} - QR$$

But $a+b+c+\ldots+k$ equals one complete time of revolution, or R.

$$= Q\Delta_\theta + R - QR + \sum_a^j T_{Q_i} - \frac{Q}{P}\sum_1^y T_{P_i} \quad (27)$$

$$= Q\Delta_\theta + R(1 - Q) + \psi \quad (28)$$

$$\Delta_\theta = \frac{\sum_{\Delta_\phi}^{k} T_{Q_i}}{Q} - \frac{\sum_1^y T_{P_i}}{P} - \frac{R(1-Q)}{Q} - \frac{\psi}{Q} \quad (29)$$

$$\theta = 2\pi \left\{ \frac{\sum_{\Delta_\phi}^{k} T_{Q_i}}{Q} - \frac{\sum_1^y T_{P_i}}{P} - \frac{1-Q}{Q} \right\} - \psi \quad (30)$$

The right-hand term in the braces of eq. (30) can be reduced to $+1-1/Q$. The plus one, when multiplied by the $2\pi$ outside the braces has the effect of increasing the answer by $2\pi$ radians, or one complete revolution. Since $\theta$ and $\theta + 2\pi$ radians are equivalent answers, we may replace $-(1-Q)/Q$ with simply $-1/Q$.

$$\theta = 2\pi \left\{ \frac{\sum_{\Delta_\phi}^{k} T_{Q_i}}{Q} - \frac{\sum_1^y T_{P_i}}{P} - \frac{1}{Q} \right\} - \psi \quad (31)$$

As in the earlier cases, eq. (31) is not identical with either eq. (14) or eq. (22).

Figure 8:
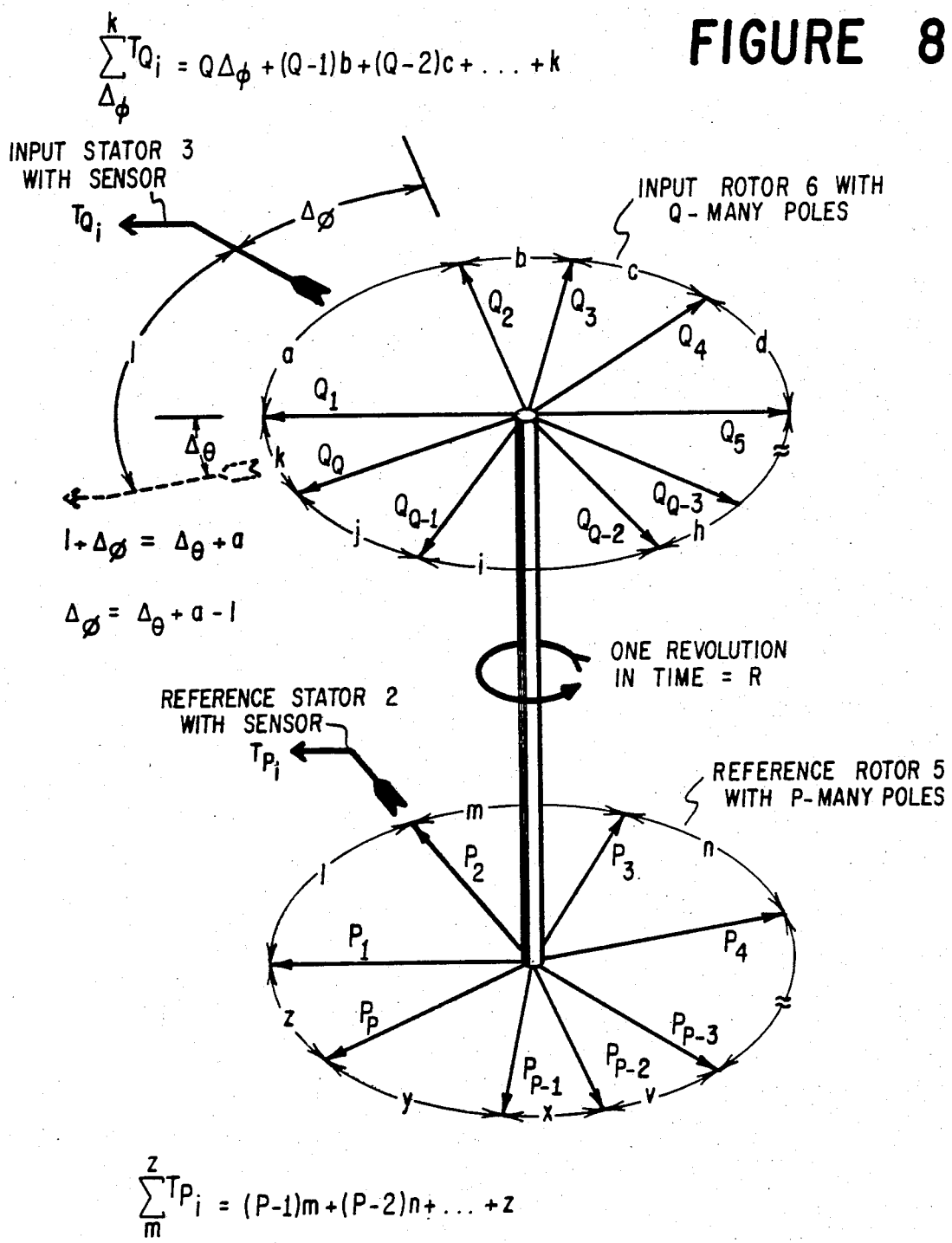

We now come to the case where both $P_\#$ and $Q_\#$ are non-zero. Let us consider what happens when they each equal one. Such a situation is depicted in FIG. 8. We proceed as before. Equation (33) makes the substitution for $\Delta_\phi$ shown in FIG. 8.

$$\sum_{\Delta_\phi}^{k} T_{Q_i} - \frac{Q}{P} \sum_{m}^{z} T_{P_i} = Q\Delta_\phi + (Q-1)b + (Q-2)c + \quad (32)$$

-continued $$\ldots + k - \frac{Q}{P}[(P-1)m + (P-2)n + \ldots + z]$$

$$= Q\Delta_\theta + Qa + (Q-1)b + \ldots + k - \quad (33)$$

$$\frac{Q}{P}[Pl + (P-1)m + \ldots + z]$$

$$= Q\Delta_\theta + R + \sum_a^j T_{Q_i} - \frac{Q}{P}\left[R + \sum_l^y T_{P_i}\right] \quad (34)$$

$$= Q\Delta_\theta + R - \frac{QR}{P} + \psi \quad (35)$$

$$\theta = \frac{2\pi}{R}\Delta_\theta = 2\pi\left\{\frac{\sum_{\Delta_\phi}^{k} T_{Q_i}}{Q} - \frac{\sum_1^y T_{P_i}}{P} + \frac{1}{P} - \frac{1}{Q}\right\} - \psi \quad (36)$$

Now compare equations (14), (22), (31) and (36). If we consider the braces in eq. (14) to include a $+0-0$ after the division by R, we can then list the following different terms and their associated values of $P_\#$ and $Q_\#$:

| | | | |
|---|---|---|---|
| from (14): | $+0-0$ | $P_\# = 0$ | $Q_\# = 0$ |
| from (22): | $+\frac{1}{P} - 0$ | $P_\# = 1$ | $Q_\# = 0$ |
| from (31): | $+0 - \frac{1}{Q}$ | $P_\# = 0$ | $Q_\# = 1$ |
| from (36): | $+\frac{1}{P} - \frac{1}{Q}$ | $P_\# = 1$ | $Q_\# = 1$ |

Inspection of these results suggests that $P_\#/P - Q_\#/Q$ could be used in place of each of those right-hand terms in the braces. A more rigorous demonstration proves that this is indeed the case.

Figure 9A:
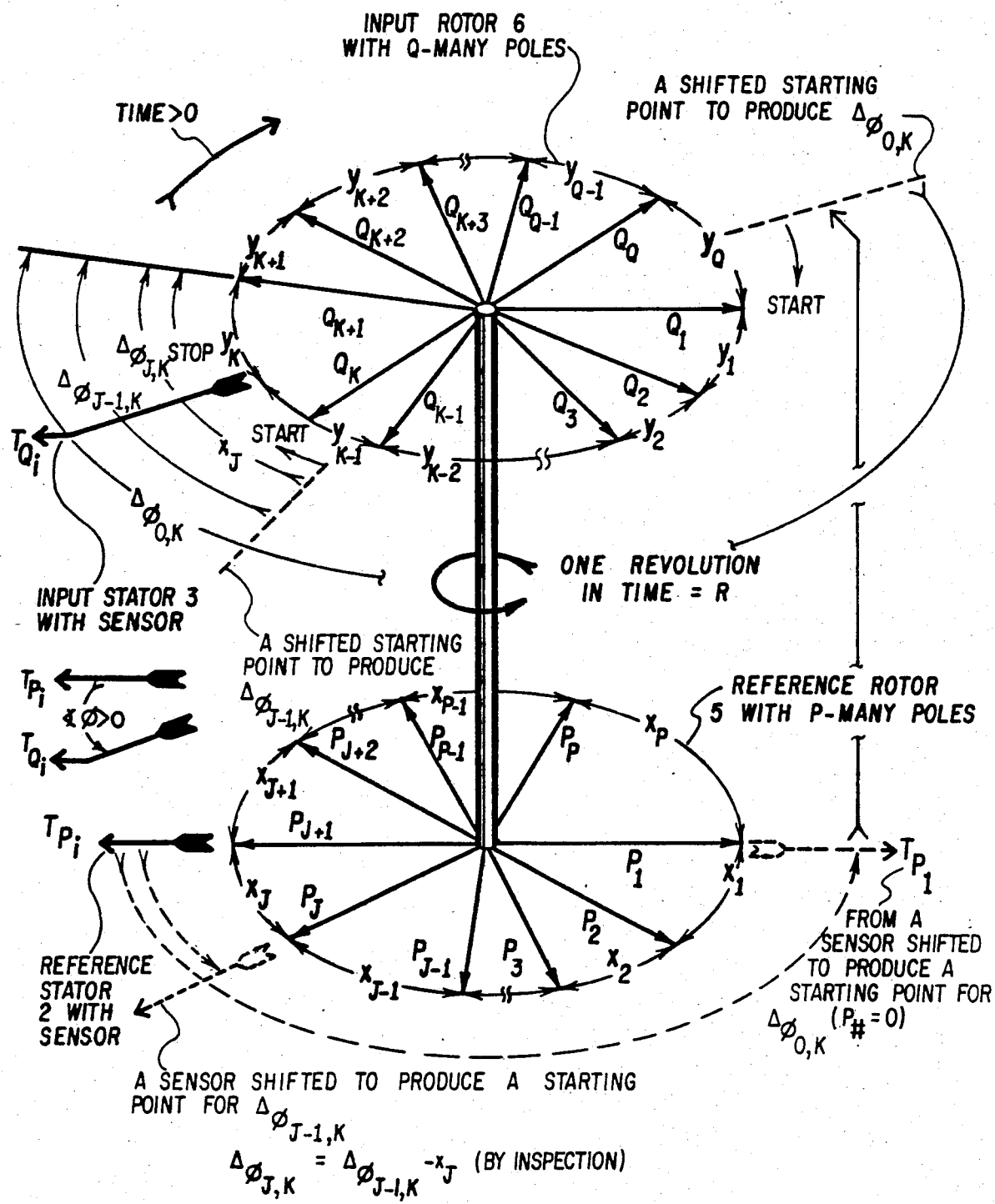
FIGS. 9A-C are diagrams in support of a formal proof of a phase or angle measurement formula suggested by an analysis of FIGS. 4-8.

Suppose that the values of $P_\#$ and $Q_\#$ were each arbitrary non-zero values, respectively less than P and Q. This situation is depicted in FIG. 9A, in conjunction with a small positive input angle $\phi$. The angle $\phi$ is positive since the input stator sensor is shown as rotated beyond the reference stator sensor by an amount ($\phi$) in the direction of rotor rotation. As we shall see, eq. (1) can be understood in light of the notion of average times of occurrence of single equivalent poles. Moving the input stator in the direction of rotor rotation makes the input rotor's single equivalent pole occur later in time, and the subtraction of the reference rotor's single equivalent time produces an increase in the time difference that is both positive and proportional to the input angle through the time of one rotor revolution R. We also assume, for convenience, that at $\phi = 0$ $T_{P1}$ and $T_{Q1}$ are coincident. That is, that $P_1$ and $Q_1$ are in vertical alignment upon the rotors. This makes the explanation easier to follow, but at the conclusion of the demonstration we shall show that eq. (1) does not require such an assumption.

Figure 9B:
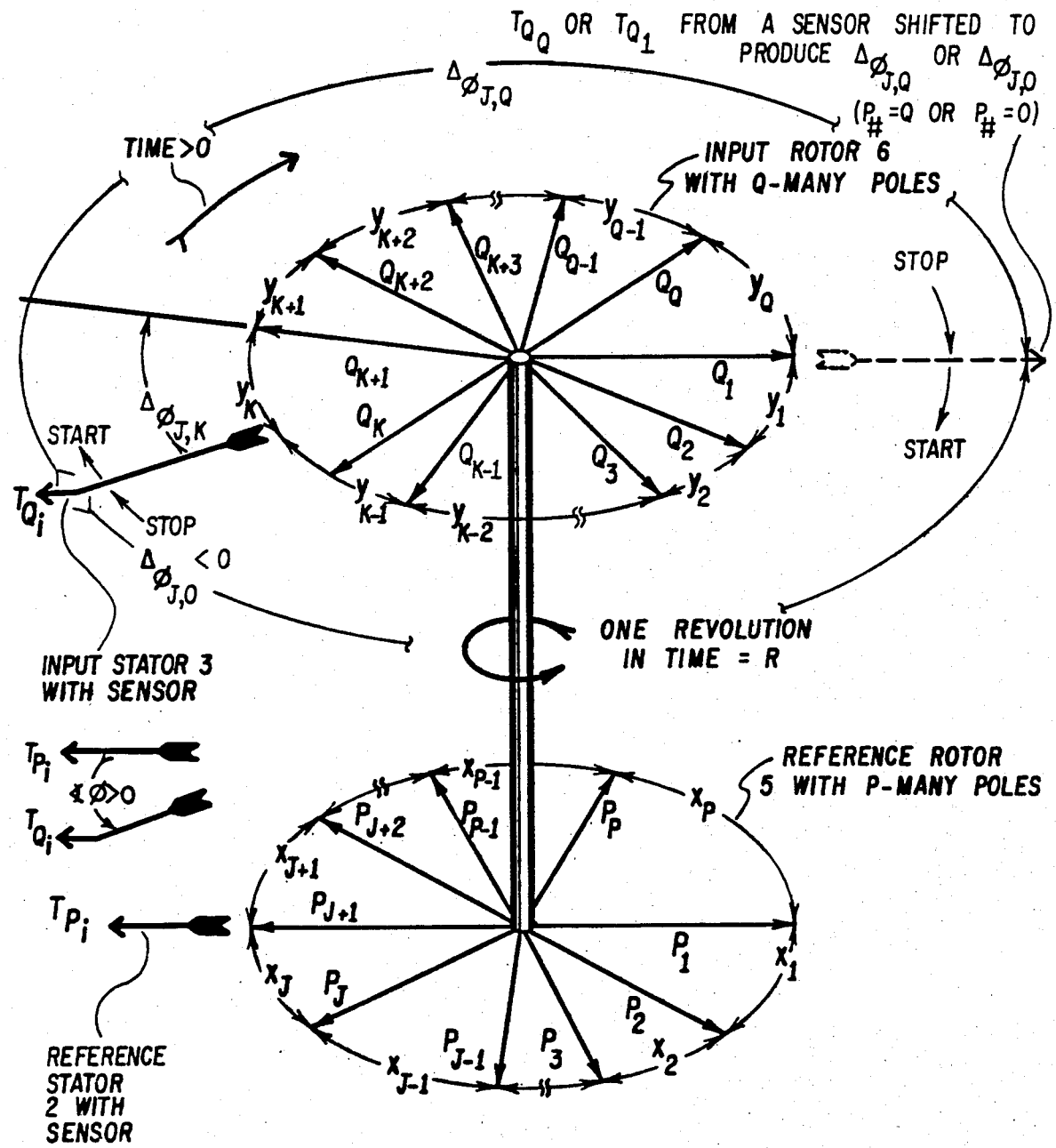
Figure 9C:
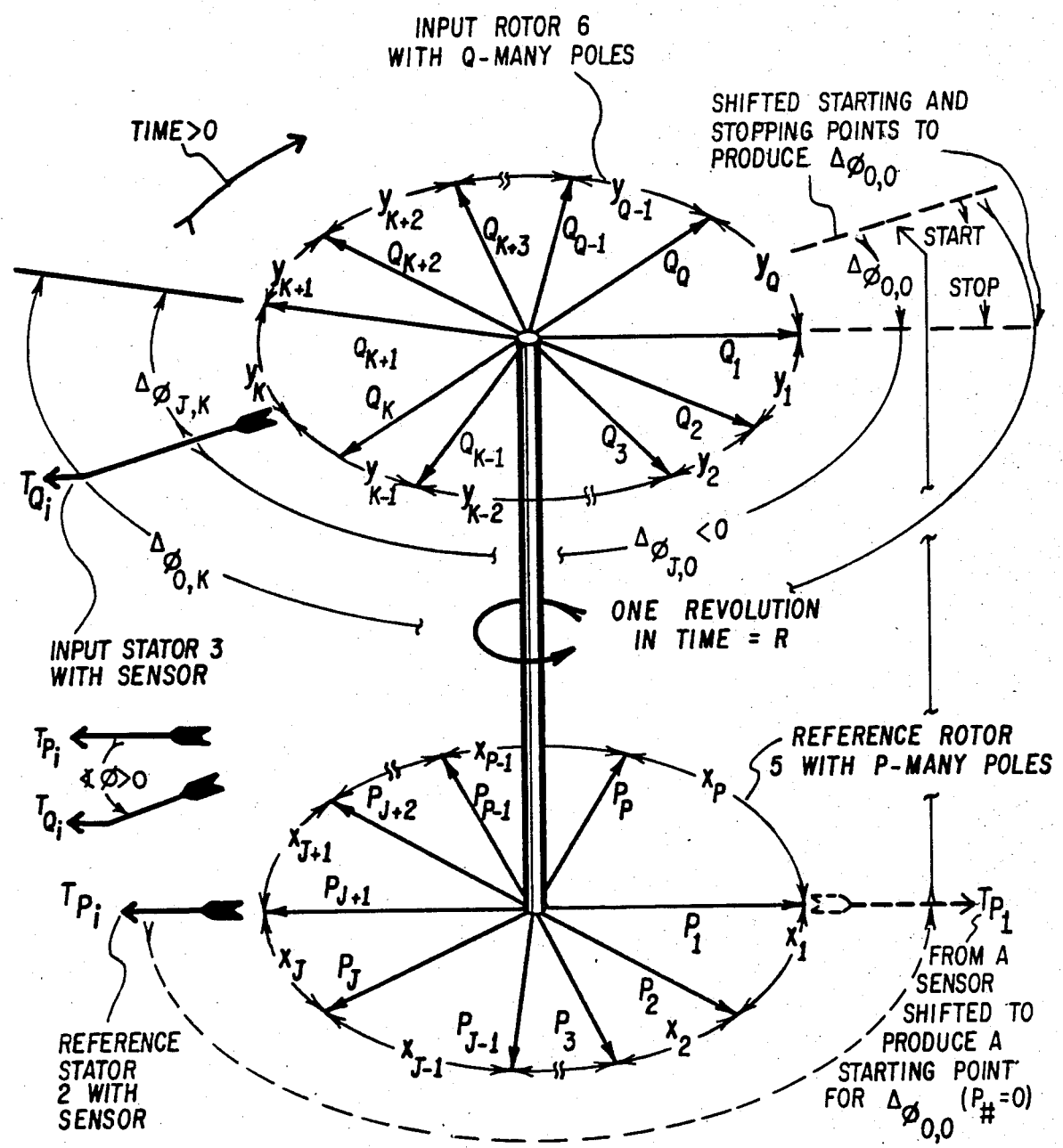

It is necessary to describe the various terms in a way that allows arithmetic to be performed on their subscripts, and the symbolism used in FIGS. 9A–C is a bit different from that used in FIGS. 4–8. The incremental times a, b, c, ... k for the input rotor 6 having Q-many poles ar now labelled $y_1$ through $y_Q$. Likewise, the incremental times l, m, n, ... z for the reference rotor 5 having P-many poles are now labelled $x_1$ through $x_P$. Let the value of $P_\#$ be J and the value of $Q_\#$ be K. J and K will find use as values of interest among the single subscripts for the respective $x_i$ and $y_i$. They will also find use as double subscripts on $\Delta_{100}$. The term $\Delta_{\phi J,K}$ indicates the $\Delta_{100}$ that obtains for given values of J and K. The generalized forms of the individual summations for some input $\phi$ are shown in equations (37) and (38). In eq. (39) we form the same difference as before:

$$\sum_{\Delta_{\phi J,K}}^{y_{K-1}} T_{Qi} = Q\Delta_{\phi J,K} + (Q-1)y_{K+1} + (Q-2)y_{K+2} + \ldots + \quad (37)$$
$$Ky_Q + (K-1)y_1 + \ldots + y_{K-1}$$

$$\sum_{x_{J+1}}^{x_{J-1}} T_{Pi} = (P-1)x_{J+1} + (P-2)x_{J+2} + \ldots + \quad (38)$$
$$Jx_P + (J-1)x_1 + \ldots + x_{J-1}$$

$$\sum_{\Delta_{\phi J,K}}^{y_{K-1}} T_{Qi} - \frac{Q}{P}\sum_{x_{J+1}}^{x_{J-1}} T_{Pi} = Q\Delta_{\phi J,K} + (Q-1)y_{K+1} + \quad (39)$$
$$(Q-2)y_{K+2} + \ldots + Ky_Q + (K-1)y_1 + \ldots + y_{K-1} -$$
$$\frac{Q}{P}[(P-1)x_{J+1} + (P-2)x_{J+2} + \ldots + Jx_P +$$
$$(J-1)x_1 + \ldots + x_{J-1}]$$

(The note preceding eq. (6b) concerning the origin thereof applies equally to eq. (39). They are the same equation save for the differences in notation.)

Now consider certain substitutions for $\Delta_{\phi J,K}$ that may be made into eq. (39). For reasons that will presently become clear we are interested in a substitution in terms of $\Delta_{\phi O,O}$.

By inspection of FIG. 9A, and with the aid of a bit of superposition inspired by FIG. 6, we can arrive at the following substitution:

$$\Delta_{\phi J-1,K} = \Delta_{\phi J,K} + x_J \quad (40)$$

The physical interpretation of such a substitution is that while the same sequence of poles $Q_i$ on the input rotor 6 is used for the summation of the $T_{Qi}$, the local reference from the reference rotor 5 for starting the summation has been shifted foward in time by one pole on that rotor. This might correspond to repositioning the reference stator sensor, although that is not something that can be expected in an actual transducer. A more useful interpretation would be to leave the physical relationships of the rotors and sensors unchanged but adjust the manner of summing the data in the time and state transition table; that is, $\Sigma T_{Pi}$ and $\Sigma T_{Qi}$ overlap less in time.

In any event the particular substitution of eq. (40) won't do much good unless K is already zero and J is one. Equations (41a-b) show what the substitution is if an additional pole on the reference rotor 5 were skipped.

$$\Delta_{\phi J-2,K} = \Delta_{\phi J-1,K} + x_{J-1} \quad (41a)$$

or, $$\Delta_{100\ J-2,K} = \Delta_{100\ J,K} + x_J + x_{J-1} \quad (41b)$$

Clearly then, the general substitution for reducing J to zero is:

$$\Delta_{\phi O,K} = \Delta_{\phi J-J,K} = \Delta_{\phi J,K} + x_J + x_{J-1} + \ldots + x_1 \quad (42a)$$

or $$\Delta_{\phi J,K} = \Delta_{\phi O,K} - x_J - x_{J-1} - \ldots - x_1 \quad (42b)$$

Now consider what substitutions are available to reduce K to zero. Referring to FIG. 9B, a given value for J determines when in a revolution the summation of the $T_{Qi}$ is to begin, but which pole $Q_i$ is to be recognized as the "first" pole following the occurrence of $T_{PJ}$ corresponds to the value of K. Ordinarily "first" means "next in time", and J forces a value for K that depends upon the surrounding conditions. To develop the substitution we suspend that rule and reverse the process by fixing the value of K at zero to force a different $\Delta_\phi$ for the same J.

Similar to eq. (42b), we seek a relationship between $\Delta_{100\ J,K}$ and $\Delta_{\phi J,O}$. It appears that, given the stated rule of starting $\Sigma T_{Qi}$ upon the next $T_{Qi}$ after some $T_{PJ}$, the quantity $\Delta_{\phi J,O}$ may be somewhat of an abstraction. The stated rule effectively causes J to determine K for any given input angle, and while K might from time to time be zero for a given J, the usual case is that it would not. The immediate question here is "What does it mean to force K to be zero with an arbitrary J?" This question is readily answered, and a good deal of abstraction removed from $\Delta_{\phi J,O}$, when it is realized that, at least for the purpose of developing the desired substitution, the stated rules of summation are overly restrictive. (This is not to say the rules are too strict in actual practice. The effect of the rules is to make $\Sigma T_{Qi}$ and $\Sigma T_{Pi}$ arise as much as possible from the same revolution of the rotors. That is desirable because it minimizes any mischief caused by motor speed variations.)

As a first step toward $\Delta_{\phi J,O}$, as an example of more liberal summation rules, and because it will be useful to have on hand below, we begin by examining the notion of $\Delta_{\phi J,Q}$. It is perhaps easier to see, and is useful in understanding $\Delta_{\phi J,O}$. If $\Delta_{\phi J,K}$ is the usual time interval between $T_{PJ+1}$ and $T_{QK+1}$ (J and K are the number of poles that have been skipped, remember), where $T_{QK}$ precedes $T_{PJ+1}$ but $T_{QK+1}$ does not, then $\Delta_{\phi J,Q}$ is:

$$\Delta_{\phi J,Q} = \Delta_{\phi J,K} + y_{K+1} + \ldots + y_Q \quad (43)$$

The physical interpretation of this is simply not recognizing $T_{QK+1}$ through $T_{QQ}$ as "next", but insisting upon waiting for $T_{Q1}$, instead. Aside from raising K to a value of Q, the only effect of this is to increase the fraction of a revolution that separates the beginning of $\Sigma T_{Pi}$ and $\Sigma T_{Qi}$. The quantity $\Delta_{\phi J,Q}$ still starts with $T_{PJ+1}$, however, and $T_{QQ}$ still occurs after $T_{PJ+1}$, which will not be the case with $\Delta_{\phi J,O}$. This skipping of poles is a ruse to raise $Q_\#$ to a value of Q, which, since there are Q-many poles, would never normally happen of its own accord; Q-1 is as high a value as $Q_\#$ would ever normally have. Nevertheless, we can contemplate what would happen if $Q_\#$ were equal to Q, which would produce $\Delta_{\phi J,Q}$, and we can examine the relationship between such a $\Delta_{\phi J,Q}$ and the sought for $\Delta_{\phi J,O}$.

Any difficulty in visualizing $\Delta_{\phi J,O}$ is likely to arise because it appears to require us to contemplate a measurement that, under the old rules, is "finished before it is started." But any of the $\Delta_{\phi J,K}$-type quantities under consideration here merely represent a time interval with a beginning and an end. Under the old rules the J subscript defines the beginning and forces a K subscript that is always subsequent in time, so that it can always define the end of the interval. The notion of $\Delta_{\phi J,O}$ is still an interval with a beginning and an end, only now the K subscript defines the beginning and the J subscript defines the end. As far as the absolute magnitude of the interval is concerned, it doesn't make any difference if we agree to take the earlier of the two as a "start" and the later of the two as a "stop." The rotor is still turning in the same direction, and a positive incremental time interval will still be measured. (Any "zero points of reference" must be kept in mind, however, with possibility of a future sign change.) Likewise, it won't hurt anything if we skip some poles in the process.

The following hypothetical situation may aid in understanding $\Delta_{\phi J,O}$. Suppose some means were at hand for keeping a recent history of the relationship between the input rotor 6 and the sensor on the input stator 3, such as the one described in connection with FIGS. 3A–C. When $T_{PJ+1}$ occurs we check the history to find when $Q_1$ passed the input stator sensor, and use that as the starting time of the interval. The time at when $T_{PJ+1}$ occurs ends the interval, but is also the assumed zero point for the summations as well as for any of the $\Delta_\theta$-type intervals that carry the actual angle information. Hence $\Delta_{\phi J,O}$ is a negative value if $\Delta_{\phi J,K}$ is to be thought of as positive; they lie on opposite sides of $T_{PJ+1}$. A simple subtraction would find the value of the interval $\Delta_{\phi J,O}$. While we don't actually do that, it can be seen that the negative of such a $\Delta_{\phi J,O}$ plus $\Delta_{\phi J,K}$ combine to equal something else that is eminently measurable without resort to such a recent history:

$$-\Delta_{\phi J,O}+\Delta_{\phi J,K}=y_1+y_2+\ldots+y_K \quad (44a)$$

Here is another aid in understanding the notion of $\Delta_{\phi J,O}$. A rotating system such as the one under consideration is essentially modulo in nature. In a sense, there is little significant difference between K having a value of Q and a value of zero. It amounts to this: when the Qth pole reaches the sensor we must decide whether to enumerate it as Q or as zero. If we chose Q, $T_{QQ}$ is a "stop" signal for the interval and follows an earlier "start" signal, $T_{PJ+1}$. If we chose zero, it is a "start" signal and the next (i.e., a second instance of) $T_{PJ+1}$ serves as "stop." But in each case we are considering the same two points A and B on the circumference of a circle. In one case we measure from A to B; in the other from B to A, or what is the same thing, from A to B but in the other direction. Just as the sum of those two measurements in the same direction is simply the circumference of the circle, so:

$$-(\Delta_{\phi J,O})+\Delta_{\phi J,Q}=R \quad (44b)$$

Note that if eq's (43) and (44b) are taken as a starting point, then eq. (44a) may be derived by subtracting eq. (44b) from eq. (43).

Equation (44a) may be rearranged to produce the desired substitution for $\Delta_{\phi J,K}$ in terms of $\Delta_{\phi J,O}$:

$$\Delta_{\phi J,K}=y_K+y_{K-1}+\ldots+y_1+\Delta_{\phi J,O} \quad (45)$$

physical interpretation of $-\Delta_{\phi J,O}$ that emerges from eq. (44a) is that it is that time interval one would need to add to the actually measured time interval ($\Delta_{\phi J,K}$) in order to produce the sum of $Y_1$ through $Y_K$. We can certainly contemplate $\Delta_{\phi J,O}$, even though it is not directly measured in the same sense that new sums for the $T_{Qi}$ would be measured each time the reference sensor were slipped back by $x_J$, $x_{J-1}$, etc., to reduce J to zero. We contemplate both $\Delta_{\phi O,K}$ and $\Delta_{\phi J,O}$; we actually measure neither.

At this point we could choose to substitute eq. (42b) into eq. (39) and reduce the result after that fashion of eq's (16–22) for FIG. 6. That would produce an equation relating $\Delta_{\phi J,K}$ and $\Delta_{\phi O,K}$, into which could be substituted eq. (45). A further reduction would produce an equation relating $\Delta_{\phi J,K}$ and $\Delta_{\phi O,O}$, which is indeed the immediate goal. In like fashion the order of the substitutions could be reversed, reducing K to zero first, followed by reducing J to zero. Since this is so, and it may be demonstrated simply by doing it, and owing to a desire for brevity and perhaps the incremental elegance, the two substitutions may be combined. This reduces the amount of algebra nearly by half, and that is how we now proceed.

Referring now to FIG. 9C, the time interval labeled $\Delta_{\phi O,O}$ is equal to simply the difference in time between $T_{P1}$ occurring prior to $T_{Q1}$. Note that $\Delta_{\phi O,O}$ is strictly a function of the input angle, once any particular orientation of the rotors upon their interconnecting shaft is given. And $\Delta_{\phi O,O}$ is exactly what we would expect from an input angle when $P_\#$ and $Q_{1\#}$ both equal zero. By inspection we may write:

$$\Delta_{\phi O,O}-\Delta_{\phi J,O}+\Delta_{\phi J,K}=\Delta_{\phi O,K} \quad (46a)$$

Now into eq. (46a) substitute with both eq's (46b) and (46c):

$$\Delta_{\phi O,K}=\Delta_{\phi J,K}+x_J+x_{J-1}+\ldots+x_1 \text{ (FROM EQ.(42a))} \quad (46b)$$

$$-\Delta_{\phi J,O}=y_1+y_2+\ldots+y_K-\Delta_{\phi J,K} \text{ (FROM EQ. (44a))} \quad (46c)$$

After simplifying while solving for $\Delta_{\phi J,K}$ the result is:

$$\Delta_{\phi J,K}=y_1+y_2+\ldots+y_K-x_1-x_2-\ldots -x_J+\Delta_{\phi O,O} \quad (47)$$

Equation (47) may also be derived from inspection of a figure (not shown) similar to FIG. 9C that would represent the following situation. The angular displacement between the reference sensor and the input sensor is held fixed as the pair is rotated as a unit about the axis of rotor rotation until the reference sensor is exactly opposite the pole $P_1$ at the time the summations begin. The angle through which the pole $Q_1$ rotates from the occurrence of $T_{P1}$ until the occurrence of $T_{Q1}$ is $\phi_{O,O}$.

Equation (47) is the combined, all-in-one "killer" substitution. It relates $\Delta_{\phi J,K}$ to $\Delta_{\phi O,O}$ for all values of $P_\#$ and $Q_\#$. We now substitute for $\Delta_{\phi J,K}$ in eq. (39) according to eq. (47).

$$\sum_{\Delta_{\phi J,K}}^{y_{K-1}} T_{Qi} - \frac{Q}{P}\sum_{x_{J+1}}^{x_{J-1}} T_{Pi} = Q[y_1 + y_2 + \ldots + y_K - x_1 - \quad (48a)$$

$$x_2 - \ldots - x_J + \Delta_{\phi 0,0}] + (Q-1)y_{K+1} + (Q-2)y_{K+2} + \ldots +$$

$$Ky_Q + (K-1)y_1 + \ldots + y_{K-1} - \frac{Q}{P}[(P-1)x_{J+1} +$$

$$(P-2)x_{J+2} + \ldots + Jx_P + (J-1)x_1 + \ldots + x_{J-1}]$$

$$= Q\Delta_{\phi 0,0} + (Q-1)y_{K+1} + \quad (48b)$$

-continued $$(Q-2)y_{K+2} + \ldots + Ky_Q + (Q+K-1)y_1 + (Q+$$

$$K-2)y_2 + \ldots + (Q+1)y_{K-1} + Qy_K - \frac{Q}{P}[(P-1)x_{J+1} +$$

$$(P-2)x_{J+2} + \ldots + Jx_P + (P+J-1)x_1 + (P+J-2)x_2 +$$

$$\ldots + (P+1)x_{J-1} + Px_J]$$

As in connection with FIGS. 6–8, we plan to "extract R's" from the y terms and the x terms. Recall that R equals the sum of all the $x_1$ through $x_p$, inclusive, and also equals the sum of all the $y_1$ through $y_Q$, inclusive. Consider the y terms in eq. (48b). Note that each $y_i$ is present and that the smallest coefficient is K. Evidently, K-many R's can be subtracted from the y terms to leave a familiar sum as the difference. Likewise, the x terms contain each $x_i$ with J as the smallest coefficient. J-many R's can be subtracted from those terms to leave another familiar sum as the difference. Tables I and II, below, show in tabular form the extraction of KR and JR, respectively.

TABLE I

Separation of the y terms into KR and $\sum_{y_1}^{y_{Q-1}} T_{Q_i}$.

| $\Sigma(\searrow)$ | minus | $\Sigma(\searrow)$ | equals | $\Sigma(\searrow)$ |
|---|---|---|---|---|
| $Ky_Q$ | — | $Ky_Q$ | = | 0 |
| . | | . | | . |
| . | | . | | . |
| . | | . | | . |
| $(Q-2)y_{K+2}$ | — | $Ky_{K+2}$ | = | $(Q-K-2)y_{K+2}$ |
| $(Q-1)y_{K+1}$ | — | $Ky_{K+1}$ | = | $(Q-K-1)y_{K+1}$ |
| $Qy_K$ | — | $Ky_K$ | = | $(Q-K)y_K$ |
| $(Q+1)y_{K-1}$ | — | $Ky_{K-1}$ | = | $(Q-K+1)y_{K-1}$ |
| . | | . | | . |
| . | | . | | . |
| . | | . | | . |
| $(Q+K-2)y_2$ | — | $Ky_2$ | = | $(Q-2)y_2$ |
| $(Q+K-1)y_1$ | — | $Ky_1$ | = | $(Q-1)y_1$ |

$$\therefore \Sigma \text{ (y terms in eq. (48b))} = KR + \sum_{y_1}^{y_{Q-1}} T_{Q_i}$$

TABLE II

Separation of the x terms into JR and $\sum_{x_1}^{x_{J-1}} T_{P_i}$.

| $\Sigma(\searrow)$ | minus | $\Sigma(\searrow)$ | equals | $\Sigma(\searrow)$ |
|---|---|---|---|---|
| $Jx_P$ | — | $Jx_P$ | = | 0 |
| . | | . | | . |
| . | | . | | . |
| . | | . | | . |
| $(P-2)x_{J+2}$ | — | $Jx_{J+2}$ | = | $(P-J-2)x_{J+2}$ |
| $(P-1)x_{J+1}$ | — | $Jx_{J+1}$ | = | $(P-J-1)x_{J+1}$ |
| $Px_J$ | — | $Jx_J$ | = | $(P-J)x_J$ |
| $(P+1)x_{J-1}$ | — | $Jx_{J-1}$ | = | $(P-J+1)x_{J-1}$ |
| . | | . | | . |
| . | | . | | . |
| . | | . | | . |
| $(P+J-2)x_2$ | — | $Jx_2$ | = | $(P-2)x_2$ |
| $(P+J-1)x_1$ | — | $Jx_1$ | = | $(P-1)x_1$ |

$$\therefore \frac{Q}{P} \Sigma \text{ (x terms in eq. (48b))} = \frac{Q}{P}\left[JR + \sum_{x_1}^{x_{P-1}} T_{P_i}\right]$$

Evidently then:

$$\sum_{\Delta\phi_{J,K}}^{y_{K-1}} T_{Q_i} - \frac{Q}{P} \sum_{x_{J+1}}^{x_{J-1}} T_{P_i} = Q\Delta\phi_{0,0} + KR + \sum_{y_1}^{y_{Q-1}} T_{Q_i} - \qquad (48c)$$

$$\frac{QJR}{P} - \frac{Q}{P} \sum_{x_1}^{x_{P-1}} T_{P_i}$$

$$\Delta\phi_{0,0} = \frac{\sum\limits_{\Delta\phi_{J,K}}^{y_{K-1}} T_{Q_i}}{Q} - \frac{\sum\limits_{x_{J+1}}^{x_{J-1}} T_{P_i}}{P} + \frac{JR}{P} - \frac{KR}{Q} + \qquad (48d)$$

$$\frac{\sum\limits_{x_1}^{x_{P-1}} T_{P_i}}{P} - \frac{\sum\limits_{y_1}^{y_{Q-1}} T_{Q_i}}{Q}$$

Recalling that $J = P_\#$ and $K = Q_\#$, and solving for $\phi_{0,0}$:

$$\phi_{0,0} = \frac{2\pi}{R} \Delta\phi_{0,0} = \qquad (48e)$$

$$2\pi \left\{ \frac{\dfrac{\sum\limits_{\Delta\phi_{J,K}}^{y_{K-1}} T_{Q_i}}{Q} - \dfrac{\sum\limits_{x_{J+1}}^{x_{J-1}} T_{P_i}}{P}}{R} + \frac{P_\#}{P} - \frac{Q_\#}{Q} \right\} - $$

$$2\pi \left\{ \frac{\dfrac{\sum\limits_{y_1}^{y_{Q-1}} T_{Q_i}}{Q} - \dfrac{\sum\limits_{x_1}^{x_{P-1}} T_{P_i}}{P}}{R} \right\}$$

The terms within the left-hand pair of braces of the right-hand member of eq. (48e) are, allowing only for differences in the type of notation, exactly the terms within the braces of eq. (1). The product of $2\pi$ and the term of the right-hand pair of braces of eq. (48e) define the constant $\Psi$ of eq. (1).

Here is how it can be seen that above-mentioned right-hand product in eq. (48e) is indeed the value $\Psi$ of eq. (1). Substituting eq. (7) into eq. (13), we obtain:

$$\Psi = \frac{2\pi}{QR} \left\{ \sum_{o}^{j} T_{Q_i} - \frac{Q}{P} \sum_{l}^{y} T_{P_i} \right\} \qquad (49a)$$

But:

$$\sum_{o}^{j} T_{Q_i} = \sum_{y_1}^{y_{Q-1}} T_{Q_i}, \text{ AND} \qquad (49b)$$

$$\sum_{l}^{y} T_{Q_i} = \sum_{x_1}^{x_{P-1}} T_{P_i} \qquad (49c)$$

Hence, the notation of eq. (49a) may be replaced with that of eq's (49b–c) and result rearranged to obtain:

$$\Psi = 2\pi \left\{ \frac{\dfrac{\sum\limits_{y_1}^{y_{Q-1}} T_{Q_i}}{Q} - \dfrac{\sum\limits_{x_1}^{x_{P-1}} T_{P_i}}{P}}{R} \right\} \qquad (49d)$$

Equation (49d) shows that the right portion of eq. (48e) is indeed exactly $\Psi$, and that eq. (48e) is indeed exactly equivalent to eq. (1).

We have derived eq. (1) and in the process have clarified the nature of the angle $\theta$ whose value is returned, and have precisely defined $\Psi$. The angle $\theta$ turns out to be $\phi_{0,0}$, which is simply the angle obtained if one never begins a summation unless the associated $P_\#$ and $Q_\#$ are zero. That, of course, would require stricter rules than allowing $P_\#$ and $Q_\#$ (J and K) to have arbitrary values. An advantage of eq's (1) and (48e) is that no such strict rules are required. The definition of $\Psi$ is essentially a residual offset that obtains when $\phi_{0,0}$ equalling zero is the input angle. The sums involved in determining $\Psi$ are $\Sigma T_{P_i}$ for $P_\# = 0$ and $\Sigma T_{Q_i}$ for exactly $Q_\# = 0$ (i.e., with no $\Delta_\theta$ left over). To say that $\Delta_\theta$ equals zero at zero degrees input is another way of saying that $T_{P_1}$ is coincident with $T_{Q_i}$. However, neither eq. (1) nor eq. (48e) requires $T_{P_1}$ to be coincident with $T_{Q_1}$ at "zero degrees" input, because $\Psi$ can provide a reference to exactly whatever arbitrary condition obtains between $T_{P_1}$ and $T_{Q_1}$ at the input value the user desires to be "zero degrees." This includes both arbitrarily defined "zero" locations of the input stator as well as arbitrary placements of the rotors upon the interconnecting shaft. Recall that such coincidence between $T_{P_1}$ and $T_{Q_1}$ was one of the simplifying assumptions made at the outset of the demonstrations. We can now show that this particular assumption is unnecessary. To see why this is so, observe that there does exist one mechanical input value for which $T_{P_1}$ and $T_{Q_1}$ are coincident, regardless of the "zero" stator location or the orientation of $P_1$ to $Q_1$. Call that input condition zero degrees if that is convenient, or call it some arbitrary value $\alpha$ if it is not to be zero degrees. It is clear that the only effect of the latter course is to introduce an offset of $\alpha$ into the measured result. The amount of the offset $\alpha$ need not even be found explicitly, although it is certainly possible to find it by monitoring $T_{P_1}$ and $T_{Q_1}$ for simultaneity as the mechanical input is varied. The difference between the mechanical input producing such simultaneity and that mechanical input desired to be zero is $\alpha$. To avoid finding $\alpha$ directly the mechanical input is at some time set to a reference value $\theta_{ref}$, such as "zero", "ten" or whatever. A modified equation (1) not containing the minus $\Psi$ term is then used to find by measurement a base value of $\theta_{ref}$. But that value may be seen as:

$$\theta_{ref} = \alpha - \Psi_{ideal} \quad (50)$$

Of course, the actual values of $\alpha$ and $\Psi_{ideal}$ are unknown; only their difference $\theta_{ref}$ is known (by measurement and through the agency of the modified eq. (1)).

Now consider the result of increasing the mechanical input from its original value of $\theta_{ref}$ by an unknown amount $\gamma$ to $\theta_{new}$. The goal is to find $\gamma$. But $\theta_{new}$ is a measurable quantity for which we can obtain a value:

$$\theta_{new} = \alpha + \gamma - \Psi_{ideal} \quad (51)$$

$$\gamma = \theta_{new} - (\alpha - \Psi_{ideal}) \quad (52)$$

$$\gamma = \theta_{new} - \theta_{ref} \quad (53)$$

That is, $\gamma$ is the input value relative to $\theta_{ref}$, whose value is arbitrary. Observe that the actual values of $\alpha$ are $\Psi_{ideal}$ need never be explicitly found. It follows also that we may recast eq. (1) as eq's (1') and (1'') below:

$$\theta = 2\pi \{\theta'_{n+1} - \theta_n'\}, \text{ WHERE} \quad (1')$$

$$\theta_n' = \frac{\frac{\Sigma T_{Q_i}}{Q} - \frac{\Sigma T_{P_i}}{P}}{R} + \frac{P_\#}{P} - \frac{Q_\#}{Q} \quad (1'')$$

Observe that $\theta$ in eq. (1') need not necessarily equal $\phi_{0,0}$ as discussed in connection with eq. (48e), but may differ from $\phi_{0,0}$ by some constant. Whether they will be equal or not depends upon the conditions chosen to represent "zero degrees." If that condition is $T_{P_1}$ coincident with $T_{Q_1}$ at "zero degrees," then $\theta$ will indeed equal $\phi_{0,0}$. This follows from the definition of $\Psi$ in eq. (49) and from the effect of that "zero degree" condition on either eq. (1) or eq. (1''). In the case of eq. (1), the term in the braces then has a value of $\Psi$, and $\Psi$ minus $\Psi$ is zero. In the case of eq. (1''), the value returned for $\theta_n'$ at "zero degrees" is again $\Psi$, so eq. (1') acts identically to eq. (1) where $\Psi$ is known. However, if "$\theta$ equal zero degrees" is not the condition of $T_{P_1}$ coincident with $T_{Q_1}$, then $\theta$ equals $\phi_{0,0}$ plus or minus some constant offset equal to the difference between the two zero conditions. Either way, however, the change in $\theta$ equals the change in $\phi_{0,0}$.

Those skilled in the art will appreciate that there are several possible ways of exploiting the properties just described. They range from actually finding $\alpha$ and $\Psi_{ideal}$ once and for all for a given fixed installation, finding them upon demand, such as upon turn-on, and finding only $\theta_{ref}$ initially upon turn-on, to measuring each angle as a displacement with a new $\theta_{ref}$ at one end and a different $\theta_{new}$ at the other. These are matters of implementation to be decided on the basis of what makes the most sense for a given application.

The possibility exists, depending on whether or not $\Psi$ is found and used, the condition taken as zero degrees, the way the poles lie on the rotors, etc., that eq. (1) or even eq. (1'') may from time to time produce negative answers. This will not cause a problem, as any such negative answer can easily be "rectified" by simply adding that negative value to a positive unit circle.

We now return to eq. (1) and readdress another of the simplifying assumptions made at outset of the preceding demonstrations. Recall that, in reference to FIGS. 4–8, in eq's (2) and (3) 1 was assumed to begin at "time equals zero." In terms of FIGS. 9A–C, this is the same as assuming $T_{P_1}$ equals zero. Now suppose $T_{P_1}$ is not zero. Then what? Let $T_{P_1}$ equal some nonzero value $\beta$, and consider the effect of that upon eq. (48e). Our conclusions will apply to eq. (1) also, since those equations are equivalent.

The demonstrations have all been couched in terms of time intervals (a, b, c, . . . and l, m, n, . . . , or, $y_1, y_2, y_3$, . . . and $x_1, x_2, x_3 \ldots$ ). Equations (2) and (3) show the relationship between summing the endpoints of those intervals (as in eq. (1)) and summing the intervals, which is more convenient in the proofs. It is important to remember that $\beta$ is not an increment to any of the intervals (their values remain unchanged), but is a common increment in measured value for the endpoint of each interval, whether for the summation of the $T_{Q_i}$ or the summation of the $T_{P_i}$. As performed in eq. (1) there are Q-many such summations for the $T_{Q_i}$ and P-many for the $T_{P_i}$. Each of Q-many $T_{Q_i}$ increases by $\beta$, so their sum increases by $Q\beta$. Likewise, the sum of the $T_{P_i}$ increases by $P\beta$. It does not matter in what order the various $T_{P_i}$ are together, nor in what order the various $T_{Qi}$ are added together. That is, whether the summations are in the left-hand braces of eq. (48e) on behalf of some $\Delta_{\phi J,K}$ or in the right-hand braces on behalf of $\Psi$, each $\Sigma T_{Qi}$ goes up by $Q\beta$ and each $\Sigma T_{Pi}$ goes up by $P\beta$. It is clear that $\beta \neq 0$ is a self-canceling condition, since within each pair of braces:

$$\frac{\Sigma T_{Qi} + Q\beta}{Q} - \frac{\Sigma T_{Pi} + P\beta}{P} = \frac{\Sigma T_{Qi}}{Q} + \beta - \qquad (54)$$

$$\frac{\Sigma T_{Pi}}{P} - \beta = \frac{\Sigma T_{Qi}}{Q} - \frac{\Sigma T_{Pi}}{P}$$

And finally, we wish to stress the significance of eq. (1) in view of eq's (2) and (3) and in light of the preceding remarks concerning the simplifying assumptions. It pointed out when eq. (1) was introduced, and it is repeated here, that eq. (1) calls for summations of P-many consecutive transition times and of Q-many transition times. Since for a considerable number of columns the explanation has centered around intervals, the casual reader might form the mistaken impression that an extensive series of subtractions is required in order to find the intervals and produce the answer. This is not so. The use of intervals in the demonstrations and proof is convenient; the intervals correspond to pole placement upon the rotors. But as pointed out earlier, eq's (2) and (3) relate the intervals to the sums called for in eq. (1). Those sums are formed exactly by mere addition of the consecutive Q-many $T_{Qi}$ and the mere addition of the consecutive P-many $T_{Pi}$. No subtractions are required in forming those sums. The first of the $T_{Pi}$ to be added need not be zero, nor must $T_{P1}$ and $T_{Q1}$ be coincident. And only a modest number of other arithmetic operations such as subtraction and multiplication must be performed upon the completed sums once a measurement is to be taken.

At this point it may be useful to examine the "meaning" of eq's (1) and (48e). In spite of just having derived them, it is still possible to be bit mystified as to "why it really works" even though it is clear that it does, in fact, work. A certain fundamental principle is at the root of "why it really works" and it will be useful to briefly illuminate that principle in isolation. Armed with that, we will then offer an interpretation of certain equations for finding the angle $\theta$.

Consider the rotating four-pole rotor shown in FIG. 10. A sensor produces signals at the time $T_1$ through $T_4$ as the rotor revolves one full revolution in a length of time R. As in the first examples we identify the incremental times between poles as a, b, c and d. The only constraint upon a through d is that their sum be R; specifically, we do not assume that they are equal.

Equation (vi) of FIG. 10 shows the result of averaging the four consecutive transition times to find the "average time of a pole", or the time of occurrence for a "single equivalent pole." It is important to realize that this averaging or equivalence is relative to starting the summations on pole number one. Now we ask: "Suppose we had averaged four consecutive times beginning on pole number two (a delay of "a" in starting the average). What would the change be in either the average time or in the location of the new equivalent pole?" Anyone who expects, even at this point in the specification, that the time of occurrence of the new single equivalent pole will be delayed by the interval "a" is certainly in good company. That is the wrong answer, however, as the delay is exactly the average interval between poles. Equations (vii) through (x) find the new value; as shown in eq. (xi) the two values differ by exactly one fourth of a revolution. It can be seen that if two poles had been skipped then the difference would be two fourths of a revolution. Further, if there were five poles instead of four, then the results for these examples would be one fifth and two fifths of a revolution, respectively. It is clear that what we have here is an outline of a theorem about what we have called $P_\#/P$ and $Q_\#/Q$. The import of this theorem is that, even though the Q-many arbitrary intervals a, b, c, ... , k between the Q-many poles of a rotor are not individually known except that their sum is R, for each additional pole skipped before commencing the summations that determine the average time of pole occurrence the resulting average increases by exactly the fraction $R/Q$. This is an interesting and perhaps unexpected result in that it relates a quantity of arbitrary and unknown magnitude (the amount skipped) to one whose magnitude is both definite and known in advance (the size of the correction).

This principle of correction is equally applicable where the consecutive times of occurrence are averaged over more than one revolution. We now engage in a brief exploratory digression concerning this possibility. Suppose there are n-many revolutions, and that the number of poles skipped remains less than the number of poles on the rotor. Then it may be shown that:

$$\frac{\sum\limits_{i=n(1,2,3,4)} T_i}{4n} = \frac{n \sum\limits_{i=1,2,3,4} T_i + 4R \sum\limits_{i=1}^{n-1} i}{4n} \qquad (vi')$$

$$\frac{\sum\limits_{i=n(2,3,4,1)} T_i}{4n} = \frac{n \sum\limits_{i=2,3,4,1} T_i + 4R \sum\limits_{i=1}^{n-1} i}{4n} \qquad (x')$$

$$= \frac{n \left[ \sum\limits_{i=1,2,3,4} T_i + R \right] + 4R \sum\limits_{i=1}^{n-1} i}{4n}$$

$$= \frac{n \sum\limits_{i=1,2,3,4} T_i + 4R \sum\limits_{i=1}^{n-1} i}{4n} + \frac{R}{4}$$

That is, the number of revolutions does not affect the size of the correction that owes to the number of poles skipped. Although this is a specific instance involving a four-poled rotor, it is clear that the general principle applies for any plurality of poles on the rotor. The above requirement of skipping a number of poles less than are on the rotor is consistent with the rules given for forming $P_\#$ and $Q_\#$ in connection with the preferred embodiment; if a multiple revolution measurement were to be performed, then $P_\#$ forces $Q_\#$, and both values are picked during the first revolution. Hence their difference can represent at most a fraction of a revolution.

Naturally, other things in eq. (1) would change for a measurement of n-many revolutions. The summation $\Sigma T_{Qi}$ would be divided by $n \cdot Q$, and the summation $\Sigma T_{Pi}$ would be divided by $n \cdot P$, but the difference between those two quotients would still be divided by R and the correction factor $(P_\#/P) - (Q_\#/Q)$ would stay the same.

Another multiple revolution possibility deserves brief consideration. Suppose there were to be n revolutions of the rotors for each summation with the usual P-many and Q-many poles. Suppose also that the summations were not guaranteed to begin within the same revolution (perhaps motor speed variations are not a concern). Here the n-many revolutions for the one rotor could be nearly completely separate from the n-many for the other rotor, for a potential maximum of nearly 2n total revolutions. If one were to persist in this, the way to do it would be to treat the rotors as "super rotors" with n·P and n·Q poles respectively, over one "super revolution." Under this scheme $P_\#$ and $Q_\#$ are allowed to be larger than P and Q, and the measurement is easily handled by any of the equations already set forth, save only for using n·P in place of P, n·Q in place of Q, and n·R in place of R. An extra bit of overhead would be the recognition of only every n-th ones of the actual once-per-revolution marks as "super once-per-revolution marks."

Either of the above multiple revolution schemes would have a certain utility where it was desired to average two or more overall measurements. Instead of making n measurements with one revolution each, one could make one measurement with n revolutions. More memory is involved, but the result is probably a faster measurement and considerably less trouble in combining answers that lie very close to zero or to three hundred and sixty degrees.

In the interest of brevity we decline to offer a more formal proof of the theorem of FIG. 10. It would not be difficult to do so however, and it should be noted that each of FIGS. 6, 9A or 9B and their respective text could be construed as the basis of a proof. Without a doubt we have proven various disguised versions of the theorem several times over. Recalling that the goal of the present discussion is to render an interpretation of how the phase angle formula "really works", the purpose of the example in FIG. 10 and its associated theorem is simply to make a certain useful principle explicitly visible. Having done so we now proceed with the interpretation.

Perhaps the easiest place to begin the interpretation is with eq. (48d). In that equation, a time ($\Delta_{\phi 0,0}$) is equated to a difference involving four other times and two correction indexes (JR/P and KR/Q, which is to say, $P_\#/P$ and $(Q_\#/Q)$. We prefer to start here because most of the units are simply time, which is the unit of the original measurement, and because all the terms are explicitly present without "simplifying" rearrangements that reduce arithmetic overhead but obscure or absorb structural relationships between the quantities. Equation (48d) may be recast as eq. (55), which is shown in FIG. 11A.

For the most part the annotations in FIG. 11A speak for themselves, and need not be repeated here. The conclusion to be drawn from FIG. 11A is that the difference between the two left-hand brackets is a measured difference related to a new angle. It is to be diminished by an earlier measured difference corresponding to the reference condition to which the angle is relative. The reference condition can either be $\Psi$ or a selected measured difference corresponding to a redefinable zero angle condition. See the initial discussion concerning $\Psi$ and eq. (1) as well as the discussion concerning $\Psi_{ideal}$, $\alpha$ and eq's (50) through (53), and especially eq's (1') and (1'').

The measured difference mentioned above is the average time of occurrence, within a revolution, of a Q pole with respect to the average time, within essentially that same revolution, of a P pole. Both average times are adjusted to be with respect to certain starting poles on their respective rotors. Seen in this light, the reference rotor and its sensors provide a stable reference point against which to measure the interval to the average time, within a revolution, of a pole on the input rotor. Notice that what a given value for J does is essentially force some value for K, according to the shapes of the particular rotors and the locations of the input stator. In a certain sense, any two $\Delta_{\phi J,K}$ and $\Delta_{\phi M,N}$ are commensurable once the two $\Delta_\phi$'s have been adjusted to be relative to $Q_\#$ of zero: the times $\Delta_{\phi J,O}$ and $\Delta_{\phi M,O}$ differ by the time interval between the two P poles J and M. (It is fair to ask at which speed of revolution if R varies from one measurement to the next, and this is discussed in connection with eq. (56) and FIG. 11B below.) In other words, the reference rotor provides different points of reference for the two measurements. The exact amount of that difference is found by reducing J and M to zero. In the process J and M (as well as K and N, for that matter) are freed to represent portions of different revolutions occurring at different speeds.

Recalling that eq's (1') and (1'') deal with the case where $\Psi$ is cancelled by subtraction, if we ignore the terms in the right-hand brackets o: eq. (55) (they correspond to $\Psi$) it is not difficult to interpret eq. (1'') in light of eq. (55). The only difference is a conversion from finding $\Delta_{t\theta}$ to finding $\theta$ by dividing the equation by R, and then rearranging slightly. The division by R is especially desirable, as this normalizes for different possible speeds of rotation to produce $P_\#/P$ and $Q_\#/Q$ that represent certain fractions of a revolution, as opposed to specific times. It also produces a result, that when multiplied by $2\pi$ as in eq. (1'), is an angle in radians, and no longer just a fraction of a revolution. Equation (1'') may be said to find the fraction of a revolution between two single equivalent poles each relative to arbitrary starting poles, which is then adjusted to be with respect to certain fixed starting poles in accordance with the theorem. $P_\#/P$ is added back since the subtracted summation for the $T_{Pi}$ is too big, not yet having been adjusted back to the earlier starting point. $Q_\#/Q$ is subtracted since the sum of the $T_{Qi}$ that was diminished started out too big by that amount, not yet having been adjusted back to the earlier starting point.

A further insight as to how the reference rotor and its summation act as a "zero reference" may be gained from an examination of eq. (56) in FIG. 11B. Much of the annotations are the same, but the terms of the equation (eq. (48d)) have been grouped differently: All the terms pertaining to the $T_{Pi}$ are grouped together and form a difference. According to the theorem, the quantity within the right-hand brackets of eq. (56) would be zero if each summation were relative to the same $T_O$. That is, the sum of the "new-but-adjusted" $T_{Pi}$ would equal the sum of the "old" $T_{Pi}$. Clearly, in the equation the $T_{Qi}$ alone are producing the "angle information", which is what we would expect, given that the reference sensors do not move!

Why, then, do we bother with the $T_{Pi}$? The answer is, at least in part, that even in an ideal transducer the value of the terms in the right-hand pair of brackets will generally not be zero, for at least two reasons. The first reason is that even if both summations were made relative to the same $T_O=0$, they would still be made at different times, and would thus produce different average times of occurrence whose difference could not be zero. (The same goes for the left-hand pair of brackets, of course.) The difference between the terms in the right-hand brackets might "accidently" be zero, however, since no actual clock keeping time along a monotonically increasing axis can run arbitrarily long with respect to any given time $T_0=0$. At some point the clock will need to be reset, so that in all probability the two sums in the right-hand brackets will not be relative to the same $T_O=0$ for the clock. That variability may cause the sums to be equal when they would not otherwise be. (The same can also be said of the sums in the left-hand brackets.) This is not a problem, since both pairs of braces incorporate the same difference between any separate $T_O$'s and since the result is the difference between the differences. To find that difference between the differences is the principal reason for finding the two $\Sigma T_{Pi}$; that finds and thus allows removal of an offset in the difference between the two $\Sigma T_{Qi}$'s. The second reason operates the same way but with different possible causes. The different summations may have been made with slightly different motor speeds or clock rates. These also produce offsets measurable in the right-hand brackets that are common to, and must be removed from, the left-hand brackets.

It can be shown that none of these happenings (measurements at different times, clock resets, motor speed or clock rate changes) is cause for concern. This is easily seen by considering eq. (56); the differential nature of the computations causes cancellation of any offsets owing to steady state shifts owing to these effects. Of course, one would take care never to reset the clock in the middle of a revolution during which a phase measurement was being made.

FIGS. 11C and 11D are annotated interpretations of eq. (1). They assume the structure and measurement rules of FIGS. 3A–C, the abovementioned theorem, and the notions of single equivalent poles.

It can now be seen that eq's (1), (1') and (1") are indeed valid, and that they in no way require that the rotors have equal numbers of poles or that the poles be uniformly spaced. The demonstration expressly allows arbitrary pole placement. As a practical matter, it is likely that the poles on a rotor will be fairly uniformly spaced, and this is desirable to allow optimization of sensor response to suppress transients and assist in the suppression of crosstalk if crosstalk is present. Such uniformity also allows reliable detection of the missing pole that serves to mark an absolute location on each rotor, and that serves as the basis for keeping track of $P_\#$ L. and $Q_\#$. Even that, however, could be accomplished by other means (e.g., separate once-per-revolution sensors with cooperating indicators permanently attached to each gear and correlated with particular poles). Such means would then allow, in principle, utterly arbitrary pole positioning upon the rotors (in a system free of crosstalk). In short, while we do not expressly recommend the use of deliberately misplaced of randomly placed poles unless there is otherwise good reason to do so, the phase measurement technique described herein allows phase measurements whose accuracy is not limited by the accuracy of pole placement. Other factors may still compel essentially regular pole placement, anyway.

Subject only to dealing with the device-dependent constant value $\Psi$, eq's (1), (1') and (1") produce an absolute answer that is neither "coarse" nor "fine", but a unified high resolution answer whose accuracy is conceivably as great as the accuracy and stability of the time measurements made. This would include the time base and the zero crossing detectors. Owing to the differential nature of the measurements, the time base need only have good short-term stability; differences between measurements done at different times attributable to lack of long-term stability are cancelled through their "common mode" effects. There are mechanical factors that can affect the accuracy of the angle transducer as a whole, and some of these will be discussed in separate sections to follow. But by and large, those factors do not affect accuracy by interfering with the principles of eq's (1) or (1").

The unified answer of eq's (1) and (1") is a high resolution answer owing to the "averaging" of, or to the contributions made by, the high number of poles on each rotor. In this sense, it is almost as if these were two single-poled rotors whose phase difference could be determined by locating with very great confidence the transitions in the signals from the sensors.

To this end, minor variations in the pole placement and motor speed may actually assist in increasing the resolution, as long as those variations are at least pseudo-random in nature. As is well known, such "dithering" can extend the precision of arithmetic data gathered to a fixed number of places.

The unified answer of eq's (1) and (1") do not have "coarse" and "fine" components that are readily recognizable, even when the poles are essentially regularly spaced. The summation terms may appear to provide the fine portion of the answer, while the terms $P_\#/P - Q_\#/Q$ may appear to provide the coarse portion. An easy way to fall into this trap is to mistakenly conclude that with regularly spaced poles it doesn't matter upon which pole the summations are begun, as regularity would appear to impart a modulo character to the difference between quotients for the summations.

But such an interpretation mistakenly concludes that a similarity of causes precedes a similarity of effects. It is true that if the rotors did have regularly spaced poles then the same things that determine $P_\#$ and $Q_\#$ would also determine the coarse portion of the result as measured by some different phase measurement technique. But that does not mean that "$P_\#$ cum $Q_\#$" and "coarse" are the same thing; it is just that the conditions that reveal them as different are either not at hand or are not properly appreciated. It can be shown that P would have to equal Q and that the spacing of the poles be regular before such an interpretation was correct.

Brief consideration of an extreme case should establish the point that the summation terms are not, in principle, simply the fine portion of the answer while $P_\#/P$ and $Q_\#/Q$ are, in principle, only the coarse portion. Suppose all of the poles on each rotor were bunched together into a small fraction of the circumference of the rotors. Under these conditions equal increments in the input angle would not produce equal changes in $P_\#/P$ and $Q_\#/Q$. Over a minor portion of a "input circle" there is considerable change, but over the major portion there is none. Yet a "coarse component" ought to change regularly with a regularly changing input. A similar disparity exists between the behavior of the summations and the "fine component."

Furthermore, upon reflection in light of the theorem and why fractional adjustments are made in the first place, it is seen that averages are being corrected for where they are started. But where on the rotors the summations start is also a function of when during a revolution a measurement is made, and not merely where the input stator is owing to the input angle. But "coarse" and "fine" are surely functions only of where the input stator is; how can "when" change the angle?

As far as eq's (1), (1') and (1") are concerned, the notions of coarse and fine seem best dispensed with, in favor of the idea of a unified result, as described.

However, eq. (1) is the basis for another eq. (57) below that does produce only a "fine" answer portion. The answer produced by eq. (57) can either be supplemented by a separate coarse measurement or used in a totally incremental system that accumulates the coarse portion as complete fine portions are traversed. Equation (57) is the basis of eq's (57') and (57"), which are analogous to eq's (1') and (1") for eq. (1).

$$\theta_{fine} = \frac{2\pi Q}{R} \Delta \theta = \quad (57)$$

$$2\pi \left( \frac{\Sigma T_{Q_i} - \frac{Q}{P} \Sigma T_{P_i}}{R} + P_\# \frac{(Q-P)}{P} \right) - Q\Psi$$

$$\theta_{fine} = 2\pi \underbrace{\{\theta'_{n+1} - \theta'_n\}}_{\text{"fine" values}}, \text{ WHERE} \quad (57')$$

$$\theta_n' = \underbrace{\frac{\Sigma T_{Q_i} - \frac{Q}{P} \Sigma T_{P_i}}{R} + P_\# \frac{(Q-P)}{P}}_{\text{a "fine" value}} \quad (57'')$$

Equation (57) may be obtained from eq. (1) as follows First, eq. (1) is multiplied by Q to produce an answer that "rolls-over" Q-many times per rotor revolution. Next it is observed that any multiples of $2\pi$ in the answer merely add whole counts (in radians) to the coarse portion of the answer. This allows certain terms in the right-hand member of the multiplied eq. (1) to be removed, with the understanding that the resulting $\theta_{fine}$ is now a modulo quantity.

The resulting equation contains the following terms:

$$(58a) \ldots + \left( \frac{P_\#}{P} - \frac{Q_\#}{Q} \right) Q \ldots$$

But (58a) may be reduced as follows:

$$= \frac{QP_\#}{P} - Q_\# \quad (58b)$$

$$= \frac{(Q - P + P)P_\#}{P} - Q_\# \quad (58c)$$

$$= \frac{(Q - P)P_\#}{P} + P_\# - Q_\# \quad (58d)$$

$$= \frac{P_\#(Q - P)}{P} \quad (58e)$$

Line (58e) is obtained from (58d) oy noting that the difference $P_\# - Q_\#$ contributes only whole coarse counts (in amounts of $2\pi$ radians each), and may therefore be eliminated.

Equation (57) can be used in two ways. First, it affords a simplified way to construct an incremental system. In such a system no coarse measurement is made, and the actual final value maintained by adjusting the answer up or down by amounts of the fine modulus as the fine count "rolls over." In such a system the input or Q rotor need not have an absolute reference pole. Observe that $Q_\#$ does not appear in eq. (57). And since no coarse measurement is to be made, there is no need for it for that purpose, either. Therefore, the missing pole on the input rotor could be dispensed with.

Second, eq. (57) could be used to form a "fine" answer in a system where another separate measurement was performed to obtain the "coarse" answer. In such a system there would still be no need for $Q_\#$, but some sort of once-per-revolution mark on the input rotor would seem necessary. This could take the form of either a missing pole or a separate mark and associated sensor. Either way, it would be advantageous if the passage of the poles on the input rotor past an input stator sensor were be used as a clock for the coarse phase measurement. The reasons for this are to enhance the insensitivity of the measurement to variations in the angular velocity of the rotors. All in all, such a system is essentially equivalent to one based on eq's (1), (1') and (1")) but with some extra overhead. A system of this sort was in fact constructed, however, and performed quite well.

Finally, it should be noted that the R in equations (1) and (57) need not be constant from one measurement to the next, so long as the actually occurring value for R is used each time a measurement is made. This is easily ensured by measuring the time for the particular complete revolution used in the summations: for any particular value of i, R equals the difference between two consecutive $T_{Q_i}$ or two consecutive $T_{P_i}$. If there are significant motor speed variations it may be desirable to average the two to find a value for R.

Angle Measurement

Returning now to the angle transducer shown in FIGS. 3A-C, consider how the phase measurment technique may be applied to the signals A, B, X and Y produced by the rotors and sensors of FIG. 3A to produce a value indicative of an input angle.

To begin with, there are four sensors and four signals, not just two each as in the discussion of the basic phase measurement technique. Nevertheless the desired end result is similar; the phase difference between A "combined" with B on the one hand and X "combined" with Y on the other is what is sought. The "combining" of A with B and of X with Y amounts to averaging, and is done for reduction in eccentricity errors, as well as for certain other errors. However, the term "averaging" refers here to finding the average phase, which is not necessarily what is obtained when the instantaneous values of the signals are averaged through analog summation.

The type of eccentricity under consideration here is one where the center of rotation for the input stator does not lie on the axis 22 of rotor revolution. Such eccentricity causes, among other things, a variable degree of coupling for each of the input sensors to the input rotor, where the variations are functions of the input angle. The result includes differences in signal amplitudes produced by the sensors themselves, which precludes their direct analog averaging from producing a signal having the average phase. It boils down to this. A way is needed to measure the phase first, and then average, rather than average the signals and then measure the phase.

Suppose there were only one input sensor A. The phase measurement technique previously described could be used to measure the phases AX and AY. The angle for the AX phase is ideally exactly one half circle ($\pi$ radians or 180 degrees) different from the angle for the AY phase. If this difference were taken into account (say, by adjustment according to an offset), then those two angles could be averaged. Corresponding results for the phases BX and BY would obtain if B were the only input sensor. But in each case the resulting averaged answer corresponds to the same input angle, and those are therefore averageable provided the half circle difference between sensors X and Y are taken into account. That difference amounts to an offset from the reference X for AX and BX to the reference Y for AY and BY. That is, provided the angles for the different phases AX through BY are first adjusted for their half circle differences, then:

$$\frac{\frac{\sphericalangle AX + \sphericalangle AY}{2} + \frac{\sphericalangle BX + \sphericalangle BY}{2}}{2} = \qquad (59a)$$

$$\frac{\sphericalangle AX + \sphericalangle AY + \sphericalangle BX + \sphericalangle BY}{4}$$

That is, one can either average the averages, or average all four measurements directly.

Similarly, if there were more sensors, then:

$$\frac{\frac{\sphericalangle AX + \sphericalangle AY}{2} + \frac{\sphericalangle BX + \sphericalangle BY}{2} + \frac{\sphericalangle CX + \sphericalangle CY}{2}}{3} = \qquad (59b)$$

$$\frac{\sphericalangle AX + \sphericalangle AY + \sphericalangle BX + \sphericalangle BY + \sphericalangle CX + \sphericalangle CY}{6}$$

And:

$$\frac{\frac{\sphericalangle AX + \sphericalangle AY + \sphericalangle AZ}{3} + \frac{\sphericalangle BX + \sphericalangle BY + \sphericalangle BZ}{3}}{2} = \qquad (59c)$$

$$\frac{\sphericalangle AX + \sphericalangle AY + \sphericalangle AZ + \sphericalangle BX + \sphericalangle BY + \sphericalangle BZ}{6}$$

The above types of averaging can be performed upon either unified answers from eq's (1) or (1″), or fine angles from eq's (57) or (57″). If fine angles are in use then they should be averaged before being combined with the coarse angle, which itself may be a similar average. In a preferred embodiment corresponding to the structure of FIGS. 3A–C the averaging is performed as in the right-hand member of eq. (59a).

Now it may happen that the diametrically opposed independent sensors are not exactly diametric. The extent to which this affects the desired eccentricity correction is not particularly severe; it takes one to two degrees of such misalignment to produce noticable erroneous results. However, any plurality of independent sensors, whether exactly diametric or not, can be used in conjunction with the averaging discussed in connection with eq's (59a–c), provided the offsets between the sensors is known.

In a system providing an averaged unified answer based upon a strict interpretation of eq. (1), that is, one where $\Psi$ is explicitly found, nondiametric sensors produce results that are not exactly one half-circle apart. Referring to FIG. 3A, if one found the result for phase AX and then for phase BX, this would essentially be the same as moving the input stator, prior to the second measurement, so that the A sensor was exactly where the B sensor was. Save for the effects of eccentricity these two ways of measuring are exactly equivalent. Another way to think of this is that both AX and BX are relative to the same reference condition determined by the reference rotor and the X sensor. Similar remarks apply to AY and BY. If the offset owing to sensor placement between AX and BX were removed from, say, BX, if the sensor placement offset between AY and BY were removed from, say BY, and if the sensor placement offset between AX and AY were removed from both AY and the already once adjusted BY, then all four phases could be averaged as previously described. The adjustments just described amount to using AX as a reference to each of the other phases. The sensor placement offsets can be removed explicitly for each new BX, AY and BY, or they could be incorporated into the values of the $\Psi$'s for those measurements. Each of the four phase measurements would have its own constant $\Psi$, and the sensor placement offsets are constants, also; they may be combined.

A more convenient approach with unified answers is to base the measurements upon eq's (1′) and (1″). With this approach it is not necessary to know exactly what any of the sensor placement offsets are, as long as they are close enough to 180 degrees to satisfy eccentricity correction. A particular phase value $A_iX$ that is of interest is actually measured as a change from some reference value $A_0X$, while $B_iX$ is relative to $B_0X$, and so forth. The original offset between $A_0X$ and $B_0X$ remains, but $A_iX - A_0X$ is, in principle, directly averagable with $B_iX - B_0X$, owing to the differential nature of the measurement. (Averagable in principle but not in practice; see the next paragraph.) Likewise $A_iY - A_0Y$ and $B_iY - B_0Y$ are averageable. Furthermore, the two averages are averageable since they each represent the same change in the input angle. In essence, one need not know the particular values of the sensor placement offsets for the same sort of reason one need not know the particular values of the $\Psi$'s: they are cancelled by subtraction.

However, the situation is a bit more complicated than has been described thus far. Both unfined answers and fine angles are modulo numbers, and as is well known some special attention must be paid when averaging numbers that are in the vicinity of the modulus. In the present case the modulus is some value corresponding to 360 electrical degrees. Certain previous systems have solved this by adding or subtracting a value corresponding to 180 electrical degrees to each value to be averaged, averaging, and then removing the added value. The problem with that approach in the present instance is that while changing a pair of values near the modulus by 180 degrees gets that pair out of the troublesome zone, it might put the other pair into it. One could persist, and add the 180 degrees to selected ones of the values and then remove the appropriate fraction of 180 degrees from the result. For instance, if only one of four values is changed, then one fourth of 180 degrees, or 45 degrees, is extracted from the average. This approach entails considerable overhead in that a fair degree of decision making and flag setting is required each time an average is to be performed.

Another, simpler, approach works at least as well. This approach is to observe the offsets between the various phases AX, AY, BX and BY. This is done by picking one of the phases, say AX, as a reference and forming the following "averagability offsets:"

$$O_1 = AX - AX \qquad (60a)$$

$$O_2 = AY - AX \qquad (60a)$$

$$O_3 = BX - AX \tag{60c}$$

$$O_4 = BY - AX \tag{60d}$$

These averagability offsets, as well as those mentioned above in connection with sensor placement, may be measured with the transducer turned to any position, since they are relative measurements. Also, they need be measured only once, since they are constants.

Using the averagability offsets the measured phases can be modified as follows:

$$AX' = (AX - O_1) \bmod 360° \tag{61a}$$

$$AY' = (AY - O_2) \bmod 360° \tag{61b}$$

$$BX' = (BX - O_3) \bmod 360° \tag{61c}$$

$$BY' = (BY - O_4) \bmod 360° \tag{61d}$$

These modified phases can then be averaged in the usual fashion, which is to say that the adding of the 180 degrees can proceed in the usual manner, with either all or none of the terms being so adjusted.

The term "eccentricity" used above suggests another source for a related type of error; that of an eccentrically mounted rotor. That appears to the sensors as a rotor with imperfectly placed poles, albeit with signal amplitude variations caused by the changing spacing between the rotor poles and the sensor. The changing amplitude, per se, does not introduce an error, owing to the phase-only nature of the measurement. And since the phase measurement technique is, in principle, immune to pole placement errors, no error is introduced into the measurement for eccentrically mounted rotors.

Crosstalk Reduction

We turn now to the subject of crosstalk, elimination of whose effects is the principal reason why the input and reference rotors have different numbers of poles. And while the specific origins of crosstalk in various embodiments may differ, the net results will be generally similar, so that it will be useful to examine the nature of crosstalk for the particular embodiment described in connection with FIGS. 3A-C.

The end result of crosstalk was observed in a structure similar to that shown in FIGS. 3A-C, but where the gears each had the same number of teeth. A periodic error of as much as one hundred and twenty arc seconds was present in the answer. The amount of error was a function of input stator position. The peak-to-peak error was greatest when the input and reference stator sensor were aligned, and least when they were one quarter of a stator rotation apart. In between those extremes the error went through many cycles of changing amplitude as a function of input stator position. Subsequent experimentation revealed that source of this error was indeed magnetic crosstalk, as the introduction of a mu metal shield between the reference magnetic circuits and the input magnetic circuits removed nearly all observable error in the transducer.

Shielding is often easier said than done. Not only is there the expense to consider, and the added weight, but a shield can be an unwelcome complication during alignment and repair. We shall now show that when used with rotors having different numbers of generally equally spaced poles the phase measurement technique previously described is, for all practical purposes, immune to errors introduced by crosstalk. The present preferred embodiment dispenses with any inter-rotor or inter-stator shielding with no discernable ill effects, and still achieves arc second accuracy and resolution. It appears that similar immunity to crosstalk will be enjoyed for any type of crosstalk provided only that the effect of the crosstalk is analogous to some phase distortion in the signals from the sensor and that such phase distortion meets certain criteria described below. That is, there is nothing peculiar to the magnetic embodiment that prevents a comparable insensitivity to crosstalk in electrostatic and optical embodiments. Nor would it be necessary for the crosstalk mechanism to be limited to actual inter-rotor/inter-stator disturbances; the physical location of the crosstalk could as easily be any place where sensitive components or conductors are in sufficient mutual proximity.

Still, it may be useful to briefly examine further the crosstalk mechanism in the magnetic embodiment under consideration. Consider magnetic sensor 8 in FIG. 3A. The principal magnetic circuit for the magnet 23 is through the pole piece 25 to the gear 5 and then back through the air to the other end of the magnet 23. An alternate return path is from the rotor 5 through the air to rotor 6, thence through sensor 10, to the case, and then back to sensor 8. A similar return path exists through sensors 11, as well as one through sensor 9. Clearly these alternate return paths are affected by the proximity of a distant rotor pole to the associated distant sensor. That is, the individual influence of each alternate return path depends upon something generally unrelated to how close a rotor pole is to the sensor 8. In the case of sensors 10 and 11 "something" is input stator position combined with the (as far as the reference sensors and rotor are concerned) arbitrary placement of the poles on the input rotor. Even in the case of sensor 9 the influence of that alternate return path for sensor 8 is not necessarily strongly correlated to what is going on at sensor 8. If the poles of rotor 5 are ideally placed and the gear is perfectly round, etc., then that influence would be regular, always the same, and could be ignored. Arbitrary differences in rotor pole spacing around the circumference of the rotor would produce a correspondingly arbitrary influence upon sensor 8 by sensor 9. Even in that case, however, the effect of such crosstalk over one revolution is constant, and never varies; its effect is simply some constant offset. Hence even though each sensor is essentially arbitrarily influenced by each of the other sensors, we shall be primarily concerned with the effects of inter-rotor crosstalk, rather than crosstalk occurring between sensors for a common rotor.

One cannot rely on these various individual influences for the alternate return paths to simply cancel one another. That is, they do not all "add up to zero", at least not instantaneously, and there is crosstalk. At the level of observation for a given signal A through X what occurs with rotors having different numbers of poles is that the arbitrary phase distortion causes various zero crossings to occur earlier than they should and others to occur later than they should. It does not change their number, however. That is because the level of crosstalk is fairly small, say on the order of $-40$ db. Such inter-rotor crosstalk looks as if some dynamically variable pole positioning error has been introduced. That is, it appears as if the apparent pole position on the rotor is a function of the input angle. If the inter-rotor crosstalk is "symmetrical", or nearly so, with respect to one revolution, then the apparent change in certain pole positions is counteracted by corresponding opposite changes in other apparent pole positions, and the net effect of the crosstalk would be very small. For all practical purposes, such is the case in the present embodiment.

It would be glib to make such an assertion as the above and simply leave it at that. For one thing, the various $\Psi$'s and $\Psi$'s in eq's (1)–(57) were said to be (arbitrary) constants related to the specific pole placement on the particular rotors at hand. One cannot have one value of $\Psi$ for a first measurement of $\theta$ and a significantly different value for a second measurement, and expect the difference between the two $\theta$'s to be exactly the angle experienced between the two measurements. Nor could one always subtract a constant $\Psi$ to obtain an individual solitary $\theta$ if $\Psi$ were not effectively constant.

It can be shown that the various $\Psi$'s and $\Psi$'s in eq's (1)–(57) are essentially constants as assumed, even though inter-rotor crosstalk manifests itself as an apparent dynamic misplacement of rotor poles. In the limit, they are indeed truly constant. The nature of the limiting case is continuous, as opposed to the finitistic sampling of zero crossings in the present embodiment. The latter constitutes an adequate approximation of the former, however.

To see why this is so, consider again the nature of the summation formed by eq. (2). Suppose each of the terms in the parentheses of eq. (2) are properly shown for the case when there is no crosstalk. In the case where there is crosstalk we can write:

$$l = T_{P2} - T_{P1} \rightarrow l' = T_{P2} + \delta_2 - (T_{P1} + \delta_1) \quad (62a)$$

$$m = T_{P3} - T_{P2} \rightarrow m' = T_{P3} + \delta_3 - (T_{P2} + \delta_2) \quad (62b)$$

$$y = T_{Pp} - T_{PP-1} \rightarrow y' = T_{Pp} + \delta_p - (T_{Pp-1} + \delta_{p-1}) \quad (62c)$$

In these equations $\delta_i$ through $\delta_p$ are the changes in zero crossing times produced by the phase distortion resulting from the crosstalk. The quantities $l'$, $m'$, ... $y'$ are the new angular displacements (in terms of incremental times) between the rotor poles.

Hence, we may write:

$$\sum_{l'}^{y'} T_{Pi} = T_{P1} + \delta_1 + T_{P2} + \delta_2 + \ldots + \quad (63a)$$

$$T_{Pp-1} + \delta_{p-1} + T_{Pp} + \delta_p$$

$$= \sum_{i=1}^{P} \delta_i + \sum_{i=1}^{P} T_{Pi} \quad (63b)$$

But the right-hand term is simply:

$$\sum_{i=1}^{P} T_{Pi} = \sum_{l}^{y} T_{Pi} \quad (63c)$$

Hence, $$\sum_{l'}^{y'} T_{Pi} = \sum_{i=1}^{P} \delta_i + \sum_{l}^{y} T_{Pi} \quad (64)$$

That is, the two summations of interest are equal if the sum of the various $\delta_i$ is zero. A similar argument obtains for the $T_{Qi}$. That the sum of the various $\delta_i$ over one revolution be small is the essential criteria that the crosstalk must meet if the phase measurement technique is to be insensitive to that crosstalk. If that criteria is met then such insensitivity is guaranteed, since the summations for the $T_{Pi}$ and $T_{Qi}$ will not be significantly changed from their pre-crosstalk values when crosstalk is introduced. Thus, the values for the $\Psi$'s stay the same, and correct answers are obtained.

We now consider why the sum of the various $\delta_i$ approximates zero when the rotors have different numbers of poles. The demonstration to follow considers the effect of crosstalk from the input rotor/stator upon the reference rotor/stator. To this end it is convenient to consider that the interfering input signal has, after attenuation through the crosstalk path, an amplitude of one at the reference sensor, while the amplitude of the primary signal of interest produced at the reference sensor has an amplitude A many times greater than one. A corresponding demonstration exists that considers the crosstalk of the reference rotor/stator upon the input sensor. Owing to the similarity of the demonstrations and a desire for brevity, the second demonstration has been omitted.

Let the interfering signal from the input rotor/stator be:

$$y = \sin\left(\frac{2\pi \text{ radians}}{\text{revolution}} \cdot \frac{\text{revolutions}}{\text{second}} \cdot \frac{\text{poles}}{\text{revolution}} \cdot \text{seconds}\right) \quad (65)$$

$$= \sin(2\pi\omega Qt) \text{ ("Q-SIGNAL")} \quad (66)$$

Similarly, the primary signal from the reference rotor/stator is:

$$y = A\sin(2\pi\omega Pt)(\text{"P-SIGNAL"}) \quad (67)$$

P-signal experiences P-many cycles each of some average period m in the same length of time R when Q-signal experiences Q-many cycles each of some average period n. Thus:

$$Pm = Qn = R \quad (60)$$

It is convenient to consider the ratio of P and Q in its lowest terms $$\frac{P}{Q} = \frac{P'}{Q'} \quad (69)$$

Neither of the integers $P'$ and $Q'$ equals one, neither is an integral multiple of the other, nor do they contain a common integral multiple.

Now there are some situations when the sum of the various $\delta_i$ is indeed zero. Suppose P-signal and Q-signal have at least one common zero crossing. Any coincidence of zero crossings will do, either both positive-going, both negative-going, or a mixture. It can be shown (e.g., by inspection of superimposed waveforms) that in such a case the resulting sum (or difference) is symmetric about the midpoint of its period R in the following way. On each side of the midpoint any change in the position of a zero crossing has, in relation to an associated zero crossing on the other side of the midpoint, a corresponding change of equal magnitude in the opposite direction. (We are assuming that the poles on the rotors are generally equally spaced.) Each cancels the other when the summation incorporating the $\delta_i$'s is performed. The equal but opposite symmetry follows immediately from the symmetrical nature of the algebraic sum of two symmetric waveforms that experience a common zero crossing. The periodicity of such a common zero crossing is one half the smaller of m and n. In the case of magnetic crosstalk for the transducer at hand this periodicity is experienced as the input stator changes position, and accounts for the oscillating nature of the crosstalk error.

However, it will generally not be the case that the signal of interest and the crosstalking signal will have a common zero crossing. In the absence of such a common zero crossing the summation of the two signals will not be symmetrical about the midpoint of its period, and the disturbances to the zero crossings will not be associatable into pairs of equal but opposite magnitudes. In these cases the sum of the $\delta_i$ is not actually zero, and it is to these circumstances that the demonstration before us is directed.

To proceed, it will be convenient to recast eq. (66) as:

$$y = \sin(2\pi\omega Qt + \phi), \tag{70}$$

where $\phi$ represents those phases for Q-signal at which there is no common zero crossing with P-signal.

Figure 12:
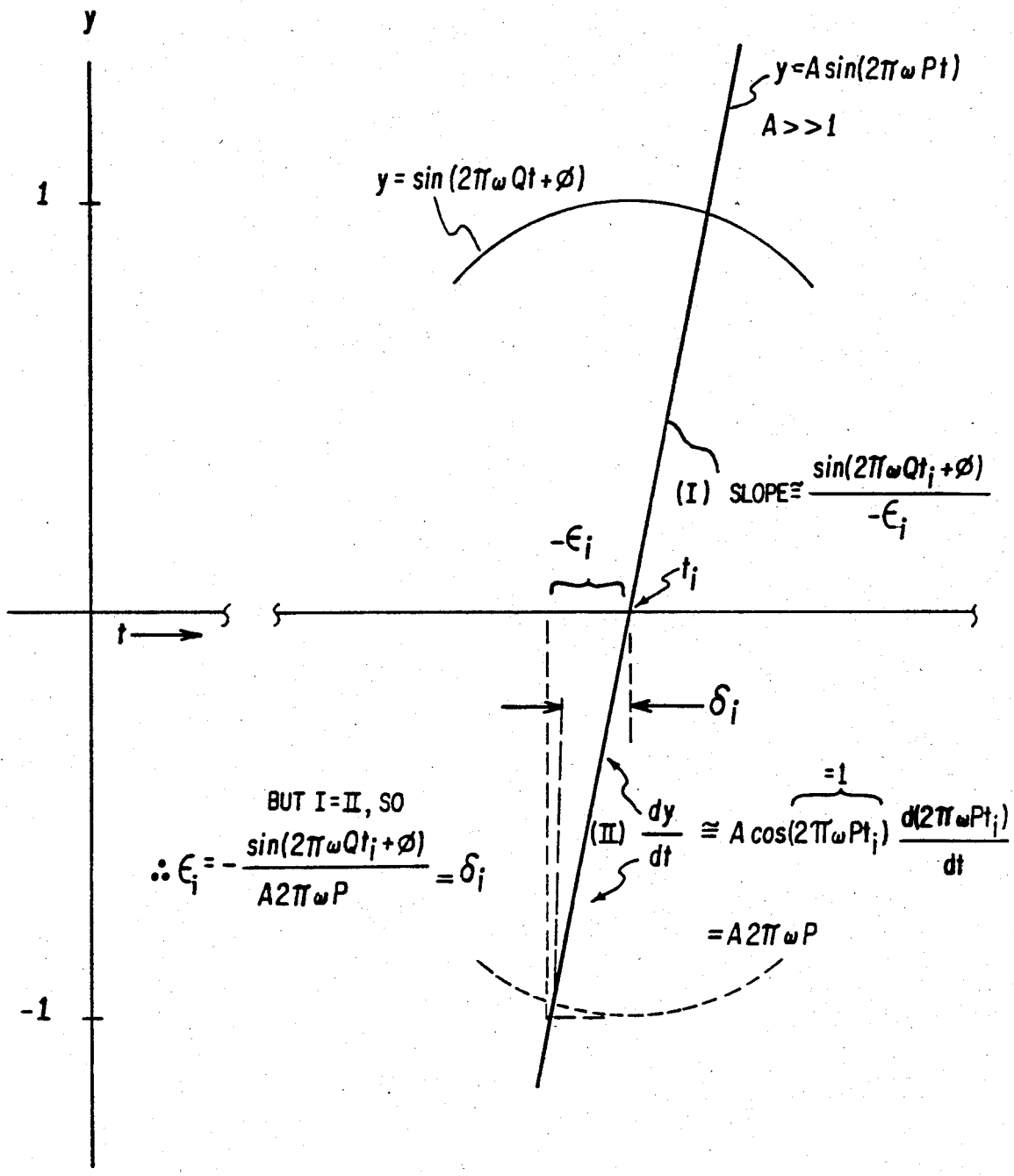
FIGS. 12, 13 and 14A-D are waveform diagrams useful in appreciating why the pnase measurement technique of FIGS. 4–9C is insensitive to crosstalk when the rotors of FIGS. 3A and 4–9C have certain different numbers of poles.

One instance of such a $\phi$ is shown in FIG. 12. As shown in the figure, $\phi$ is such that Q-signal is at a maximum when P-signal has a positive going zero crossing at time $t_i$. (Such a one quarter of Q-signal difference appears in one sense to be a convenient worst case, in that it is "farthest" from being a coincident zero crossing. In another sense, however, it may be the case that some different value of $\phi$ maximizes the absolute value of the difference between $\delta_i$ and another quantity $\epsilon_i$, defined below, which we take as an approximation for $\delta_i$.) Q-signal achieves a positive peak value of one at $t_i$, so that at some time $t_i - \delta_i$ prior to $t_i$ the two signals add to zero. The actual value of $\delta_i$ is difficult to represent in general and $\epsilon_i$ is taken as a reasonable approximation of $\delta_i$. The relationship shown in eq. (71) below is valid, provided that the slope of P-signal in the vicinity of the resulting zero crossing is essentially constant. That is, provided the maximum slope of Q-signal is small in comparison to the maximum slope of P-signal, which in turn follows from P-signal having a far larger amplitude than Q-signal. Sometimes an $\epsilon_i$ will be greater than its associated $\delta_i$, sometimes less, depending upon whether the peak value of Q-signal occurs before or after the actual $t_i - \delta_i$.

$$\epsilon_i = \frac{\sin(2\pi\omega Qt_i + \phi)}{A2\pi\omega P} \simeq \delta_i \tag{71}$$

We shall take the sum of the $\epsilon_i$ to approximate the sum of the $\delta_i$.

$$\Sigma\epsilon_i \simeq \Sigma\delta_i \tag{72}$$

All this is not as bad as it looks. The denominator of the center member of eq. (71) is some constant. The argument of the sine function in the numerator, when used in the summation of eq. (72), is merely P'-many different values for t, equally spaced in time along the consecutive Q'-many cycles that make up a Q'/Q fractional portion of the resulting summation. That is, the various P'-many $t_i$ that are the zero crossings of P-signal are just P'-many samples along Q'-many consecutive cycles of Q-signal. Each sample produces an $\epsilon$ approximating a corresponding $\delta$. But each $\epsilon$ is simply some constant divided into the value of Q-signal at the zero crossing of P-signal. This leads to considering what results from summing the amplitudes sampled at P'-many equally spaced intervals along Q'-many consecutive cycles of a unit sine wave.

Figure 13:
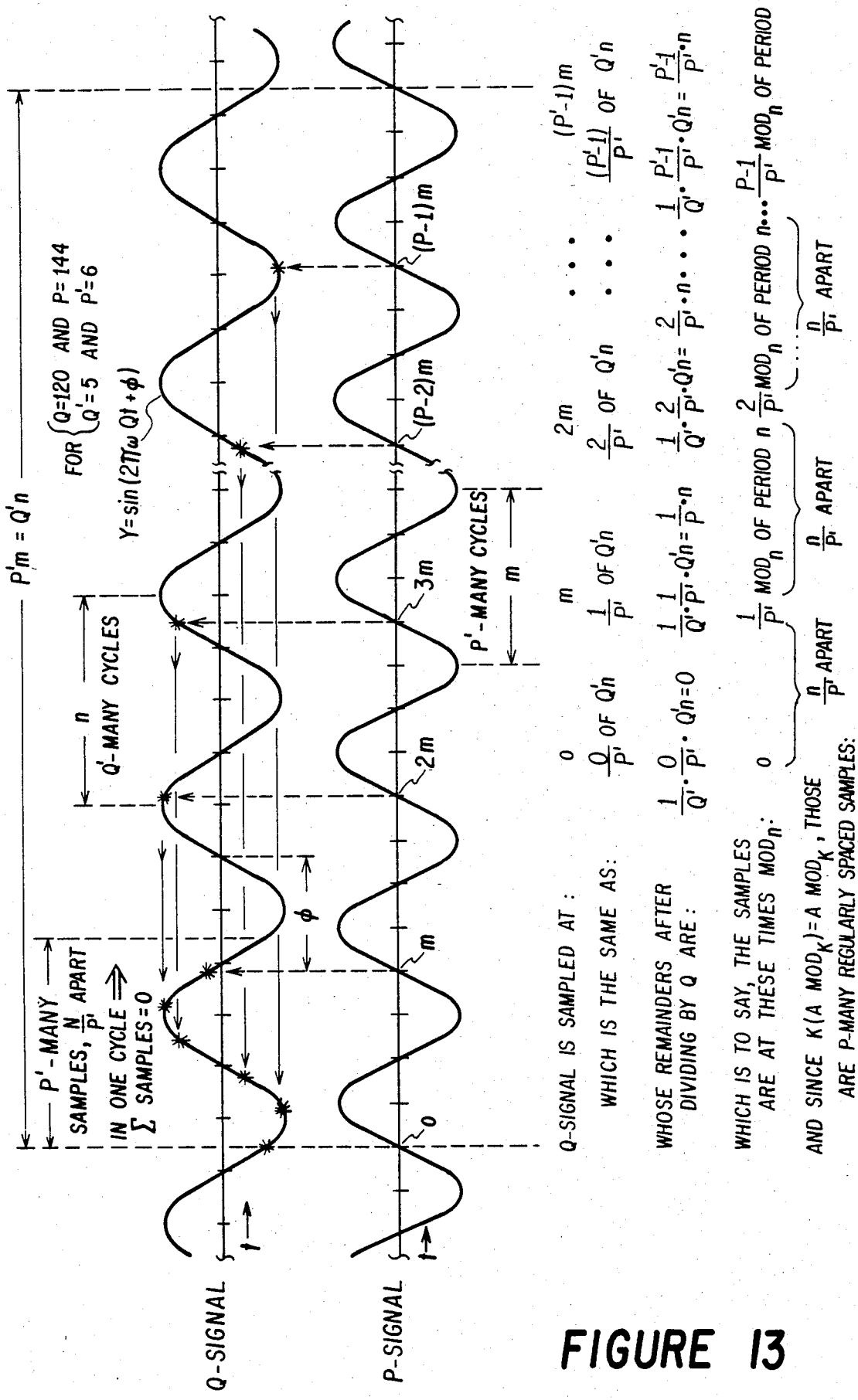

The situation of interest is depicted in FIG. 13. For convenience it is drawn to reflect the case when P=144 and Q=120. That yields P'=6 and Q'=5. That is, there are six cycles of a reference sensor signal for every five cycles of an input sensor signal. Furthermore, there are twenty-four such episodes of correspondence during each revolution of the rotors. Each episode is identical (assuming regularly spaced poles on the rotors, so we need examine what happens during only one such episode.

FIG. 11 shows how the P'-many consecutive and regularly spaced samples of the amplitude of Q-signal can be mapped into a single cycle of Q-signal. The interval between the compressed samples is still uniform. Hence, we have a sine function sampled P' times 1/P' of a period apart. It is known that the sum of such samples is always zero. It follows immediately that:

$$\Sigma\epsilon_i = 0 \text{ and } \Sigma\delta_i \simeq 0 \tag{73}$$

The preceding demonstration suggests more than the tautologous advice "to eliminate the effects of crosstalk reduce the amplitude of the crosstalk." It will be appreciated that while the difference between the sums of the $\epsilon_i$ and the $\delta_i$ is related to the amplitude ratio of the primary signal to the interfering signal, whatever that difference is also becomes a smaller percentage of those sums as the number of samples increases. That is, when the phase distortion produced by the crosstalk is considered in the continuous case the phase disturbances, while not necessarily symmetrical, are periodic (repeating once every revolution) and do average to zero each period. What follows is an outline of a more rigorous examination of this idea.

Equation (67) and (70) are difficult to combine as long as their arguments are expressed in terms of different parameters. But eq. (70) can be recast as:

$$y = \sin[2\pi\omega Pt + ((Q-P)2\pi\omega t + \phi)] \tag{74}$$

Suppose we relabel these terms as:

$$2\pi\omega Pt = X \tag{75}$$

$$(Q-P)2\pi\omega t + \phi = Z \tag{76}$$

X can be considered to be t times some frequency and Z to be a time variant phase.

Substituting these labels into eq's (67) and (70) and adding the two equations we may write:

$$A\sin X + \sin(X + Z) = B\sin(X + \sigma), \tag{77}$$

$$B = \sqrt{(A + \cos Z)^2 + \sin^2 Z}, \text{ and} \tag{78}$$

$$\sigma = \tan^{-1}\left(\frac{\sin Z}{\cos Z + A}\right) \tag{79}$$

The right-hand member of eq. (77) is the phase distorted signal resulting from the crosstalk; the continual variation in the value of $\sigma$ is the distortion in action. Equation (79) describes that variation. Removing the substitution for Z in eq. (79) we obtain:

$$\sigma = \tan^{-1}\left[\frac{\sin((Q-P)2\pi\omega t + \phi)}{\cos((Q-P)2\pi\omega t + \phi) + A}\right] \quad (80)$$

Equation (80) describes a periodic odd function with half-wave symmetry whose period is $1/(Q-P)\omega$. Thus, any integral over one period of eq. (80) equals zero.

Now, to say that the period of eq. (80) is $1/(Q-P)\omega$ is to say that during the same interval of time for which P-many poles and Q-many poles pass their associated sensors, one period of a signal corresponding to $(Q-P)$-many poles is present. But that interval of time is either one revolution or some aliquot portion thereof. Hence there are an integral number of periods of eq. (80) in one revolution, so that the integral of eq. (80) over one revolution is also zero.

The value of $\sigma$ in eq. (80) is sampled only a finite number of times, however. And at that, the samples are not, in principle, exactly equally spaced, as the sampling is done at the zero crossings of a phase distorted signal. It is clear, though, that as the number of samples increases the better the sampling approximates the integral of the continuous case, regardless of whether the samples are equally spaced or not, provided only that the "sampling density" is essentially constant throughout the entire interval.

Figure 14A:
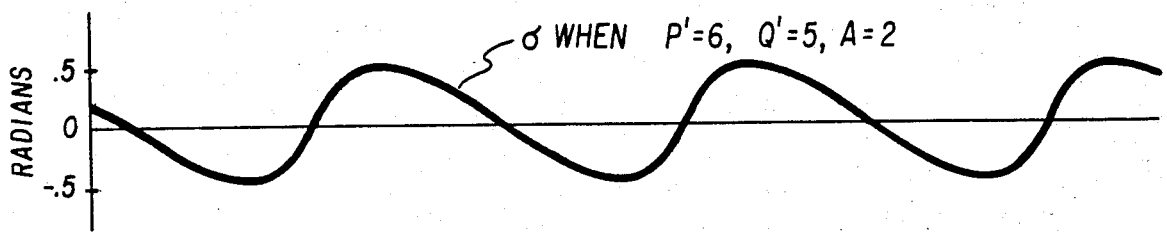
Figure 14B:
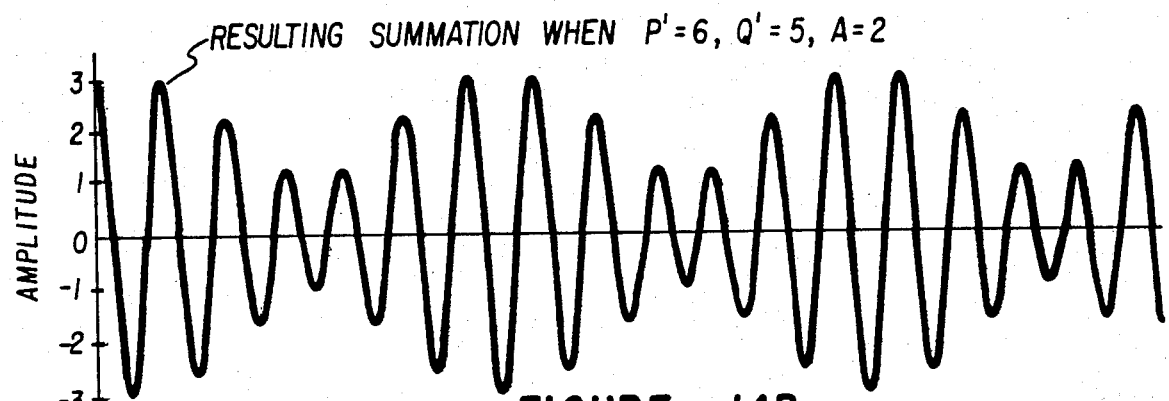
Figure 14C:
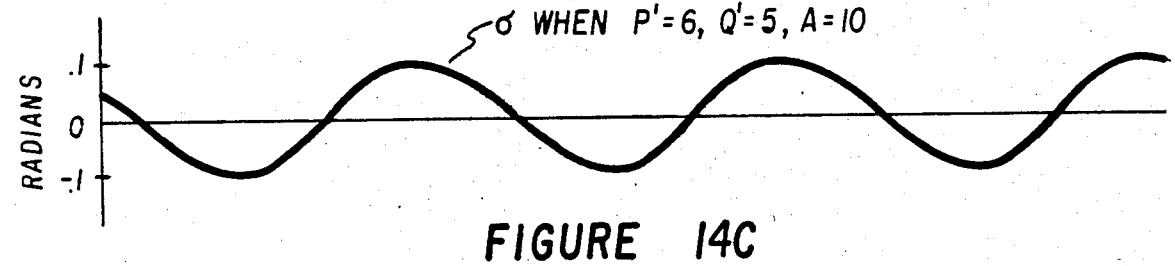
Figure 14D:
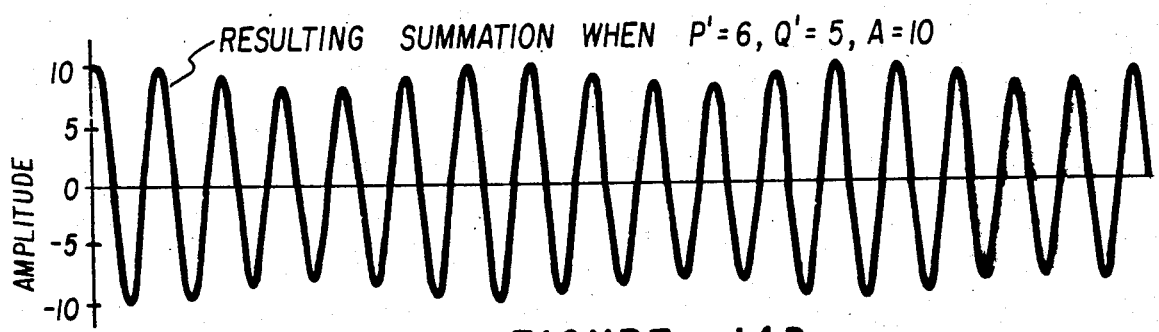

The crosstalk reduction technique described works rather well for modest to low levels of crosstalk for two reasons. First, at such levels the sampling interval tends to be equal (less phase distortion in the location of the zero crossings), while the shape of the function describing $\sigma$ (eq. 80) tends to become sinusoidal. For example, compare FIGS. 14A and 14C. Even though FIG. 14A exhibits half-wave symmetry, the half-cycles themselves are not symmetrical about their local midpoints, so that one cannot expect even equally spaced samples to add to zero. This is most easily seen by choosing various arbitrary pairs of equally spaced samples. In contrast, FIG. 14C is nearly sinusoidal, albeit the amplitude is considerably smaller. The nearly equally spaced samples produce a sum of nearly zero. The difference between FIGS. 14A and 14C reflects a different value chosen for A in eq. (67). Notice how that influences the shape of the function (eq. (80)) describing $\sigma$.

In summary, low to modest levels of crosstalk permit the approximation by sampling to be very effective. The accuracy of the approximation by sampling can be further enhanced by increasing the number of samples. There are at least two ways this can easily be done. First, samples could be taken on every zero crossing, not just the positive-going ones. Second P' and Q' can be increased while keeping P'−Q' the same. And upon reflection, it will be appreciated that even in instances where the basic level of crosstalk is abnormally high a sufficiently dense sampling (e.g., P' and Q' sufficiently large) will overcome the loss of the advantage afforded by low to modest levels of crosstalk. See, for example, FIGS. 14A and 14B. There the ratio of the primary to interfering signal is only two to one, and the shape of the $\sigma$ function is a rounded sawtooth. But the integral over one revolution of that rounded sawtooth of FIG. 14A is still zero, and sufficiently many finite samples can approximate that integral to as great a degree as may be required.

Once Per Revolution Sensing For $P_\#$ And $Q_\#$

There are a number of ways that absolute reference marks can be instituted for the waveforms from the sensors. Each gear or rotor could have among its poles some recognizable nonuniformity. Once each revolution a corresponding periodic variation would occur in the signals from the sensors. A variety of such nonuniformities are possible, and include monotonically increasing spacing between the poles, a wider than normal pole, a slightly wider or narrower than normal spacing between two poles, and as described, a missing pole. Insofar as the phase measurement technique is concerned, and neglecting the influence of crosstalk, none of these nonuniformities would need to be particularly accurate in their execution. The phase measurement technique itself is, after all, insensitive to pole placement errors.

The nature of the poles and their associated sensing mechanisms can have an effect upon the technique used to distinguish the particular nonuniformity from the remainder of the signal. Consider optical sensing of alternating transparent and opaque regions of a rotor. If the beam of light were highly collimated and/or the field of view of the sensor sufficiently narrow, as would likely be the case, then the output waveform from the sensor would be an isomorphic image of the pattern on the rotor. A missing pole, for instance, would appear simply as a suppressed portion of an otherwise normal waveform. Such "fidelity" in sensing is possible with magnetic and capacitive sensing schemes, although more trouble is required to attain it. For example, a magnetic sensor with a pole piece extending from each of the North and South poles of the magnet could have its gap above and below the extremes of the ridge line along the peak of a gear tooth, so as to maximize the flux change due to the passage of the nearest tooth while also minimizing the extent to which adjacent teeth and alternate flux paths contribute to the sensor's output signal. However it is done, the point is that, in contrast with the situation discussed in the next paragraph, such fidelity in sensing avoids certain complications in the tasks of recognizing the nonuniformity and (if necessary) estimating a missing pole or otherwise "smoothing out" the nonuniformity for convenience in processing the data. In the case of a missing pole, for example, a cycle from the zero crossing detectors would simply vanish, with no auxillary disturbance. One would note the longer period between consecutive zero crossings in the same direction, and insert a "replacement" half-way between.

In the particular magnetic embodiment described the magnetic sensors do not have a "narrow field of view." Referring again to FIG. 3A, upon leaving, say, pole piece 25 at the end nearest the gear 5, the magnetic lines of force spread out toward the gear in all directions. To a certain significant extent the other teeth on each side of the tooth most nearly opposite the pole piece 25 also affect the reluctance of the flux path. That is, the missing tooth has an effect upon the sensing of those teeth that both precede and follow it past the sensor. This effect is symmetrical about where the missing tooth ought to be, and in conjunction with the $d\phi/dt$ nature of the magnetic sensing it results in the sensor producing a long period single cycle in the space where there would normally have been two cycles. Thus, not only is there a missing cycle, but there can also be cycles present whose transitions are not where they would normally be.

To compound the situation further, it may be inconvenient to ensure that all sensors are manufactured and installed such that they always produce the same polarity transition upon encountering the advancing edge of a pole. Thus, what is a positive transition for one sensor may really correspond to a negative transition of another. But it may be desirable for the system to operate on zero crossings occurring in only a single direction even though the sensors may have different polarities. The result of such a mixture is an apparent shift in the approximated location of the missing tooth between sensors of different polarities, accompanied by a change in the procedure for "filling in" the missing pole. The apparent shift can be ignored. First, such a sensor's representation of the rest of the associated rotor is shifted by the same amount. Second, it is never the case that the value of a $P_\#$ or $Q_\#$ would ever be compared with another value of $P_\#$ or $Q_\#$ for that same rotor. It would only be used in conjunction with a $Q_\#$ or $P_\#$ for a different rotor. What this shift amounts to is a difference in when the information becomes available, not in what that information is. Even if such a sensor is used the performance of a coarse phase measurement (i.e., measuring what percentage of one revolution is the time between the absolute reference marks for the two rotors) the apparent shift merely produces a constant offset in the answer obtained. Such an offset is easily removed once its unchanging value is known.

Figure 15A:
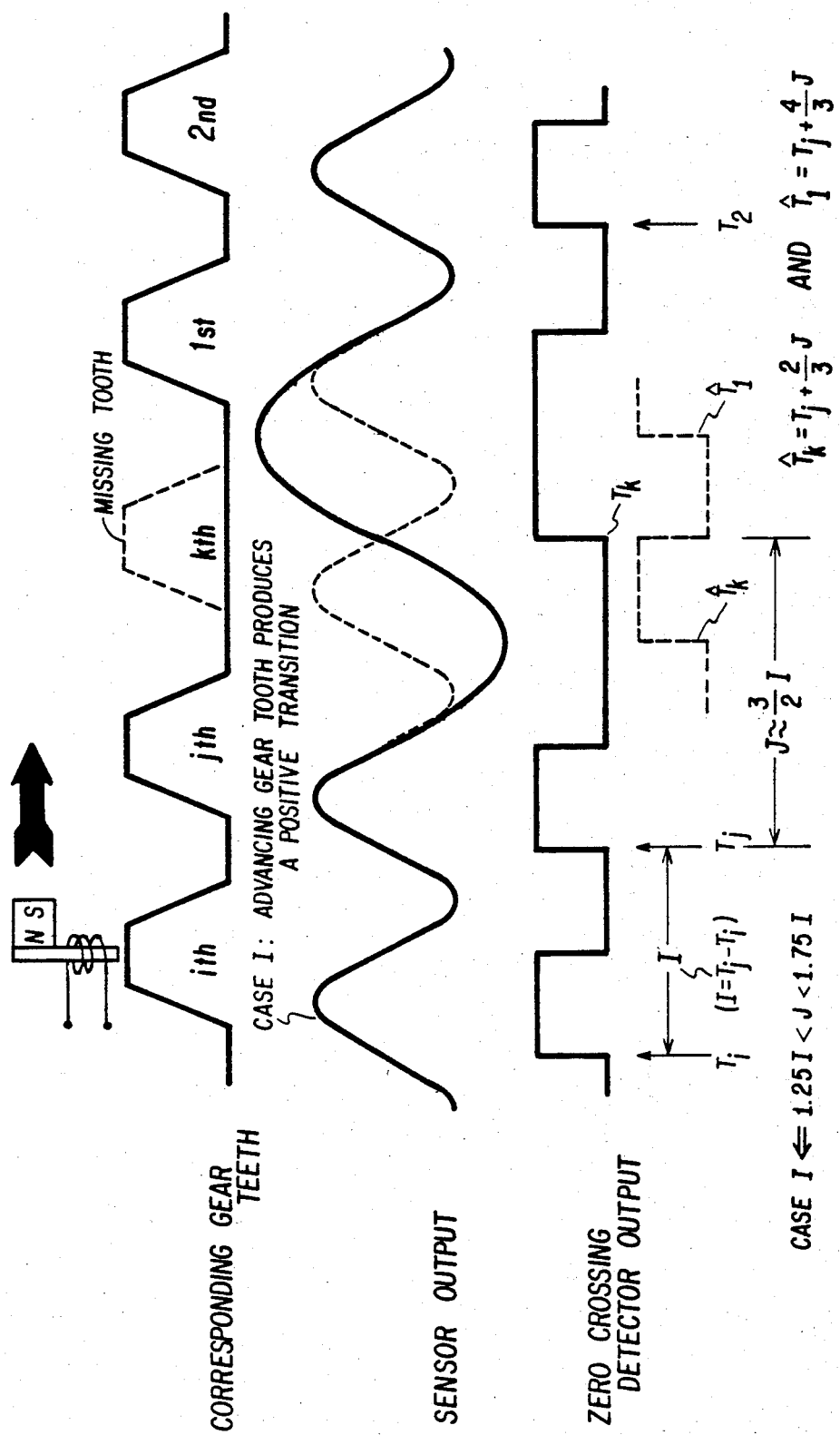
FIGS. 15A–B are waveform diagrams illustrating how to deal with certain conditions that occur when sensing the position of a missing pole on the rotors of FIG. 3A.
Figure 15B:
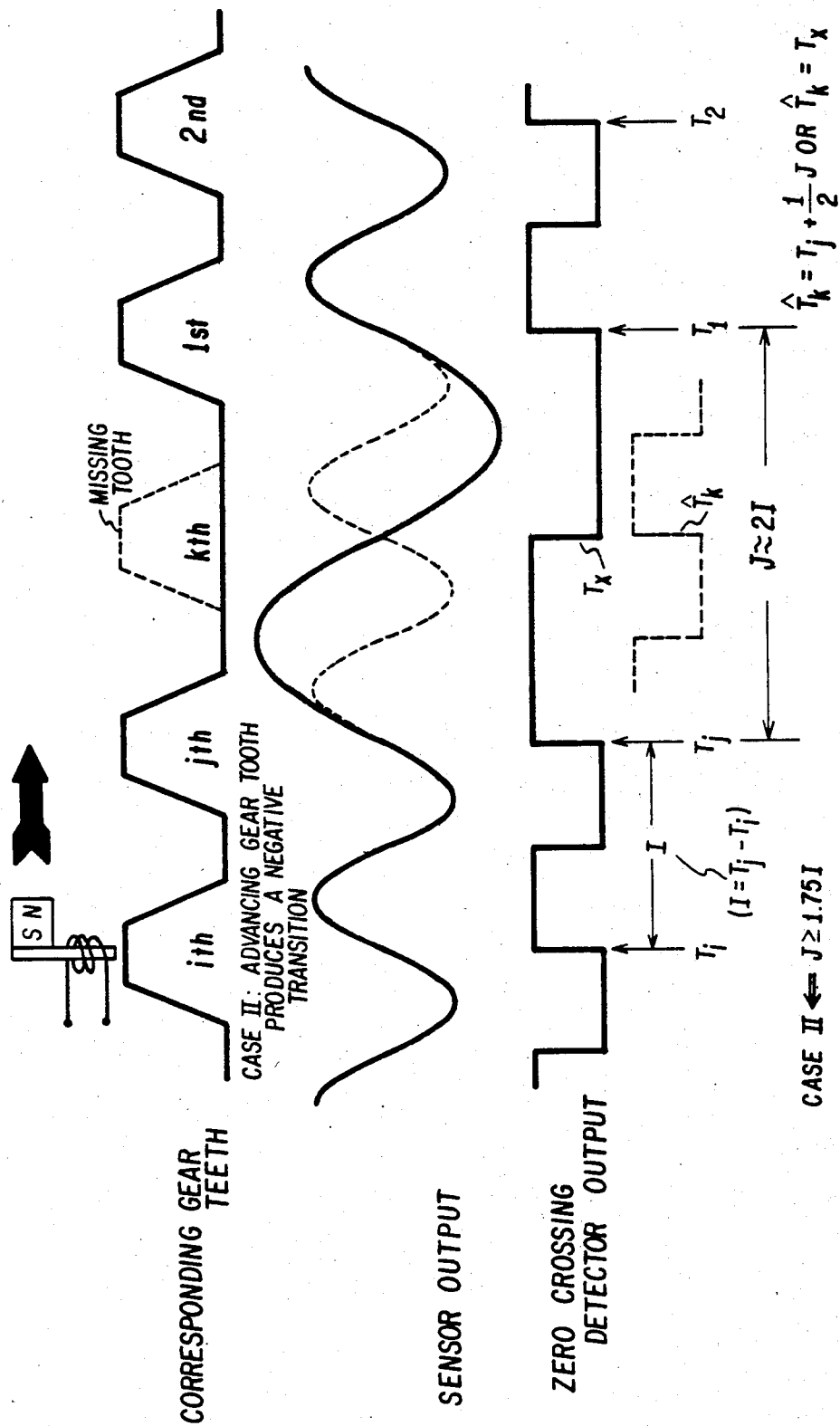

The long period and polarity difference combine to produce two different situations for recognizing and estimating the location of the missing pole. These situations can be handled as shown in FIGS. 15A-B. It is not difficult for the microprocessor to recognize the long period within each of the signals A-X and then to ascertain the case I or case II polarity of that sensor based upon the inequalities shown. This information can either be ascertained repeatedly as the rotors move, or found once for each sensor and permanently encoded. Once those polarities are known it is a simple matter to adjust the misplaced transition and approximate the missing one(s) according to the fixed relations shown in FIGS. 15A-B.

Of course, one could ensure that all sensors had the same selected polarity and then always use just one of the two types of situations, depicted in FIGS. 15A-B. There are those, however, who believe that such a requirement to ensure the same selected polarity is just something else that can go wrong during assembly or repair. This view holds that it can't go wrong if it doesn't matter in the first place, and that it would be better not to rely upon a particular polarity.

A second general approach is to dispense altogether with recognizable periodic disturbances created in the waveforms by some nonuniformity in the rotors. Instead, the microprocessor expects the signals from the input rotor to repeat every P-many cycles while the signals from the reference rotor repeat every Q-many cycles. It arbitrarily selects a cycle of each waveform to be a pseudo absolute reference mark from which the various $P_\#$'s and $Q_\#$'s are to be referenced. The selected cycles are repeatedly recognized by counting cycles modulo P and modulo Q. $P_\#$ and $Q_\#$ are then found by noticing what the modulo counts are at the time a measurement request is recieved.

Generalized Phase Measurement

The use of pseudo absolute reference marks allows the phase measurement technique of eq's (1) and (57), as well as their derivative forms, to be applied in any situation where P-many cycles of one signal occur in the same length of time as Q-many cycles of another. This surely includes the case where P=Q; that is, where a signal is compared with itself after being exposed to some phenomenon producing a phase delay. Such systems are often used to transduce some physical property (e.g., distance) that produce a corresponding phase shift through propagation delay.

An advantage of the present phase measurement technique in such applications is that the accuracy of the phase measurement does not depend upon the accuracy or stability of the signals whose phases are to be shifted and measured. All that is required in this connection is the ability to accurately measure the various time intervals delimited by the zero crossings, and the times for P-many or Q-many cycles. It will also be appreciated that if those latter two times can be relied upon to be equal then they need not occur simultaneously, but could be entirely separate, one following the other either immediately or after some delay. Likewise, they might partially overlap each other

The Method of the Angle Measurement Technique

A multi-pole input rotor and a multi-pole reference rotor mounted upon a common rotating shaft generate respective input and reference signals as the poles pass associated input and reference sensors. The input sensor is journalled for orbital revolution about the axis of the common shaft to allow orbital motion along the periphery of the input rotor. The reference sensor is fixed in a position adjacent the periphery of the reference rotor. In a preferred method a once-per-revolution mark upon each rotor identifies a single pole on each rotor as a reference, or index pole. The passage of each pole past its associated sensor produces a cycle in associated input and reference signals. The rotors need not have their poles placed thereon with any particular accuracy. If crosstalk is a problem the number of poles on one rotor may be made unequal to the number of poles on the other rotor.

In a preferred method the information contained in the input and reference signals is retrieved after at least one revolution's worth of transition time data has been captured and stored in a memory. It may be convenient to distinguish the index poles by their conspicuous absence, and place flagged and estimated transitions therefor into the memory.

The average of the consecutive times of occurrence for at least one revolution's worth of poles on each rotor is computed to find the average times of occurrence of associated single equivalent poles. These average times of occurrence for single equivalent poles are then compared as if they arose from rotors actually having only single poles. Advancing the input stator sensor in the direction of rotor rotation increases the time interval between the single equivalent poles until reaching an interval equalling one revolution. A further advancing of the input stator sensor passes a coincidence between the single equivalent poles, whereupon the interval abruptly drops to zero to begin to increase again. The measured interval is proportional to the angle between input and reference sensors, which in turn either equals the input angle or, at most, differs from it by a constant. The measured interval may be scaled to represent the input angle in any desired units. In a preferred method the measured interval is first normalized to a fraction of a revolution by dividing the measured interval by a measured time of rotor revolution. The result of that normalization may then be increased or decreased by an appropriate constant offset.

The measurements of the average times of occurrence for the single equivalent poles are performed by noting the respective sums for the times of occurrence of at least one revolution's worth of consecutive poles for each rotor, divided by the number of poles. Fractional portions of a revolution are not included, and both summations are made with respect to a common reference point in time. If the summations are always each begun upon the occurrence of their respective index poles, then the difference between the average times of occurrence is indeed the measured interval mentioned above. While this is certainly feasible, it has the possible disadvantage that the summations become distributed over separate revolutions. Such separation raises the possibility that variations in the time of revolution from one revolution to the next will not be common to both averages, rendering them incommensurable, unless they are separately normalized. To avoid such complications the preferred method is to form the summations during the greatest practical overlap in time of the same revolutions. To this end the summations are allowed to begin at once upon the passage of any poles, not just the index poles. The common point of reference in time is retained, however, and may conveniently be taken as the first of the consecutive transitions in the reference signal.

In return for this flexibility in starting the summations it is necessary to keep track of where the summations begin with respect to the index poles. This may be done by counting the number of poles skipped on each rotor since the last appearance of the associated index pole. A useful theorem states that, for each pole skipped, the measured average time of occurrence of the single equivalent pole can be adjusted by the average time between poles, which is simply the time of revolution divided by the number of poles. For each reference pole skipped an average time between reference poles must be added to the measured difference between the average time of occurrence of the single equivalent poles. In similar fashion, for each input pole skipped an average time between input poles must be subtracted. Such counting of skipped poles and the subsequent adjustment of the measured difference by the appropriate numbers of average times between the input and reference poles produces a difference that is relative to starting the summations upon the index poles, even though they were actually begun upon arbitrary poles.

The result has all the extra confidence imparted by averaging, and can be as accurate as the time measurements used to form the sums. The accuracy of pole placement upon the rotors simply does not enter into the accuracy of the result, except possibly through some indirect effect, such as crosstalk. Proper choice of unequal numbers of poles virtually negates crosstalk, however, provided only that the poles are anywhere near regular in their placement. High accuracy of pole placement is still not required.

The result obtained is a unified modulo answer one cycle of which directly represents one complete circle of the input angle, without any coarse or fine components. Hence there is no need for additional algorithms that ensure proper concatenation of coarse and fine components, and no concomitant susceptibility to errors introduced by noise when the measurements are near the modulus, or "roll-over point."

The measured or measured and adjusted interval between the single equivalent poles could be taken as a direct indication of the input angle (with suitable scaling, of course) or it may be compared to a residual interval associated with some arbitrary input condition. The arbitrary input condition may be taken to represent "zero degrees" or even some unknown value. Either way, the measured or measured and then adjusted difference between the average times of occurrence of the single equivalent poles, when diminished by the residual interval, then represents the swept angle between the current input condition and the arbitrary input condition. The residual interval can represent either the innate difference between the average times for the single equivalent poles when the index poles occur in coincidence, or, simply another measured or measured and then adjusted interval associated with a purely arbitrary input condition.

The measurement method described may also be thought of as a way to measure the phase between two signals of different frequencies where the ratio between the two frequencies is rational (i.e., an integral number of cycles in one signal occurs in a length of time equal to a different integral number of cycles in the other signal). When the method described is used to measure the phase between two such signals of say, P-many cycles of one in a length of time equal to Q-many cycles of the other, it may be convenient to assign an arbitrary cycle in each waveform, and the respective P-th and Q-th cycles thereafter, as the index cycles. The P-th and Q-th cycles would be identified simply by counting cycles of the associated signal by mod P and mod Q, respectively.

The phase measurement technique described may also be employed with pairs of diametric sensors. In a preferred method both the input stator and the reference stator carry respective pairs of diametric sensors. Four phases are measured; each sensor of one pair is taken in separate individual conjunction with the two sensors of the other pair. The resulting four measured phases are then adjusted for inherent offsets, with one of the four taken as a reference. The reference and the three adjusted phases are then averaged.

The Method of the Crosstalk Suppression Technique

Suppression of crosstalk between the sensors is obtained by implementing the above method of phase angle measurement while selecting the number of poles on the rotors to be unequal in a specific fashion. P-many poles are selected for one rotor while Q-many are selected for the other. The fraction P/Q equals another fraction P'/Q' in lowest terms, where neither P' nor Q' equals one. Of course, P and Q may be chosen so that P/Q is already in lowest terms with neither P nor Q equal to one.

The effect of this is to create a phase measurement error function whose integral over one revolution is zero. Hence, a sufficiently dense sampling of the signal cum crosstalk over an integral number of revolutions causes the effects of the crosstalk to nearly cancel themselves to any desired degree.

The above phase angle measurement technique is preferred in this connection because it measures an average over an integral number of revolutions and allows arbitrary values of P and Q.

The Method of Correcting the Periodic Errors

Self cancellation of errors that are function of the input angle (eccentricity, etc.) and that have error functions whose period is 360 input degrees (once-around errors) or 180 input degrees (twice-around errors), etc., is enhanced by measuring the phase between associated diametric sensors before those phases are averaged. In a preferred method each sensor provides a separate signal whose phase is measured against a reference. Zero crossing detection and time measurements are preferred as this avoids sensitivity to amplitude variations. The measured phases can then be arithmetically averaged between the diametric sensors, and the result then averaged with similar results from other pairs of diamteric sensors, if such there be. In general, "once-around" errors require one pair of diametric sensor, "twice-around" errors require two pairs in quadrature, etc. Such phase measurement from separate sensors prior to averaging avoids the skewing of phase information in a signal of a smaller amplitude by one of a larger amplitude when the two signals are analog averaged prior to phase measurement. Such amplitude variations are often introduced by the error mechanism, and the resulting skew in the analog average phase acts to preserve the error in spite of the averaging. Measuring the phase first and then averaging removes the mischief caused by such incidental amplitude variations, and allows more nearly perfect self cancellation of the error.

What is claimed is:

1. A method of measuring the phase between a first signal having P-many cycles in a length of time L and a second signal having Q-many cycles in an equal length of time, the method comprising the steps of:
   selecting a point in time as a reference;
   selecting a feature occurring in each cycle of the first signal;
   measuring relative to the reference P-many consecutive times of occurrence of the selected feature in the first signal;
   averaging the measured P-many times of occurrence for the first signal to produce an average time of occurrence representing a single first equivalent feature;
   selecting a feature occurring in each cycle of the second signal;
   measuring relative to the reference Q-many consecutive times of occurrence of the selected feature in the second signal;
   averaging the measured Q-many times of occurrence for the second signal to produce an average time of occurrence representing a single second equivalent feature;
   expressing the difference between the times of the first and second equivalent features as a fractional portion of the time L; and
   converting the fractional portion to a quantity expressed in a desired unit of measure.

2. A method as in claim 1 wherein the step of measuring the P-many consecutive times commences only upon the occurrence in the first signal of a selected cycle recurring every Pth cycle.

3. A method as in claim 1 wherein the step of measuring the Q-many consecutive times commences only upon the occurrence in the second signal of a selected cycle recurring every Qth cycle.

4. A method as in claim 1 wherein the step of measuring the P-many consecutive times commences only upon the occurrence in the first signal of a selected cycle recurring every Pth cycle, and wherein the step of measuring the Q-many consecutive times commences only upon the occurrence in the second signal of a selected cycle recurring every Qth cycle, the recurring selected cycles occurring at generally different times in accordance with the value of the phase being measured.

5. A method as in claim 1 wherein the two measuring steps commence simultaneously and further comprising the step of adjusting the fractional portion of the time L to reflect the result that would have been obtained had the P-many consecutive times of occurrence begun with a different cycle of the first signal.

6. A method as in claim 5 wherein the different cycle of the first signal occurs $P_\#$-many cycles later and the adjusting step comprises adding the fraction $P_\#/P$ to the fractional portion of the time L.

7. A method as in claim 5 wherein the different cycle of the first signal occurs $P_\#$-many cycles earlier and the adjusting step comprises subtracting the fraction $P_\#/P$ from the fractional portion of the time L.

8. A method as in claim 1 wherein the two measuring steps commence simultaneously and further comprising the step of adjusting the fractional portion of the time L to reflect the result that would have been obtained had the Q-many consecutive times of occurrence begun with a different cycle of the second signal.

9. A method as in claim 8 wherein the different cycle of the second signal occurs $Q_\#$-many cycles later and the adjusting step comprises subtracting the fraction $Q_\#/Q$ from the fractional portion of the time L.

10. A method as in claim 8 wherein the different cycle of the second signal occurs $Q_\#$-many cycles earlier and the adjusting step comprises adding the fraction $Q_\#/Q$ to the fractional portion of the time L.

11. A method as in claim 1 wherein the measurements of the P-many and Q-many consecutive times of occurrence simultaneously begin on arbitrary cycles of the first and second signals respectively, and wherein the fractional portion of the time L is adjusted to reflect the result that would have been obtained had the P-many consecutive times of occurrence begun upon a preselected first index cycle occurring once every P-many cycles in the first signal and had the Q-many consecutive times of occurrence begun upon a preselected second index cycle occurring once every Q-many cycles in the second signal.

12. A method as in claim 11 further comprising the step of diminishing by a constant that quantity expressed in a desired unit of measure.

13. A method as in claim 12 wherein the constant is itself a fractional portion of the time L that has been converted to a quantity expressed in the same desired unit of measure.

14. A method as in claim 13 wherein the constant represents the condition of zero phase.

15. A method as in claim 11 wherein a first quantity produced by the converting step and representing a first measured phase is diminished by a second quantity produced by another instance of the converting step and representing a second measured phase.

16. A method as in claim 15 wherein the second measured phase represents an initial reference phase.

17. A method of measuring the phase between a first signal having P-many cycles in a length of time and a second signal having Q-many cycles in an equal length of time, the method comprising the steps of:
selecting a point in time as a reference;
selecting a feature occurring in each cycle of the first signal;
measuring P-many times from the reference to P-many consecutive selected features of the first signal;
adding the P-many times together to produce a first sum;
dividing the first sum by P to produce a first quotient;
selecting a feature occurring in each cycle of the second signal;
measuring Q-many times from the reference to Q-many consecutive selected features of the second signal;
adding the Q-many times together to produce a second sum;
dividing the second sum by Q to produce a second quotient;
subtracting the first quotient from the second quotient to produce first difference;
dividing the first difference by the amount of time required for P-many cycles to occur to produce a third quotient;
selecting a cycle in the first signal and every Pth cycle thereafter as first index cycles;
finding a first correction index by observing the number of intervening whole cycles in the first signal from the most recent preceeding first index cycle to the first of the P-many consecutive cycles;
dividing the first correction index by P to produce a fourth quotient;
selecting a cycle in the second signal and every Qth cycle thereafter as second index cycles;
finding a second correction index by observing the number of intervening whole cycles in the second signal from the most recent preceeding second index cycle to the first of the Q-many consecutive cycles;
dividing the second correction index by Q to produce a fifth quotient;
forming the sum of the third quotient and the fourth quotient diminished by the fifth quotient to produce a third sum; and
diminishing the third sum by a constant.

18. A method as in claim 17 wherein the first and second signals are derived from first and second sensors respectively coupled to first and second multi-pole rotors and the phase difference between the first and second signals represents an angle.

19. A method as in claim 17 wherein at least one of the first and second index cycles are denoted by missing cycles detected by their absence.

20. A method as in claim 17 wherein both the first and second index cycles are denoted by missing cycles detected by their absences.

21. A method as in claim 17 wherein the first index cycles are selected by choosing an arbitrary cycle in the first signal and counting the succeeding cycles of the first signal to identify every Pth cycle thereafter.

22. A method as in claim 17 wherein the first index cycles are selected by choosing an arbitrary cycle in the first signal and counting the succeeding cycles of the first signal to identify every Pth cycle thereafter, and wherein the second index cycles are selected by choosing an arbitrary cycle in the second signal and counting the succeeding cycles of the second signal to identify every Qth cycle thereafter.

23. A method of measuring as a modulo quantity the phase between a first signal having P-many cycles in a length of time and a second signal having Q-many cycles in an equal length of time where the modulus of the measurement corresponds to an aliquot portion of that length of time, the method comprising the steps of:
selecting a point in time as a reference;
selecting a feature occurring in each cycle of the first signal;
measuring P-many times from the reference to P-many consecutive selected features of the first signal;
adding the P-many times together to produce a first sum;
multiplying the first sum by the fraction Q/P to produce a first product;
selecting a feature occurring in each cycle of the second signal;
measuring Q-many times from the reference to Q-many consecutive selected features of the second signal;
adding the Q-many times together to produce a second sum;
subtracting the first product from the second sum to produce a first difference;
dividing the first difference by the amount of time required for P-many cycles to occur to produce a first quotient;
selecting a cycle in the first signal and every Pth cycle thereafter as first index cycles;
finding a correction index by observing the number of intervening whole cycles in the first signal from the most recent preceeding first index cycle to the first of the P-many consecutive cycles;
multiplying the correction index by the fraction $(Q-P)/P$ to produce a second product;
forming the difference of the first quotient minus the second product to produce a second difference; and
diminishing the second difference by a constant.

24. A method as in claim 23 wherein the first and second signals are derived from first and second sensors respectively coupled to first and second multi-pole rotors and the phase difference between the first and second signals represents an angle.

25. A method as in claim 23 wherein the first index cycles are denoted by missing cycles detected by their absence.

26. A method as in claim 23 wherein the first index cycles are selected by choosing an arbitrary cycle in the first signal and counting the succeeding cycles of the first signal to identify every Pth cycle thereafter.

27. A method as in claim 23 further comprising the steps of:
selecting a cycle in the second signal and every Qth cycle thereafter as second reference cycles; and
forming a coarse measurement of the phase based on what fraction of the time for P-many cycles to occur is the difference in time between the first index cycle and an associated second index cycle.

28. A method as in claim 27 wherein both the first and second index cycles are denoted by missing cycles detected by their absences.

29. A method as in claim 27 wherein the first index cycles are selected by choosing an arbitrary cycle in the first signal and counting the succeeding cycles of the first signal to identify every Pth cycle thereafter, and wherein the second index cycles are selected by choosing an arbitrary cycle in the second signal and counting the succeeding cycles of the second signal to identify every Qth cycle thereafter.

30. A method of measuring an input parameter applied to a transducer utilizing rotating elements to generate signals whose phase represents the value of the input parameter, the method comprising the steps of:

detecting zero crossings in the signals generated by the transducer;

observing relative to a selected reference point in time those times at which selected detected zero crossings occur;

capturing in a memory the newly observed selected detected zero crossing times;

retaining in the memory captured times corresponding to at least an integral number of revolutions of the rotating elements prior to the newest captured time and eventually discarding older times;

processing upon receipt of a stimulus an integral number of revolutions' worth of previously captured times to find the phase of the signals from the transducer.

31. A method as in claim 38 wherein newly observed selected detected times are captured in the memory even as the processing step is in progress.

* * * * *